(12) United States Patent
Savant et al.

(10) Patent No.: US 11,978,675 B2
(45) Date of Patent: May 7, 2024

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Chandrashekhar Prakash Savant, Hsinchu (TW); Chia-Ming Tsai, Zhubei (TW); Ming-Te Chen, Hsinchu (TW); Tien-Wei Yu, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 95 days.

(21) Appl. No.: 17/532,852

(22) Filed: Nov. 22, 2021

(65) Prior Publication Data

US 2022/0084890 A1    Mar. 17, 2022

Related U.S. Application Data

(63) Continuation of application No. 16/562,395, filed on Sep. 5, 2019, now Pat. No. 11,183,431.

(51) Int. Cl.
  *H01L 21/8234*    (2006.01)
  *H01L 21/8238*    (2006.01)
  *H01L 27/092*    (2006.01)

(52) U.S. Cl.
  CPC ........... *H01L 21/823842* (2013.01); *H01L 21/823807* (2013.01); *H01L 27/092* (2013.01)

(58) Field of Classification Search
  CPC ........................................ H01L 21/82345
  See application file for complete search history.

(56) References Cited

U.S. PATENT DOCUMENTS 9,064,732 B2    6/2015  Yu et al.
9,202,698 B2   12/2015  Jagannathan et al.
(Continued)

FOREIGN PATENT DOCUMENTS

CN    106158932 A    11/2016
CN    106601605 A     4/2017
(Continued)

OTHER PUBLICATIONS

Chris Auth et al., "45nm High-k+Metal Gate Strain-Enhanced Transistors," Intel Technology Journal, vol. 12, Issue 02, pp. 77-85, Published Jun. 17, 2008, ISSN 1535-864X, DOI: 10.1535/itj.1202.
(Continued)

*Primary Examiner* — Christopher A Johnson
(74) *Attorney, Agent, or Firm* — STUDEBAKER & BRACKETT PC

(57) ABSTRACT

A semiconductor device includes a gate structure disposed over a channel region, and a source/drain region. The gate structure includes a gate dielectric layer over the channel region, a first work function adjustment layer, over the gate dielectric layer, a first shield layer over the first work function adjustment layer, a first barrier layer, and a metal gate electrode layer. The first work function adjustment layer is made up of n-type work function adjustment layer and includes aluminum. The first shield layer is made of at least one selected from the group consisting of metal, metal nitride, metal carbide, silicide, a layer containing one or more of F, Ga, In, Zr, Mn and Sn, and an aluminum containing layer having a lower aluminum concentration than the first work function adjustment layer.

20 Claims, 29 Drawing Sheets

(56) References Cited

U.S. PATENT DOCUMENTS

| | | | |
|---|---|---|---|
| 9,502,416 | B1 | 11/2016 | Kim |
| 10,157,998 | B2 | 12/2018 | Wang et al. |
| 10,211,309 | B2 | 2/2019 | Zhou |
| 10,937,783 | B2 | 3/2021 | Chang et al. |
| 2010/0081262 | A1 | 4/2010 | Lim et al. |
| 2014/0070307 | A1 | 3/2014 | Ando et al. |
| 2015/0021699 | A1 | 1/2015 | Ando et al. |
| 2015/0194423 | A1 | 7/2015 | Wang et al. |
| 2016/0380066 | A1 | 12/2016 | Lin et al. |
| 2017/0110553 | A1 | 4/2017 | Zhou |
| 2018/0315652 | A1* | 11/2018 | Tsai ................ H01L 29/66545 |
| 2018/0323300 | A1 | 11/2018 | Wang et al. |
| 2019/0067117 | A1 | 2/2019 | Chen et al. |
| 2019/0103390 | A1 | 4/2019 | Chen et al. |

FOREIGN PATENT DOCUMENTS

| | | | |
|---|---|---|---|
| CN | 106847874 | A | 6/2017 |
| CN | 107887428 | A | 4/2018 |
| CN | 108122909 | A | 6/2018 |
| CN | 108257918 | A | 7/2018 |
| KR | 10-2017-0002261 | A | 1/2017 |
| KR | 10-2019-0022280 | A | 3/2019 |

OTHER PUBLICATIONS

Non-Final Office Action issued in U.S. Appl. No. 16/562,395, dated Apr. 1, 2021.
Notice of Allowance issued in U.S. Appl. No. 16/562,395, dated Jul. 16, 2021.

* cited by examiner

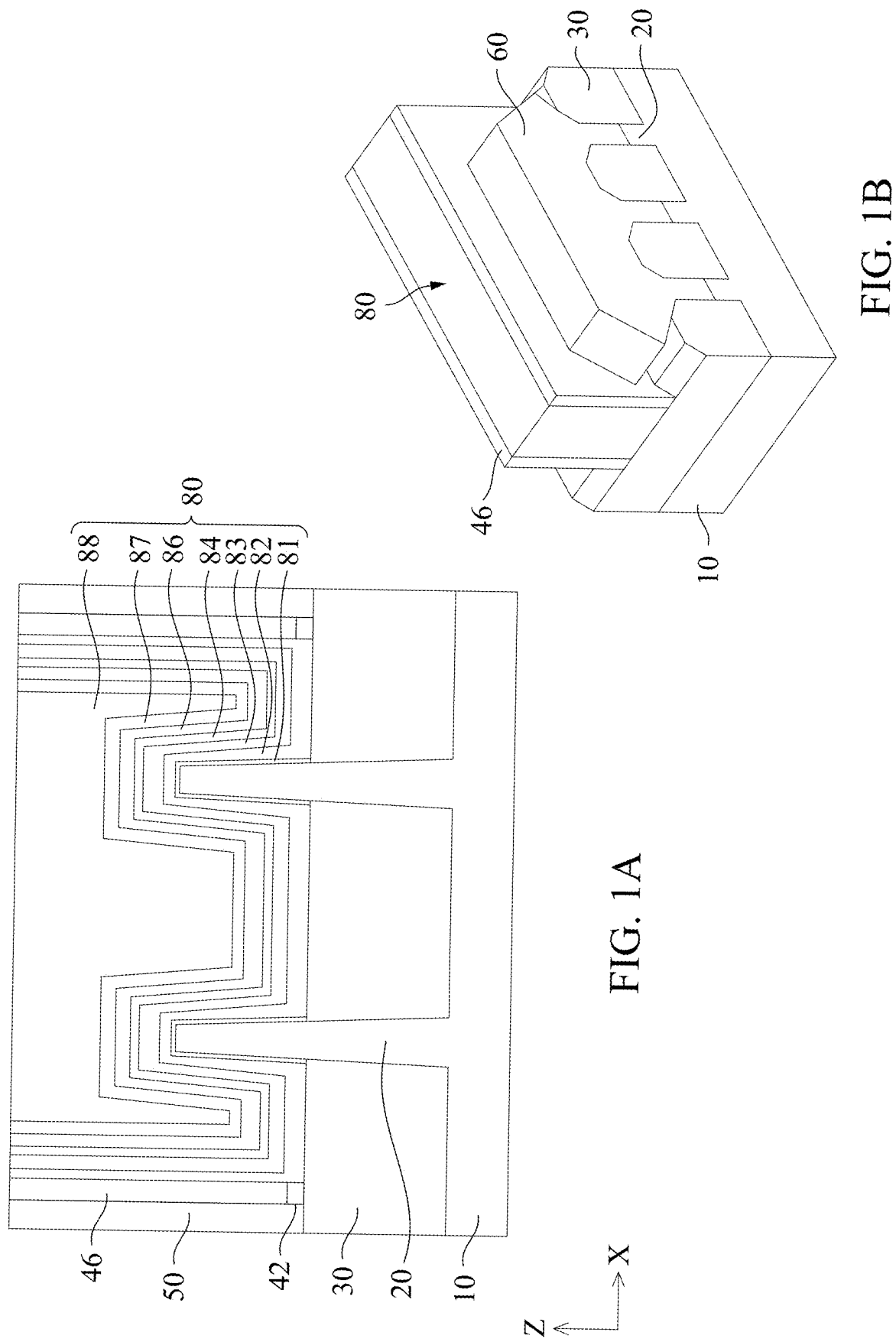

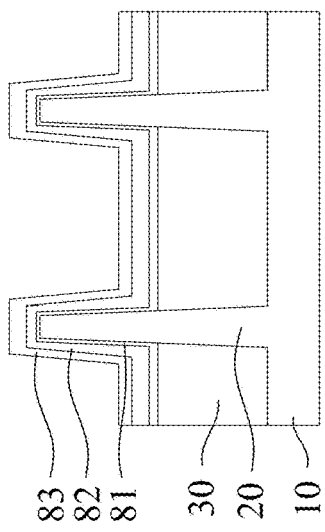
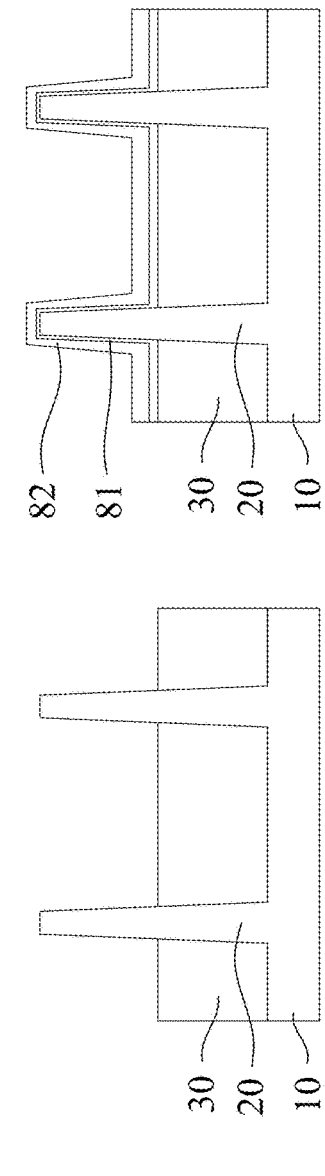
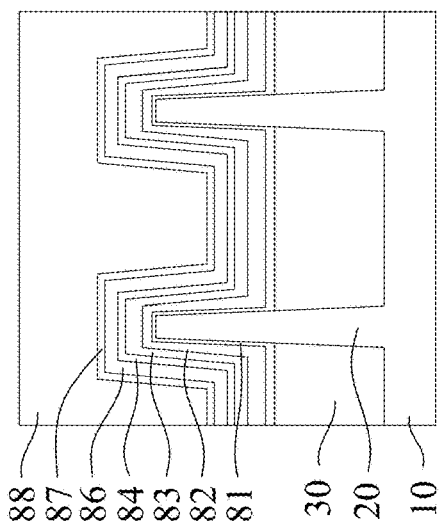
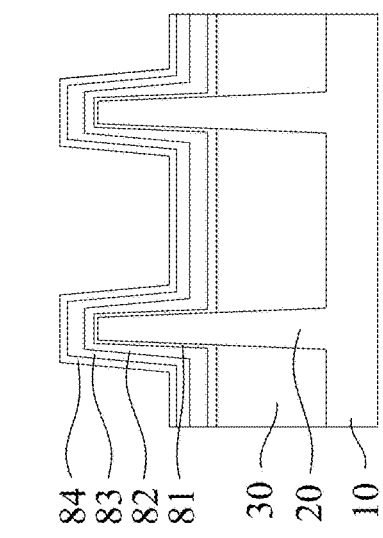

FIG. 4

| Row | Values (left to right) |
|---|---|
| P1 | 88, 87, 89-2, 89-1, 85, 84, 83, 82, 81, 20 |
| P2 | 88, 87, 89-2, 85, 84, 83, 82, 81, 20 |
| P3 | 88, 87, 85, 84, 83, 82, 81, 20 |
| N3 | 88, 87, 89-2, 89-1, 85, 115, 110, 100, 135, 84, 83, 82, 81, 20 |
| N2 | 88, 87, 89-2, 85, 115, 110, 100, 135, 84, 83, 82, 81, 20 |
| N1 | 88, 87, 85, 115, 110, 100, 135, 84, 83, 82, 81, 20 |

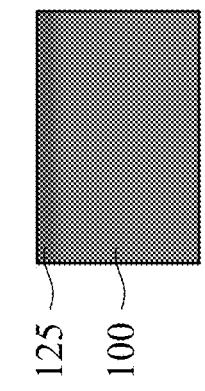
FIG. 5A
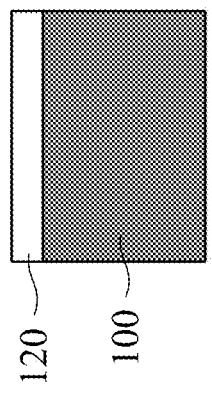
FIG. 5B
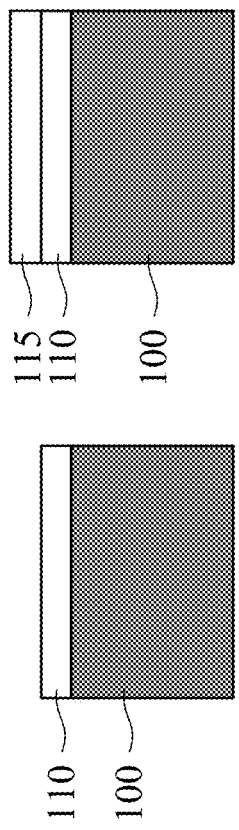
FIG. 5E
FIG. 5F
FIG. 5I
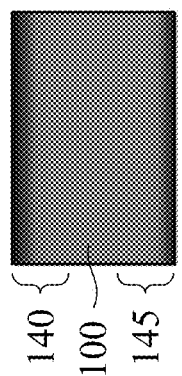
FIG. 5C
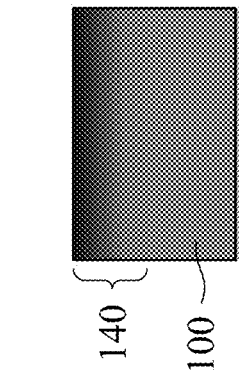
FIG. 5D
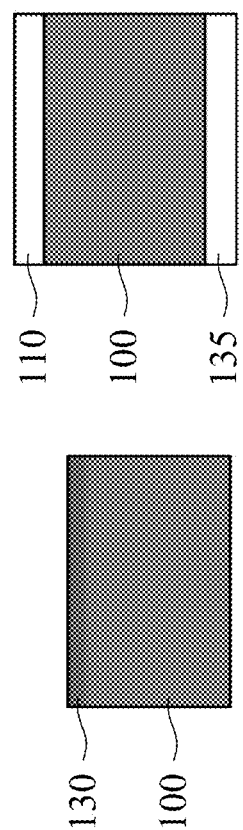
FIG. 5G
FIG. 5H
FIG. 5J
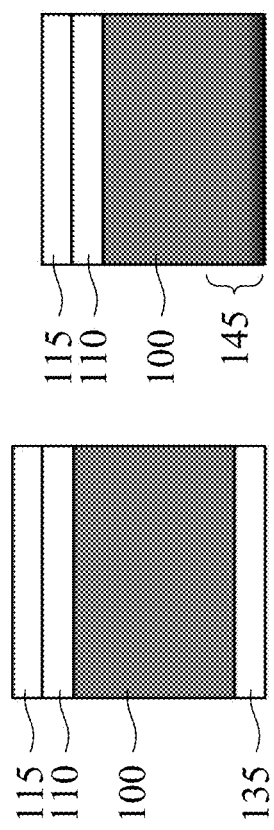

FIG. 7A

| | | | |
|---|---|---|---|
| 83 | 82 | 81 | P1 |
| 83 | 82 | 81 | P2 |
| 83 | 82 | 81 | P3 |
| 83 | 82 | 81 | N3 |
| 83 | 82 | 81 | N2 |
| 83 | 82 | 81 | N1 |

FIG. 7B

| | | | | |
|---|---|---|---|---|
| 84 | 83 | 82 | 81 | P1 |
| 84 | 83 | 82 | 81 | P2 |
| 84 | 83 | 82 | 81 | P3 |
| 84 | 83 | 82 | 81 | N3 |
| 84 | 83 | 82 | 81 | N2 |
| 84 | 83 | 82 | 81 | N1 |

FIG. 7C

| | | | | | | |
|---|---|---|---|---|---|---|
| 115/110 | 100 | 135/84 | 83 | 82 | 81 | P1 |
| 115/110 | 100 | 135/84 | 83 | 82 | 81 | P2 |
| 115/110 | 100 | 135/84 | 83 | 82 | 81 | P3 |
| 115/110 | 100 | 135/84 | 83 | 82 | 81 | N3 |
| 115/110 | 100 | 135/84 | 83 | 82 | 81 | N2 |
| 115/110 | 100 | 135/84 | 83 | 82 | 81 | N1 |

FIG. 7D

| | | | | | | | | |
|---|---|---|---|---|---|---|---|---|
| 205 | 200 | 115/110 | 100 | 135/84 | 83 | 82 | 81 | P1 |
| 205 | 200 | 115/110 | 100 | 135/84 | 83 | 82 | 81 | P2 |
| 205 | 200 | 115/110 | 100 | 135/84 | 83 | 82 | 81 | P3 |
| 205 | 200 | 115/110 | 100 | 135/84 | 83 | 82 | 81 | N3 |
| 205 | 200 | 115/110 | 100 | 135/84 | 83 | 82 | 81 | N2 |
| 205 | 200 | 115/110 | 100 | 135/84 | 83 | 82 | 81 | N1 |

| P1 | | 88 | 87 | 89-1 | 85 | | | 84 | 83 | 82 | 81 | 20 |
|---|---|---|---|---|---|---|---|---|---|---|---|---|
| P2 | | | 88 | 87 | 85 | | | 84 | 83 | 82 | 81 | 20 |
| P3 | 88 | 87 | 89-1 | 85 | 111 | 101 | | 84 | 83 | 82 | 81 | 20 |
| N3 | | 88 | 87 | 85 | 111 | 101 | | 84 | 83 | 82 | 81 | 20 |
| N2 | 88 | 87 | 89-1 | 85 | 111 | 101 | 110 | 100 | 84 | 83 | 82 | 81 | 20 |
| N1 | 88 | 87 | 85 | 111 | 101 | 110 | 100 | 84 | 83 | 82 | 81 | 20 |

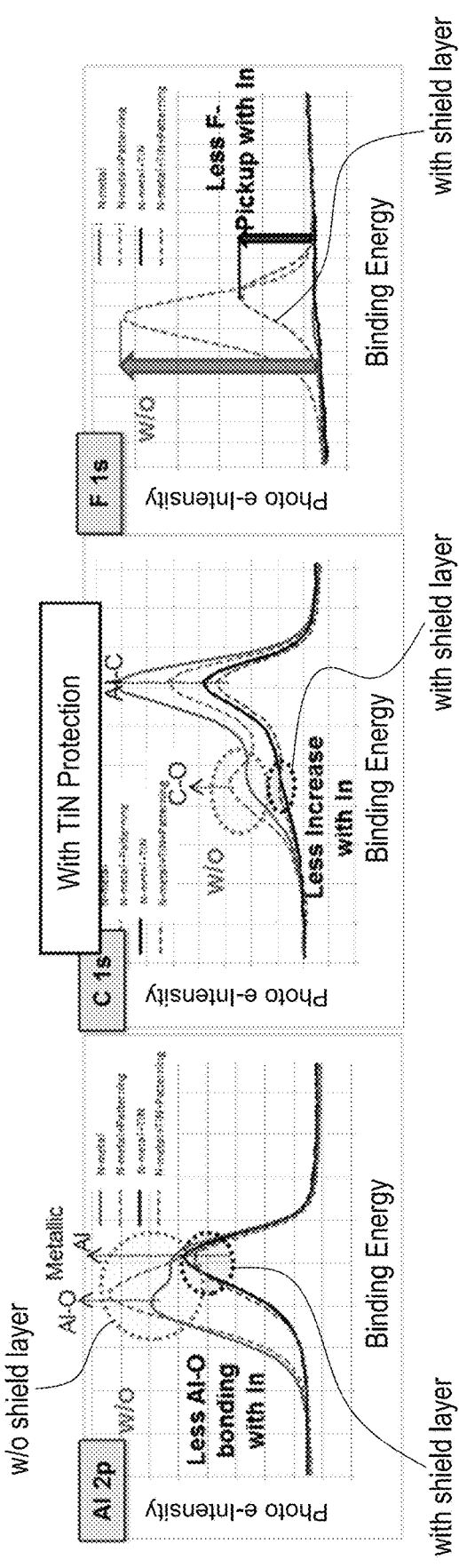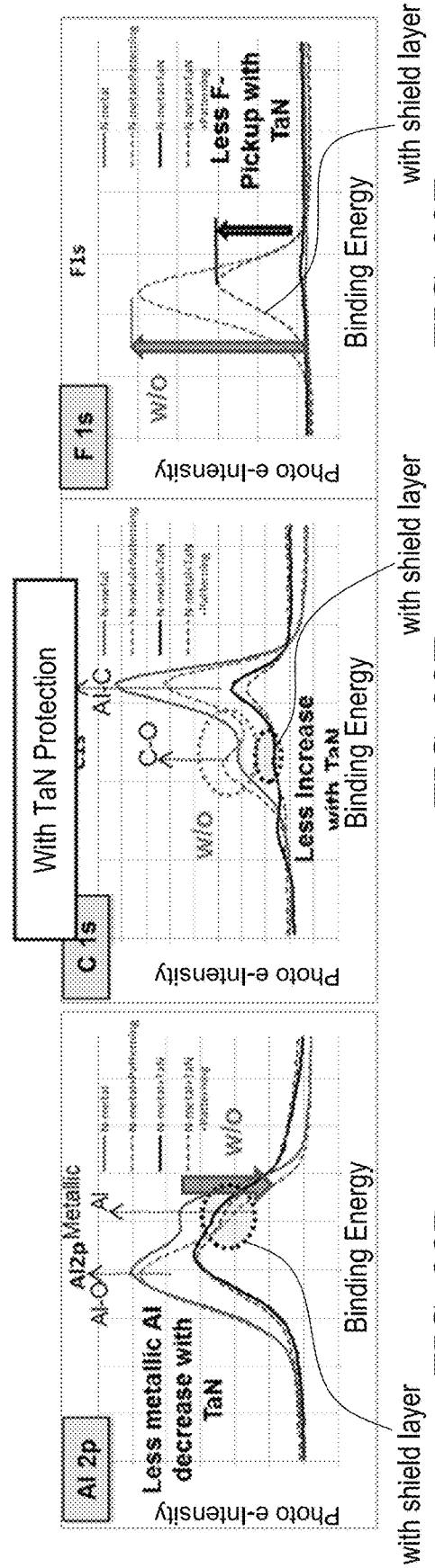
FIG. 22A  FIG. 22B  FIG. 22C
FIG. 22D  FIG. 22E  FIG. 22F

FIG. 24

| N1 | N2 | N3 | P3 | P2 | P1 |
|---|---|---|---|---|---|
| 88 | 88 | 88 | 88 | 88 | 88 |
| 87 | 87 | 87 | 87 | 87 | 87 |
| | 89-2 | 89-2 | | 89-2 | 89-2 |
| | | 89-1 | | | 89-1 |
| 85 | 85 | 85 | 85 | 85 | 85 |
| 110 | 110 | 110 | | | |
| 100 | 100 | 100 | | | |
| 82 | 82 | 82 | 82 | 82 | 82 |
| 81 | 81 | 81 | 81 | 81 | 81 |

FIG. 25 understanding# METHOD OF MANUFACTURING SEMICONDUCTOR DEVICES AND SEMICONDUCTOR DEVICES

RELATED APPLICATIONS

This application is a continuation of U.S. patent application Ser. No. 16/562,395 filed Sep. 5, 2019, now U.S. Pat. No. 11,183,431, the entire content of which is incorporated herein by reference.

BACKGROUND

With increasing down-scaling of integrated circuits and increasingly demanding requirements of speed of integrated circuits, transistors need to have higher drive currents with increasingly smaller dimensions. Fin Field-Effect Transistors (FinFET) were thus developed. FinFETs include vertical semiconductor fins above a substrate. The semiconductor fins are used to form source and drain regions, and channel regions between the source and drain regions. Shallow Trench Isolation (STI) regions are formed to define the semiconductor fins. The FinFETs also include gate stacks, which are formed on the sidewalls and the top surfaces of the semiconductor fins. Since FinFETs have a three-dimensional channel structure, ion implantation processes to the channel require extra care to reduce any geometrical effects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A shows a cross section view and FIG. 1B shows a perspective view of a semiconductor device according to an embodiment of the present disclosure.

FIGS. 3A, 3B, 3C, 3D, 3E and 3F show cross sectional views of various stages of a sequential manufacturing process of a semiconductor device according to an embodiment of the present disclosure.

FIG. 4 shows gate structures of multiple FETs with different threshold voltages according to embodiments of the present disclosure.

FIGS. 5A, 5B, 5C, 5D, 5E, 5F, 5G, 5H, 5I, and 5J show various cross sectional views of a shield layer and an n-type work function adjustment material (WFM) layer according to embodiments of the present disclosure.

FIGS. 7A, 7B, 7C and 7D show cross sectional views of various stages of a sequential manufacturing process of a semiconductor device according to embodiments of the present disclosure.

FIGS. 8A, 8B, 8C and 8D show cross sectional views of various stages of a sequential manufacturing process of a semiconductor device according to embodiments of the present disclosure.

FIGS. 9A, 9B, 9C and 9D show cross sectional views of various stages of a sequential manufacturing process of a semiconductor device according to embodiments of the present disclosure.

FIGS. 10A, 10B, 10C and 10D show cross sectional views of various stages of a sequential manufacturing process of a semiconductor device according to embodiments of the present disclosure.

FIGS. 11A, 11B and 11C show cross sectional views of various stages of a sequential manufacturing process of a semiconductor device according to embodiments of the present disclosure.

FIG. 12 shows a cross section view of a semiconductor device according to an embodiment of the present disclosure.

FIGS. 14A, 14B, 14C and 14D show cross sectional views of various stages of a sequential manufacturing process of a semiconductor device according to embodiments of the present disclosure.

FIG. 15 shows a cross section view of a semiconductor device according to an embodiment of the present disclosure.

FIGS. 17A, 17B, 17C and 17D show cross sectional views of various stages of a sequential manufacturing process of a semiconductor device according to embodiments of the present disclosure.

FIG. 18 shows a cross section view of a semiconductor device according to an embodiment of the present disclosure.

FIGS. 20A, 20B, 20C and 20D show cross sectional views of various stages of a sequential manufacturing process of a semiconductor device according to embodiments of the present disclosure.

FIGS. 22A, 22B, 22C, 22D, 22E and 22F show XPS (x-ray photo electron spectroscopy) spectrums of aluminum 2p orbital, carbon is orbital and fluorine is orbital peaks from an n-type WFM layer according to embodiments of the present disclosure.

FIG. 24 shows a cross section view of a semiconductor device according to an embodiment of the present disclosure.

FIG. 25 shows a cross section view of a semiconductor device according to an embodiment of the present disclosure.

DETAILED DESCRIPTION

Figure 2A:
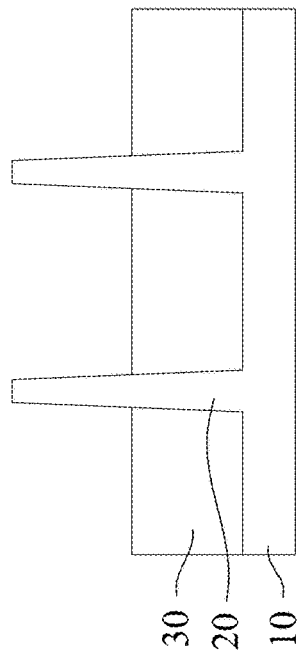
FIGS. 2A, 2B, 2C and 2D show cross sectional views of various stages of a sequential manufacturing process of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted.

Disclosed embodiments relate to a semiconductor device, in particular, a gate structure of a field effect transistor (FET) and its manufacturing method. The embodiments such as those disclosed herein are generally applicable not only to planar FETs but also to a fin FET (FinFET), a double-gate FET, a surround-gate FET, an omega-gate FET or a gate-all-around (GAA) FET, and/or nanowire transistors, or any suitable device having one or more work function adjustment material (WFM) layers in the gate structure.

In an FET structures, building multiple Vt devices with low Vt is very crucial for low power consumption and boosting device performance. Composition and thickness of metal gate films play a crucial role in defining the device work function, Vt. Multiple FETs having different threshold voltages can be realized by adjusting materials and/or thicknesses of one or more work function adjustment material layers (WFMs) disposed between a gate dielectric layer and a body metal gate electrode layer (e.g., a W layer). For an n-type FET, an aluminum containing layer, such as TiAl, TiAlC, TaAl and/or TaAlC, is used as a WFM layer. However, when the aluminum containing layer is subjected to patterning operations, carbon contamination and/or oxidation of the aluminum containing layer may occur, which affects its work function thereby affecting threshold voltages and degrade device performance.

The present disclosure relates to the use of a protective shield layer on and/or beneath an n-type WFM layer containing aluminum. As will be discussed in the following, the present disclosure provides devices and methods that can protect the n-type WFM layer containing aluminum from oxidation and/or carbon contamination and/or damage from cut metal gate gases and/or damage from patterning processes.

FIG. 1A shows a cross section view of a semiconductor device according to an embodiment of the present disclosure.

In some embodiments, a semiconductor device includes a gate stack 80 disposed over a channel region of a fin structure 20. The gate stack 80 includes an interfacial layer 81, a gate dielectric layer 82, a first conductive layer 83 as a cap layer, a second conductive layer 84 as a first barrier layer, a work function adjustment material layer or a work function adjustment layer (a WFM layer) 86, a glue layer 87 and a body gate electrode layer 88 as shown in FIG. 1A. In some embodiments, the fin structure 20 is provided over a substrate 10 and protrudes from an isolation insulating layer 30. Further, gate sidewall spacers 46 are disposed on opposite side faces of the gate stack 80 and one or more dielectric layers 50 are formed to cover the gate sidewall spacers 46. In some embodiments, a piece of insulating material 42 is disposed between the gate sidewall spacer 46 and the isolation insulating layer 30. Further, as shown in FIG. 1B, source/drain epitaxial layers 60 are formed over recessed fin structures. Although FIG. 1A shows two fin structures and FIG. 1B shows three fin structures, the number of fin structures is not limited to those shown in FIGS. 1A and 1B.

In some embodiments, the first conductive layer 83 includes a metal nitride, such as WN, TaN, TiN and TiSiN. In some embodiments, TiN is used. The thickness of the first conductive layer 83 is in a range from about 0.3 nm to about 30 nm in some embodiments, and is in a range from about 0.5 nm to about 25 nm in other embodiments. In some embodiments, the first conductive layer 83 is crystalline having, e.g., columnar crystal grains.

In some embodiments, the second conductive layer 84 includes a metal nitride, such as WN, TaN, TiN and TiSiN. In some embodiments, TaN is used. The thickness of the second conductive layer 84 is in a range from about 0.3 nm to about 30 nm in some embodiments, and is in a range from about 0.5 nm to about 25 nm in other embodiments. In some embodiments, the second conductive layer 84 functions as a barrier layer or an etch stop layer. In some embodiments, the second conductive layer 84 is thinner than the first conductive layer 83.

In some embodiments, the WFM layer 86 is made of a conductive material such as a single layer of TiN, WN, TaAlC, TiC, TaAl, TaC, Co, Al, TiAl, or TiAlC, or a multilayer of two or more of these materials. For the n-type FET, an aluminum containing layer, such as TiAl, TiAlC, TaAl and/or TaAlC is used as an n-type WFM layer, and for the p-type FET, one or more of TaN, TiN, WN, TiC, WCN, MoN and/or Co is used as a p-type WFM layer. In some embodiments, an n-type WFM layer is composed of materials having low work function in a range from about 2.5 eV to about 4.4 eV and/or having low electronegativity. In some embodiments, a p-type WFM layer is composed of materials having high work function in a range from about 4.3 eV to 5.8 eV and/or having high electronegativity.

In some embodiments, the glue layer 87 is made of TiN. In some embodiments, the body gate electrode layer 88 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

FIGS. 2A-3F show cross sectional views of various stages of a sequential manufacturing process of the semiconductor device according to an embodiment of the present disclosure. FIG. 3G shows a process flow of manufacturing a semiconductor device according to an embodiment of the present disclosure. It is understood that in the sequential manufacturing process, one or more additional operations can be provided before, during, and after the stages shown in FIGS. 2A-3F, and some of the operations described below can be replaced or eliminated for additional embodiments of the method. The order of the operations/processes may be interchangeable.

As shown in FIG. 2A, one or more fin structures 20 are fabricated over a substrate 10. The substrate 10 is, for example, a p-type silicon substrate with an impurity concentration in a range of about $1\times10^{15}$ cm$^{-3}$ to about $1\times10^{18}$ cm$^{-3}$. In other embodiments, the substrate 10 is an n-type silicon substrate with an impurity concentration in a range of about $1\times10^{15}$ cm$^{-3}$ to about $1\times10^{18}$ cm$^{-3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structures 20 can be patterned by any suitable method. For example, the fin structures 20 can be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 20.

As shown in FIG. 2A, two fin structures 20 extending in the Y direction are disposed adjacent to each other in the X direction. However, the number of the fin structures is not limited to two. The numbers may be one, three, four or five or more. In addition, one of more dummy fin structures may be disposed adjacent to both sides of the fin structures 20 to improve pattern fidelity in patterning processes. The width of the fin structure 20 is in a range of about 5 nm to about 40 nm in some embodiments, and is in a range of about 7 nm to about 15 nm in certain embodiments. The height of the fin structure 20 is in a range of about 100 nm to about 300 nm in some embodiments, and is in a range of about 50 nm to 100 nm in other embodiments. The space between the fin structures 20 is in a range of about 5 nm to about 80 nm in some embodiments, and is in a range of about 7 nm to 15 nm in other embodiments. One skilled in the art will realize, however, that the dimensions and values recited throughout the descriptions are merely examples, and may be changed to suit different scales of integrated circuits. In some embodiments, the Fin FET device is an n-type Fin FET. In other embodiments, the Fin FET device is a p-type Fin FET.

Figure 2B:
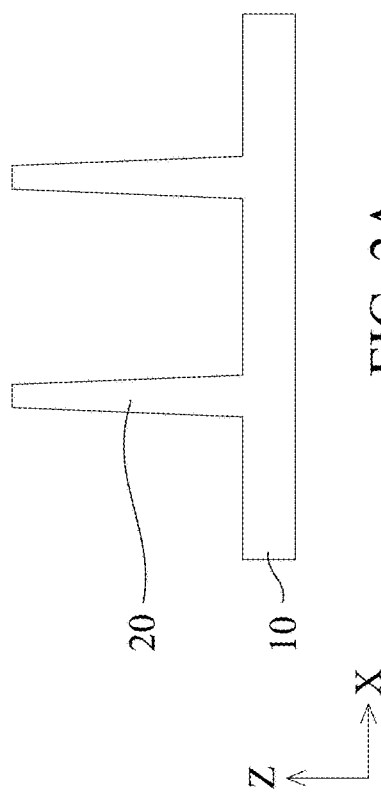

After the fin structures 20 are formed, an isolation insulating layer 30 is formed over the fin structures 20, as shown in FIG. 2B.

The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of spin-on-glass (SOG), SiO, SiON, SiOCN and/or fluoride-doped silicate glass (FSG) in some embodiments.

After forming the isolation insulating layer 30 over the fin structures 20, a planarization operation is performed so as to remove part of the isolation insulating layer 30 and the mask layer (the pad oxide layer and the silicon nitride mask layer). The planarization operation may include a chemical mechanical polishing (CMP) and/or an etch-back process. Then, the isolation insulating layer 30 is further removed so that an upper part of the fin structure 20, which is to become a channel layer, is exposed, as shown in FIG. 2B.

In certain embodiments, the partial removing of the isolation insulating layer 30 can be performed using a wet etching process, for example, by dipping the substrate in hydrofluoric acid (HF). In another embodiment, the partial removing of the isolation insulating layer 30 can be performed using a dry etching process. For example, a dry etching process using CHF$_3$ or BF$_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an N$_2$, Ar or He ambient.

Figure 2C:
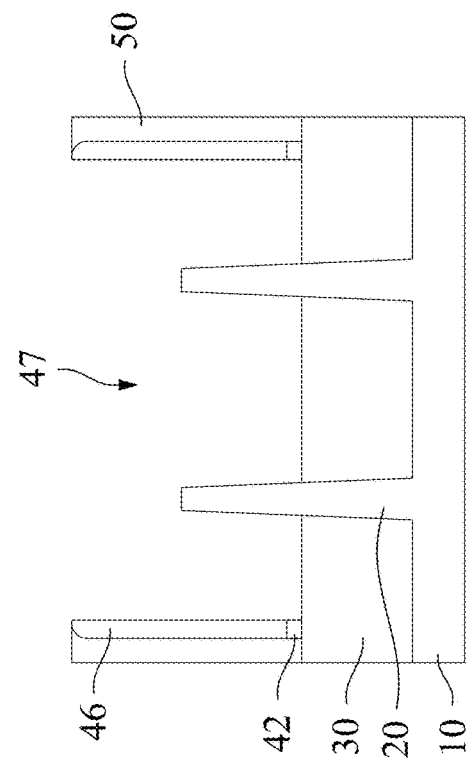

Then, a dummy gate structure 40 is formed over part of the fin structures 20 as shown in FIG. 2C.

A dielectric layer and a poly silicon layer are formed over the isolation insulating layer 30 and the exposed fin structures 20, and then patterning operations are performed so as to obtain a dummy gate structure including a dummy gate electrode layer 44 made of poly silicon and a dummy gate dielectric layer 42. The patterning of the poly silicon layer is performed by using a hard mask including a silicon nitride layer and an oxide layer in some embodiments. The dummy gate dielectric layer 42 can be silicon oxide formed by CVD, PVD, ALD, e-beam evaporation, or other suitable process. In some embodiments, the dummy gate dielectric layer 42 includes one or more layers of silicon oxide, silicon nitride, silicon oxy-nitride, or high-k dielectrics. In some embodiments, a thickness of the dummy gate dielectric layer is in a range of about 1 nm to about 5 nm.

In some embodiments, the dummy gate electrode layer 44 is doped poly-silicon with uniform or non-uniform doping. In the present embodiment, the width of the dummy gate electrode layer 44 is in the range of about 30 nm to about 60 nm. In some embodiments, a thickness of the dummy gate electrode layer is in a range of about 30 nm to about 50 nm. In addition, one of more dummy gate structures may be disposed adjacent to both sides of the dummy gate structure 40 to improve pattern fidelity in patterning processes. The width of the dummy gate structure 40 is in a range of about 5 nm to about 40 nm in some embodiments, and is in a range of about 7 nm to about 15 nm in certain embodiments.

Further, as shown in FIG. 2C, sidewall spacers 46 are formed on opposite side faces of the dummy gate structures 40. An insulating material layer for sidewall spacers 46 is formed over the dummy gate structure 40. The insulating material layer is deposited in a conformal manner so that it is formed to have substantially equal thicknesses on vertical surfaces, such as the sidewalls, horizontal surfaces, and the top of the dummy gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, bottom portions of the insulating material layer are removed by anisotropic etching, thereby forming sidewall spacers 46. In some embodiments, the sidewall spacers 46 include two to four layers of different insulating materials. In some embodiments, part of the dummy gate dielectric layer 42 is disposed between the sidewall spacers 46 and the isolation insulating layer 30. In other embodiments, no part of the dummy gate dielectric layer 42 is disposed between the sidewall spacers 46 and the isolation insulating layer 30.

Subsequently, a source/drain region of the fin structure 20 not covered by the dummy gate structure 40 is etched down (recessed) to form a source/drain recess in some embodiments. After the source/drain recess is formed, one or more source/drain epitaxial layers 60 (see, FIG. 1B) are formed in the source/drain recess. In some embodiments, a first epitaxial layer, a second epitaxial layer and a third epitaxial layer are formed. In other embodiments, no recess is formed and the epitaxial layers are formed over the fin structure.

In some embodiments, the first epitaxial layer includes SiP or SiCP for an n-type FinFET, and SiGe doped with B for a p-type FinFET, in the some embodiments. An amount of P (phosphorus) in the first epitaxial layer is in a range from about $1\times10^{18}$ atoms/cm$^3$ to about $1\times10^{20}$ atoms/cm$^3$, in some embodiments. The thickness of the first epitaxial layer is in a range of about 5 nm to 20 nm in some embodiments, and in a range of about 5 nm to about 15 nm in other embodiments. When the first epitaxial layer is SiGe, an amount of Ge is about 25 atomic % to about 32 atomic % in some embodiments, and is about 28 atomic % to about 30 atomic % in other embodiments. The second epitaxial layer includes SiP or SiCP for an n-type FinFET, and SiGe doped with B for a p-type FinFET, in some embodiments. In some embodiments, an amount of phosphorus in the second epitaxial layer is higher than the phosphorus amount of the first epitaxial layer and is in a range about $1\times10^{20}$ atoms/cm$^3$ to about $2\times10^{20}$ atoms/cm$^3$. The thickness of the second epitaxial layer is in a range of about 20 nm to 40 nm in this embodiment, or in a range of about 25 nm to about 35 nm in other embodiments. When the second epitaxial layer is SiGe, an amount of Ge is about 35 atomic % to about 55 atomic % in some embodiments, and is about 41 atomic % to about 46 atomic % in other embodiments. The third epitaxial layer includes a SiP epitaxial layer in some embodiments. The third epitaxial layer is a sacrificial layer for silicide formation in the source/drain. An amount of phosphorus in the third epitaxial layer is less than the phosphorus amount of the second epitaxial layer and is in a range of about $1\times10^{18}$ atoms/cm$^3$ to about $1\times10^{21}$ atoms/cm$^3$ in some embodiments. When the third epitaxial layer is SiGe, an amount of Ge is less than about 20 atomic % in some embodiments, and is about 1 atomic % to about 18 atomic % in other embodiments.

In at least one embodiment, the epitaxial layers 60 are epitaxially-grown by an LPCVD process, molecular beam epitaxy, atomic layer deposition or any other suitable method. The LPCVD process is performed at a temperature of about 400 to 850° C. and under a pressure of about 1 Torr to 200 Torr, using silicon source gas such as $SiH_4$, $Si_2H_6$, or $Si_3H_8$; germanium source gas such as $GeH_4$, or $G_2H_6$; carbon source gas such as $CH_4$ or $SiH_3CH_3$ and phosphorus source gas such as $PH_3$.

Then, as shown in FIG. 2C, an interlayer dielectric (ILD) layer 50 is formed over the S/D epitaxial layer 60 and the dummy gate structure 40. The materials for the ILD layer 50 include compounds comprising Si, O, C and/or H, such as silicon oxide, SiCOH and SiOC. Organic materials, such as polymers, may be used for the ILD layer 50.

After the ILD layer 50 is formed, a planarization operation, such as CMP, is performed, so that the top portion of the dummy gate electrode layer 44 is exposed, as shown in FIG. 2C. In some embodiments, before the ILD layer 50 is formed, a contact etch stop layer, such as a silicon nitride layer or a silicon oxynitride layer, is formed.

Figure 2D:
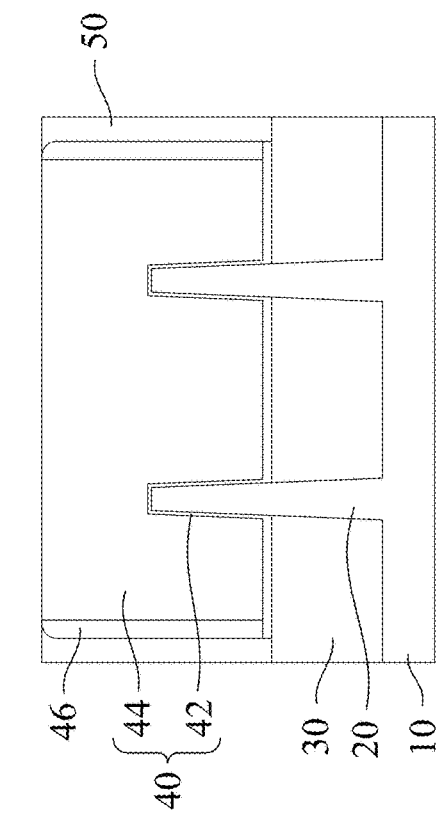

Then, the dummy gate electrode layer 44 and the dummy gate dielectric layer 42 are removed, thereby forming a gate space 47 as shown in FIG. 2D. The dummy gate structures can be removed using plasma dry etching and/or wet etching. When the dummy gate electrode layer 44 is polysilicon and the ILD layer 40 is silicon oxide, a wet etchant such as a TMAH solution can be used to selectively remove the dummy gate electrode layer 44. The dummy gate dielectric layer 42 is thereafter removed using plasma dry etching and/or wet etching.

FIG. 3A shows the structure after the channel region of the fin structures 20 are exposed in the gate space 47. In FIGS. 3A-3F, the sidewall spacers 46 and the ILD layer 50 are omitted.

Figure 3G:
FIG. 3G shows a process flow of manufacturing a semiconductor device according to an embodiment of the present disclosure.

As shown in FIG. 3B, at S301 of FIG. 3G, an interfacial layer 81 is formed on the fin structure 20 and, at S303 of FIG. 3G, a gate dielectric layer 82 is formed on the interfacial layer 81. In some embodiments, the interfacial layer is formed by using chemical oxidation. In some embodiments, the interfacial layer 81 includes one of silicon oxide, silicon nitride and mixed silicon-germanium oxide. The thickness of the interfacial layer 81 is in a range from about 0.2 nm to about 6 nm in some embodiments. In some embodiments, the gate dielectric layer 82 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$ or other suitable high-k dielectric materials, and/or combinations thereof. The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layer. The thickness of the gate dielectric layer 82 is in a range from about 1 nm to about 100 nm in one embodiment.

Then, as shown in FIG. 3C, at S305 of FIG. 3G, a first conductive layer 83 is formed. The first conductive layer 83 can be formed by CVD, ALD or any suitable method in some embodiments. In some embodiments, the first conductive layer 83 is made of TiN or TiSiN.

In some embodiments, at S307 of FIG. 3G, after the first conductive layer 83 is formed, a first annealing operation is performed for about 1 nsec (spike annealing, such as a laser annealing) to about 360 sec at a temperature of about 600° C. to about 800° C. in some embodiments.

The first annealing can help to densify the gate dielectric layer 82 and to incorporate nitrogen into the gate dielectric layer 82. Nitrogen helps to passivate oxygen vacancies, reduces leakage and improves device reliability. The first annealing can also help to form a stable intermixing layer, which helps to provide a stable platform for subsequent metal gate film deposition onto the dielectric layer. When the temperature is too high, the first annealing may cause crystallization and grain boundary formation in the high-k gate dielectric layer 82, which impacts leakage performance and regrowth of the interfacial layer 81, which slows down device speed. In contrast, when the temperature is too low, the first annealing may not provide sufficient densification in the high-k gate dielectric layer and cause device instability/variations during subsequent metal gate deposition processes.

In some embodiments, the stacked structure including the interfacial layer 81, the gate dielectric layer 82 and the first conductive layer 83 is soaked in a fluorine containing gas (e.g., $F_2$ and/or $NF_3$) for about 4 sec to about 15 min at a temperature of about room temp (25° C.) to about 550° C. in some embodiments. Incorporation of fluorine helps to improve the work function adjustment property, decrease Vt of a PMOS device, passivate oxygen vacancies in the gate dielectric layer 82, reduce leakage and reduce dangling bonds in the gate dielectric layer. Thereafter, a capping layer made of, for example a crystalline, polycrystalline or amorphous Si, is formed over the first conductive layer 83, and a second annealing operation is performed for about 1 nsec (spike annealing, such as a laser annealing) to about 360 sec at a temperature of about 550° C. to about 1300° C. in some embodiments. In some embodiments, the annealing temperature is from 900° C. to 1100° C. This results in the diffusion of the fluorine into the capping layer, the first conductive layer 83 and the gate dielectric layer 82 in some embodiments. After the second annealing operation, the capping layer is removed. The second annealing with the Si capping layer also helps to improve the quality of the gate dielectric layer 82. A gate dielectric layer, such as a high-k dielectric layer, is formed at a relatively low temperature to avoid crystallization and grain boundary formation, while metal gate films are deposited at relatively higher temperatures. Accordingly, it is desirable to make the high-k dielectric layer more thermally stable before the metal gate deposition. The second annealing with the capping layer at the temperature ranges as set forth above can densify the high-k dielectric layer, and make it thermally stable, without any thermal oxide inversion during the metal gate deposition. The second annealing also helps to thermally in-diffuse the fluorine from the outer layers (e.g., the capping layer) into the first conductive layer 83, the gate dielectric layer 82 and the interfacial layer 81. The capping layer is used to protect the gate dielectric layer 82 and the first conductive layer 83 from undesirable oxidation damage and to isolate these films from the annealing atmosphere. After thermal stabilization of the gate dielectric layer, the capping layer is no longer required in the final device structure and therefore it is removed.

In other embodiments, no fluorine soaking operation accompanying formation of a Si capping layer and a second annealing operation is performed.

Subsequently, at S309 of FIG. 3G, a second conductive layer, as a first barrier layer 84 is formed, and then at S311 of FIG. 3G, one or more WFM layers 86 are formed. A metal gate layer including a glue layer 87 and a body metal layer (gate electrode layer) 88 is formed above the work function adjustment layer 86, at S313 of FIG. 3G.

In some embodiments, the second conductive layer 84 is made of TaN and serves as an etch stop barrier layer. The barrier layer 86 acts as a wet etching stop layer during patterning of p-type and n-type WFM layers subsequently formed to form multiple Vt devices. The work function adjustment material (WFM) layer can be formed by ALD, PVD, CVD, e-beam evaporation, or other suitable process. Further, the WFM layer can be formed separately for the n-channel FET and the p-channel FET which may use different metal layers. The gate electrode layer (body metal layer) 88 and the glue layer 87 can be formed by CVD, ALD, electro-plating, or other suitable method.

FIG. 4 shows a cross section view of gate structures for FETs with different threshold voltages according to an embodiment of the present disclosure. In some embodiments, a semiconductor device includes a first n-type FET N1, a second n-type FET N2, a third n-type FET N3, a first p-type FET P1, a second p-type FET P2 and a third p-type FET P3. A threshold voltage of the first n-type FET N1 is smaller in an absolute value than a threshold voltage of the second n-type FET N2 and the threshold voltage of the second n-type FET N2 is smaller in an absolute value than a threshold voltage of the third n-type FET N3. Similarly, a threshold voltage of the first n-type FET P1 is smaller in an absolute value than a threshold voltage of the second p-type FET P2 and the threshold voltage of the second p-type FET P2 is smaller in an absolute value than a threshold voltage of the third p-type FET P3.

In some embodiments, the gate structure of the first n-type FET N1 includes, closer to a channel region 20, an interfacial layer 81, a gate dielectric layer 82, a first conductive layer (a cap layer) 83, a second conductive layer (a first barrier layer) 84, a first n-type WFM layer 100, a first shield layer 110, a third conductive layer (a second barrier layer) 85, a glue layer 87 and a body metal layer 88, stacked in this order. In some embodiments, the gate structure of the second n-type FET N2 includes, closer to a channel region 20, an interfacial layer 81, a gate dielectric layer 82, a first conductive layer (a cap layer) 83, a second conductive layer (a first barrier layer) 84, a first n-type WFM layer 100, a first shield layer 110, a third conductive layer (a second barrier layer) 85, a second p-type WFM layer 89-2, a glue layer 87 and a body metal layer 88, stacked in this order. In some embodiments, the gate structure of the second n-type FET N3 includes, closer to a channel region 20, an interfacial layer 81, a gate dielectric layer 82, a first conductive layer (a cap layer) 83, a second conductive layer (a first barrier layer) 84, a first n-type WFM layer 100, a first shield layer 110, a third conductive layer (a second barrier layer) 85, a first p-type WFM layer 89-1, a second p-type WFM layer 89-2, a glue layer 87 and a body metal layer 88, stacked in this order. The gate structure for the first n-type FET N1 includes no p-type WFM layer.

In some embodiments, the gate structure of the first p-type FET P1 includes, closer to a channel region 20, an interfacial layer 81, a gate dielectric layer 82, a first conductive layer (a cap layer) 83, a second conductive layer (a first barrier layer) 84, a third conductive layer (a second barrier layer) 85, a first p-type WFM layer 89-1, a second p-type WFM layer 89-2, a glue layer 87 and a body metal layer 88, stacked in this order. In some embodiments, the gate structure of the second p-type FET P2 includes, closer to a channel region 20, an interfacial layer 81, a gate dielectric layer 82, a first conductive layer (a cap layer) 83, a second conductive layer (a first barrier layer) 84, a third conductive layer (a second barrier layer) 85, a second p-type WFM layer 89-2, a glue layer 87 and a body metal layer 88, stacked in this order. In some embodiments, the gate structure of the third p-type FET P3 includes, closer to a channel region 20, an interfacial layer 81, a gate dielectric layer 82, a first conductive layer (a cap layer) 83, a second conductive layer (a first barrier layer) 84, a third conductive layer (a second barrier layer) 85, a glue layer 87 and a body metal layer 88, stacked in this order. The gate structure for the third p-type FET P3 includes no p-type WFM layer. In some embodiments, the second barrier layer 85 can function as a WFM layer.

The first n-type WFM layer 100 is made of different material than the first and second p-type WFM layers 89-1, 89-2. In some embodiments, the first n-type WFM layer 100 is made of a material having low work function in a range from about 2.5 eV to 4.4 eV and a p-type WFM layer is made of a material having high work function in a range from about 4.3 eV to 5.8 eV. In some embodiments, the first n-type WFM layer 100 includes aluminum. In some embodiments, the first n-type WFM layer includes one or more of TiAl, TiAlC, TaAl and TaAlC. In some embodiments, the first and second p-type WFM layer 89-1, 89-2 includes metal nitride, such as TiN, MoN, WCN and WN. In some embodiments, the first p-type WFM layer 89-1 is made of the same material as the second p-type WFM layer 89-2. When the first p-type WFM layer 89-1 is made of the same material as the second p-type WFM layer 89-2, the third n-type FET N3 and the first p-type FET P1 includes a single layer of a p-type WFM having a thickness greater than a p-type WFM layer (89-2) for the second n-type FET N2 and the second p-type FET P2. In other embodiments, the first p-type WFM layer 89-1 is made of a different material than the second p-type WFM layer.

In some embodiments, a thickness of the first n-type WFM layer 100 is in a range from about 0.6 nm to about 40 nm, and is in a range from about 1 nm to about 20 nm in other embodiments. The thickness of the first n-type WFM layer 100 affects the threshold voltages of n-type FETs. In some embodiments, a thickness of the first and second p-type WFM layers 89-1, 89-1 is in a range from about 0.5 nm to about 20 nm, and is in a range from about 1 nm to about 10 nm in other embodiments. The thickness of the p-type WFM layers affects the threshold voltages of n-type FETs and p-type FETs.

In some embodiments, the glue layer 87 is made of TiN, Ti and/or Co. In some embodiments, the body metal layer 88 is made of W, Al, Co, or any other suitable metal material.

A protected n-type WFM structure is formed by depositing one or more shield layers on and/or below the n-type WFM layer 100. FIGS. 5A-5J show various structures of a protected n-type WFM structure according to embodiments of the present disclosure.

In FIG. 5A, the first shield layer 110 is formed on an upper surface of the first n-type WFM layer 100 by a deposition method, such as CVD, PVD including sputtering, ALD or plating. In some embodiments, the first shield layer 110 includes one or more metal nitride layers, such as TiN, TaN, TaTiN, WN, TiSiN, WCN and MoN. In other embodiments, the first shield layer 110 includes a metal layer of at least one selected from the group consisting of Cr, Mo, Ti, Ta and Co, or a semiconductor layer, such as Si, SiGe and Ge. In some embodiments, the first shield layer 110 includes carbide of at least one selected from the group consisting of Si, Ti, Ta, Cr, Mo and Co. In some embodiments, the first shield layer 110 includes silicide of at least one selected from the group consisting of Ti, Ta, Ni, W and Mo.

In some embodiments, the first shield layer 110 is formed subsequent to the formation of the first n-type WFM layer 100 without breaking vacuum, so that any contamination from atmosphere or oxidation of the first n-type WFM layer 100 can be avoided. In other embodiments, the first shield layer 110 is formed subsequent to the formation of the first n-type WFM layer 100 with breaking vacuum. When the shield layer is formed without vacuum break, the threshold voltage caused by the first n-type WFM layer 100 is about 60 mV to about 100 mV smaller than when it is formed with vacuum break. The first shield layer 110 is formed at a temperature in a range from about 250° C. to about 600° C. in some embodiments, and the deposition temperature is in a range from about 400° C. to about 500° C. in other embodiments.

In some embodiments, a minimum thickness of the first shield layer 110 is about 0.3 nm and is about 0.5 nm in other embodiments. A maximum thickness of the first shield layer 110 is about 10 nm in some embodiments, and is about 8 nm in other embodiments. A higher thickness can provide a better protection to the first n-type WFM layer 100, and a smaller thickness can avoid a change of a threshold voltage and/or avoid gap fill concern.

In FIG. 5B, a second shield layer 115 is formed on the first shield layer 110. In some embodiments, the second shield layer 115 is made of a different material than the first shield layer 110 and can be selected from one or more of the materials listed above for the first shield layer 110. In some embodiments, the first shield layer 100 is made of a metal nitride, and the second shield layer 115 is made of a semiconductor material (e.g., Si). In some embodiments, a minimum thickness of the second shield layer 115 is about 0.3 nm and is about 0.5 nm in other embodiments. A maximum thickness of the second shield layer 115 is about 10 nm in some embodiments, and is about 8 nm in other embodiments.

In FIG. 5C, the first shield layer is a Ti/Ta-rich Al containing layer 120 having a higher Ti or Ta content than the first n-type WFM layer 100. In some embodiments, the Ti/Ta rich layer 120 is a Ti-rich TiAl layer, a Ti-rich TiAlC layer, a Ta-rich TaAl layer and/or a Ta-rich TaAlC layer. In some embodiments, a ratio of Al to Ti or Ta of the Ti/Ta-rich layer 120 is in a range from about 0.3 to about 1.2, while a ratio of Al to Ti or Ta of the first n-type WFM layer 100 is in a range from about 2 to about 6. In other words, an aluminum content of the Ti/Ta-rich layer 120 is about 30 atomic % to about 55 atomic %, while an aluminum content of the first n-type WFM layer 100 is about 67 atomic % to about 86 atomic %. When the content of Ti or Ta is higher, the first n-type WFM layer 100 is less likely oxidized. In some embodiments, a minimum thickness of the Ti/Ta rich Al containing layer 120 is about 0.3 nm and is about 0.5 nm in other embodiments. A maximum thickness of the Ti/Ta rich Al containing layer 120 is about 10 nm in some embodiments, and is about 8 nm in other embodiments.

In FIG. 5D, the first shield layer is a chemically converted layer 125 of the first n-type WFM layer 100. After the first n-type WFM layer 100 is formed, the surface of the first n-type WFM layer 100 is subjected to a chemical treatment. In some embodiments, the surface of the first n-type WFM layer 100 is treated by dilute HF to form a fluorine containing layer (e.g., $TiAlF_3$). In other embodiments, the surface of the first n-type WFM layer 100 is exposed to a $NH_3$ gas to form an N containing layer (e.g., TiAlN). In some embodiments, a minimum thickness of the chemically converted layer 125 is about 0.3 nm and is about 0.5 nm in other embodiments. A maximum thickness of the chemically converted layer 125 is about 10 nm in some embodiments, and is about 8 nm in other embodiments.

In FIG. 5E, the first shield layer is an shallow ion implanted layer 130 of the first n-type WFM layer 100. After the first n-type WFM layer 100 is formed, ions are implanted to the surface of the first n-type WFM layer 100. In some embodiments, the ions of one or more of Ga, In, Zr, Mn and Sn are implanted at a low implantation energy of about 80 eV to about 3 keV and at an implantation angle of about 5 degrees to 22 degrees. The dose of the ions is in a range from about $1 \times 10^{13}$ ions/$cm^2$ to about $1 \times 10^{19}$ ions/$cm^2$ in some embodiments. In some embodiments, a minimum thickness of the ion implanted layer 130 is about 0.3 nm and is about 0.5 nm in other embodiments. A maximum thickness of the ion implanted layer 130 is about 10 nm in some embodiments, and is about 8 nm in other embodiments.

In FIG. 5F, a third shield layer 135 is formed under the first n-type WFM layer 100 in addition to the first shield layer 110 and the first n-type WFM layer 100 is formed on the third shield layer 135. In some embodiments, the third shield layer 135 is made of the same material as the first shield layer 110, and in other embodiments, the third shield layer 135 is made of a different material than the first shield layer 110. In some embodiments, the third shield layer 135 is one or more of the metal nitride, carbide, silicide, metal, and semiconductor materials listed above for the first shield layer 110. In some embodiments, a minimum thickness of the third shield layer 135 is about 0.3 nm and is about 0.5 nm in other embodiments. A maximum thickness of the second shield layer 135 is about 10 nm in some embodiments, and is about 8 nm in other embodiments. The third shield layer 135 helps to protect the n-type WFM layer against undesirable oxidation from the underlying layers.

In FIG. 5G, the first shield layer is a Ti/Ta rich layer 140 with a gradient profile. During a deposition of the first n-type WFM layer 100 with an aluminum precursor (source) and a Ti or Ta precursor, the amount of the Ti or Ta precursor is increased and/or the amount of the Al precursor is decreased, after a desired thickness of the first n-type WFM layer is formed. In some embodiments, the amount of the precursor is gradually changed to form a Ti/Ta rich layer 140 with gradually increasing Ti or Ta. In other embodiments, the amount of the precursor is changed in a step-wise manner to form a Ti/Ta rich layer 140 with different concentrations of Ti or Ta. In some embodiments, a minimum thickness of the Ti/Ta rich layer 140 is about 0.3 nm and is about 0.5 nm in other embodiments. A maximum thickness of the Ti/Ta rich layer 140 is about 10 nm in some embodiments, and is about 8 nm in other embodiments.

In FIG. 5H, in addition to a Ti/Ta rich layer 140 with a gradient profile, another Ti/Ta rich layer 145 with a gradient profile is formed under the first n-type WFM layer 100. At the beginning of a deposition of the first n-type WFM layer 100, the amount of the Ti or Ta precursor is decreased and/or the amount of the Al precursor is increased, until a desired thickness of the another Ti/Ta rich layer 145 is formed. In some embodiments, the amount of the precursor is gradually changed to form a Ti/Ta rich layer 145 with gradually decreasing Ti or Ta. In other embodiments, the amount of the precursor is changed in a step-wise manner to form a Ti/Ta rich layer 145 with different concentrations of Ti or Ta. In some embodiments, a minimum thickness of the Ti/Ta rich layer 145 is about 0.3 nm and is about 0.5 nm in other embodiments. A maximum thickness of the Ti/Ta rich layer 145 is about 10 nm in some embodiments, and is about 8 nm in other embodiments.

In FIG. 5I, a third shield layer 135 is formed under the first n-type WFM layer 100 in addition to the first shield layer 110 and the second shield layer 115. The third shield layer 135 protects the first n-type WFM layer 100 from substrate oxidation and also confines Al within the Al-containing n-type WFM layer 100 only. The first shield layer 110 provides protection against natural oxidation and/or patterning damage protection. The second shield layer 115 provides protection from oxidation, from patterning damage and also from gases for cutting metal gate during the subsequent manufacturing process.

In FIG. 5J, a third shield layer is a Ti/Ta rich layer 145 with a gradient profile is formed under the first n-type WFM layer 100, in addition to the first shield layer 110 and the second shield layer 115 over the first n-type WFM layer 100. At the beginning of a deposition of the first n-type WFM layer 100, the amount of the Ti or Ta precursor is decreased and/or the amount of the Al precursor is increased until a desired thickness of the Ti/Ta rich layer 145 is formed. In some embodiments, the amount of the precursor is gradually changed to form the Ti/Ta rich layer 145 with gradually decreasing Ti or Ta. In other embodiments, the amount of the precursor is changed in a step-wise manner to form the Ti/Ta rich layer 145 with different concentrations of Ti or Ta.

Although FIG. 4 shows the protected n-type WFM layer explained with respect to FIG. 5I, any structure shown in FIGS. 5A-5J can be used as the protected n-type WFM layer. When two or more protected n-type WFM layers are used for one FET, the same or different protected n-type WFM layers can be used.

Figure 6:
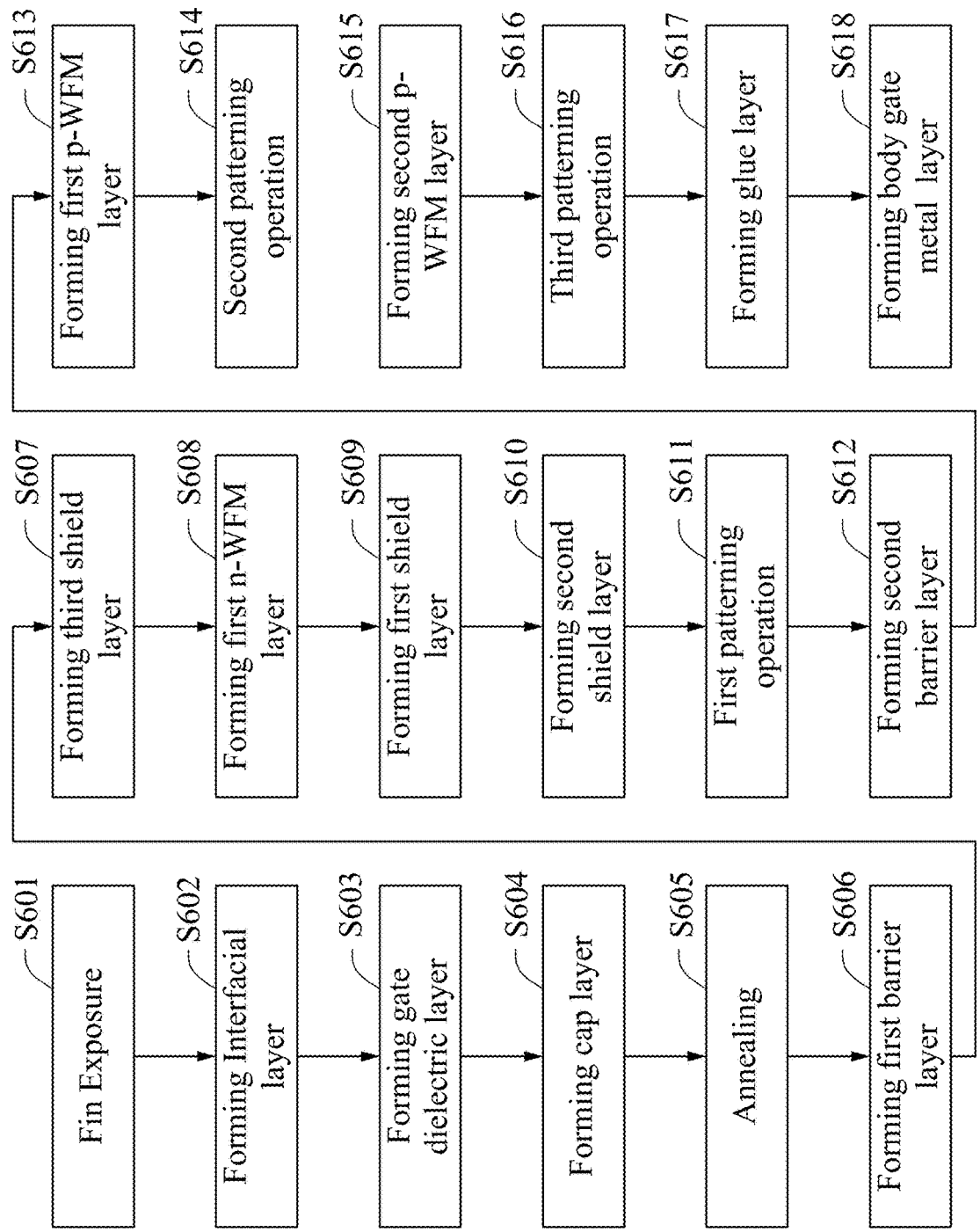
FIG. 6 shows a process flow of manufacturing a semiconductor device according to embodiments of the present disclosure.

FIG. 6 shows a process flow and FIGS. 7A-11C show cross sectional view of various stages of manufacturing the semiconductor device shown in FIG. 4, according to embodiments of the present disclosure. It is understood that in the sequential manufacturing process, one or more additional operations can be provided before, during, and after the stages shown in FIG. 6 and FIGS. 7A-11C and some of the operations described below can be replaced or eliminated for additional embodiments of the method. The order of the operations/processes may be interchangeable. Materials, configurations, dimensions, processes and/or operations as described with respect to embodiments of FIGS.

1-5H can be employed in the following embodiments, and detailed description thereof may be omitted. Although FIGS. 6 and 7A-11C show the protected n-type WFM layer explained with respect to FIGS. 4 and 5I, any structure shown in FIGS. 5A-5J can be used as the protected n-type WFM layer. Accordingly, one or more operations as shown in FIGS. 6 and 7A-11C may be omitted or replaced with another operation depending on the structure of the protected n-type WFM layer.

At S601 of FIG. 6, similar to FIG. 3A, channel regions of fin structures 20 are exposed for a first n-type FET N1, a second n-type FET N2, a third n-type FET N3, a first p-type FET P1, a second p-type FET P2 and a third p-type FET P3, respectively. At S602 of FIG. 6, an interfacial layer 81 is formed on each of the channel regions 20. At S603 of FIG. 6, a gate dielectric layer (e.g., a high-k gate dielectric layer) 82 is formed on the interfacial layer 81. At S604 of FIG. 6, a first conductive layer, as a cap layer 83, is formed on the gate dielectric layer 82. FIG. 7A shows gate structures after the cap layer 83 is formed. At S604 of FIG. 6, an annealing operation (post metal annealing) is performed. In some embodiments, a fluorine soaking operation as set forth above is performed.

At S606 of FIG. 6, a second conductive layer, as a first barrier layer 84, is formed on the cap layer 83, as shown in FIG. 7B. In some embodiments, the cap layer 83 is removed after the annealing S605 and the formation of the first barrier layer 84 is not performed.

At S607 to S6010, a protected n-type WFM layer is formed, as shown in FIG. 7C. At S607 of FIG. 6, a third shield layer 135 is formed on the barrier layer 84, at S608, a first n-type WFM layer 100 is formed on the third shield layer 135, at S609 of FIG. 6, a first shield layer 110 is formed on the first n-type WFM layer 100, and at S610 of FIG. 6, a second shield layer 115 is formed on the first shield layer 110. The third shield layer 135, the first n-type WFM layer 100, the first shield layer 110 and second shield layer 115 are formed on regions of all FETs, as shown in FIG. 7. In some embodiments, a protected n-type WFM layer as shown in any one of FIGS. 5A-5J is formed on the barrier layer 84.

Figures 8A, 8B, 8C, 8D:
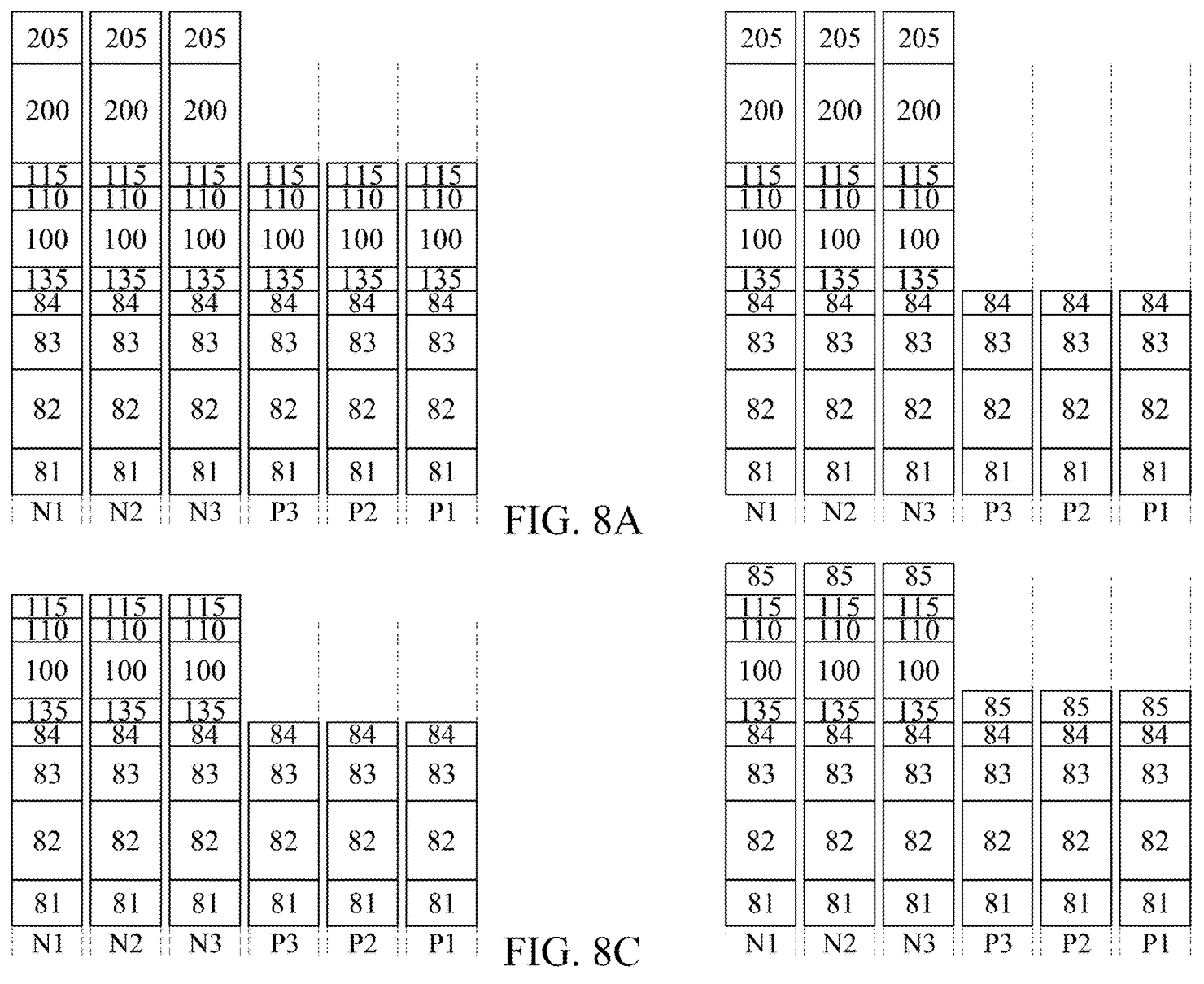

At S611 of FIG. 6, a first patterning operation is performed to remove the first shield layer 110 and the first n-type WFM layer 100 from the regions for the first p-type FET P1, the second p-type FET P2 and the third p-type FET P3. In some embodiments, a bottom antireflective layer 200 made of an organic material is formed on the first shield layer 110, and a photo resist layer 205 is formed on the bottom antireflective layer 200, as shown in FIG. 7D. By using one or more lithography operations, the photo resist layer 205 is patterned, to expose the bottom antireflective layer 200 at the regions for the p-type FETs. Then, the exposed bottom antireflective layer 200 is removed by one or more plasma etching operations, to expose the first shield layer 110 at the regions for the p-type FETs, as shown in FIG. 8A. The plasma etching operation utilizes a gas including $N_2$ and $H_2$, a gas including $O_2/Cl_2$ and/or an $O_2$ gas. Since the first shield layer 110 is disposed on the first n-type WFM layer 100 at the regions for the n-type FETs, contamination (e.g., carbon and/or oxygen contamination) from the bottom antireflective layer 200 to the first n-type WFM layer 100 and/or the plasma damage to the first n-type WFM layer 100 can be suppressed. In some embodiments, no bottom antireflective layer is used and a photo resist layer made of organic materials is formed on the first shield layer. In such a case, the shield layer can also present carbon/oxygen contamination to the n-type WFM layer 100.

Subsequently, the first shield layer 110 and the first n-type WFM layer 100 in the regions for the p-type FETs are removed by an appropriate etching operation, as shown in FIG. 8B. In some embodiments, the etching operation includes a wet etching operation. The etching solution (etchant) includes an aqueous solution of HCl and $H_2O_2$, an aqueous solution of the combination of $NH_4OH$ and $H_2O_2$, an aqueous solution of the combination of HCl, $NH_4OH$ and $H_2O_2$, an aqueous solution of HF, $NH_4OH$ and $H_2O_2$ and/or an aqueous solution of $H_3PO_4$ and $H_2O_2$. The wet etching substantially stops at the first barrier layer 84, which thus functions as an etch stop layer. In some embodiments, where the cap layer 83 is removed after the annealing S605 and no first barrier layer is deposited, the gate dielectric layer 82 acts as an etch stop layer instead of first barrier layer.

After the etching operation, the photo resist layer 205 and the bottom antireflective layer 200 are removed as shown in FIG. 8C. In some embodiments, a plasma ashing operation using an oxygen containing gas is performed to remove the organic photo resist layer 205 and bottom antireflective layer 200. In some embodiments, a $N_2/H_2$ based plasma or a $CF_4$ based plasma is used for the plasma ash operation. Since the first shield layer 110 is disposed on the first n-type WFM layer 100 at the regions for the n-type FETs, oxidation of and/or plasma damage to the first n-type WFM layer 100 can be suppressed.

At S612 of FIG. 6, a third conductive layer, as a second barrier layer 85, is formed on the first shield layer 110 at the regions for the n-type FETs and on the first barrier layer 84 at the regions for the p-type FETs, as shown in FIG. 8D. A blanket layer of the second barrier layer 85 is formed on the regions of the n-type and p-type FETs.

Figures 9A, 9B, 9C, 9D:
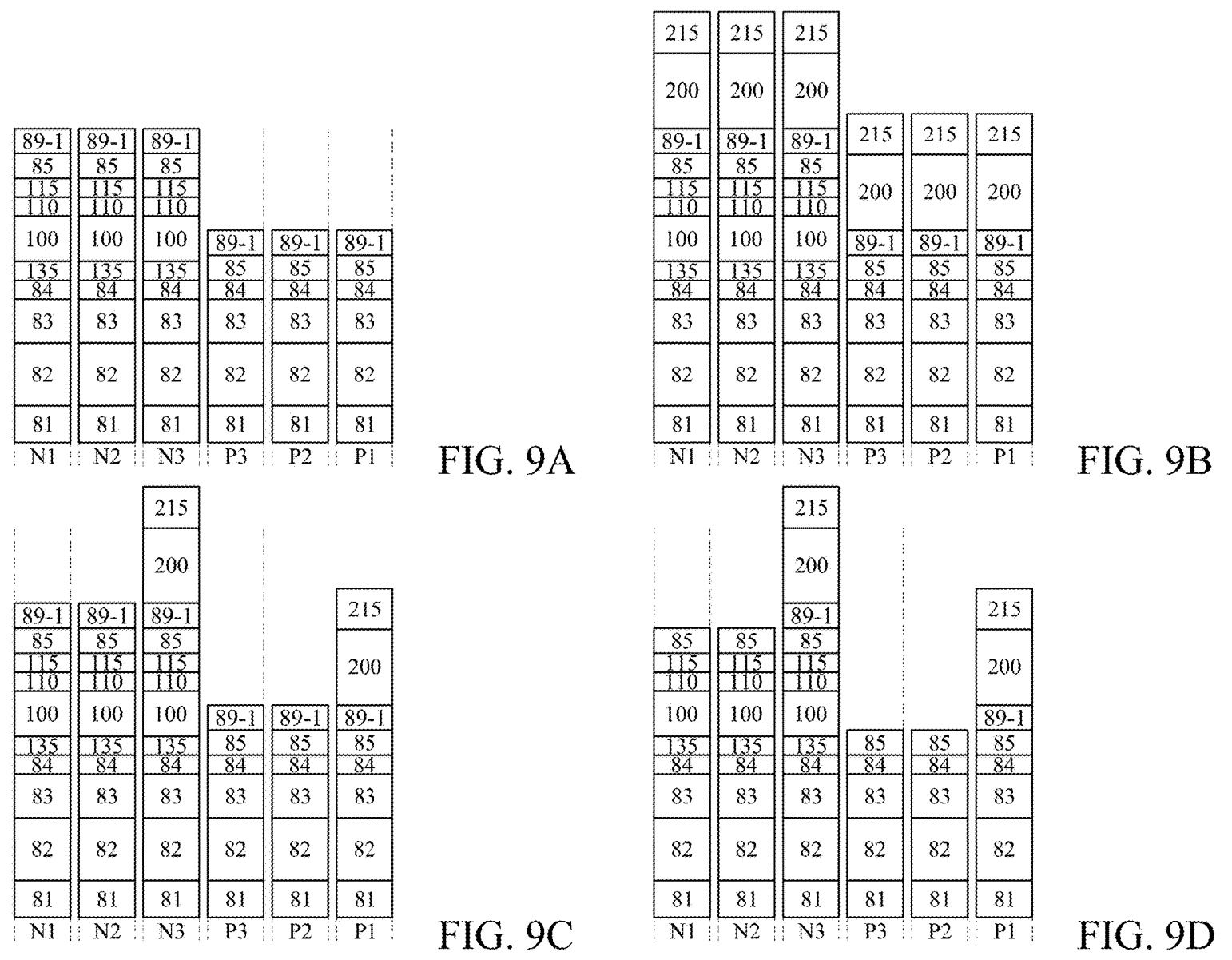

At S613, a blanket layer of a first p-type WFM layer 89-1 is formed on the second barrier layer 85 at the regions for the n-type and p-type FETs, as shown in FIG. 9A.

At S614, a second patterning operation is performed to remove the first p-type WFM layer 89-1 from the regions for the first and second n-type FETs N1, N2 and the second and third p-type FETs P2, P3. In some embodiments, a bottom antireflective layer 210 made of an organic material is formed on the first p-type WFM layer 89-1, and a photo resist layer 215 is formed on the bottom antireflective layer 210, as shown in FIG. 9B. By using one or more lithography operations, the photo resist layer 215 is patterned, to expose the bottom antireflective layer 210 at the regions for the first and second n-type FETs N1, N2 and second and third p-type FETs P2, P3. Then, the exposed bottom antireflective layer 210 is removed by one or more plasma etching operations, to expose the first p-type WFM layer 89-1 at the regions for the first and second n-type FETs N1, N2 and second and third p-type FETs P2, P3, as shown in FIG. 9C. The plasma etching utilize a gas including $N_2$ and $H_2$, a gas including $O_2/Cl_2$ and/or an $O_2$ gas.

Subsequently, the first p-type WFM layer 89-1 in the regions for the first and second n-type FETs N1, N2 and second and third p-type FETs P2, P3 is removed by an appropriate etching operation, as shown in FIG. 9D. In some embodiments, the etching operation includes a wet etching operation. The etching solution (etchant) includes an aqueous solution of $H_3PO_4$ and $H_2O_2$, an aqueous solution of the combination of HCl, $NH_4OH$ and $H_2O_2$. The wet etching substantially stops at the second barrier layer 85, which thus functions as an etch stop layer.

Figures 10A, 10B, 10C, 10D:
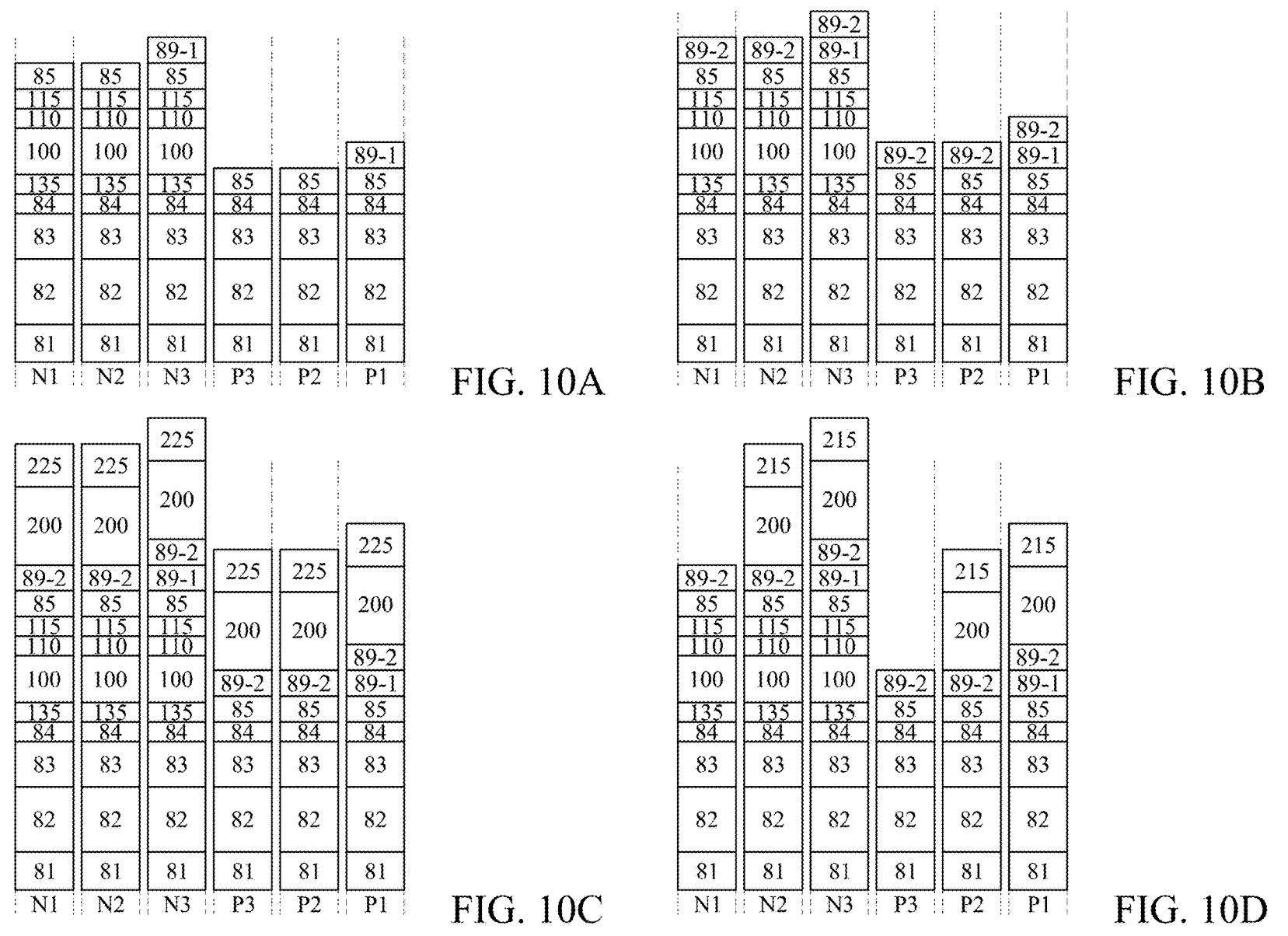

After the etching operation, the photo resist layer 215 and the bottom antireflective layer 210 are removed as shown in FIG. 10A. In some embodiments, a plasma ashing operation using an oxygen containing gas is performed to remove the organic photo resist layer 215 and bottom antireflective layer 210. In some embodiments, a NW/HL based plasma or a $CF_4$ based plasma is used for the plasma ash operation.

At S615, a blanket layer of a second p-type WFM layer 89-2 is formed on the second barrier layer 85 at the regions for the first and second n-type FETs N1, N2 and the second and third p-type FETs P2, P3 and on the first p-type WFM layer 89-1 at the regions for the third n-type FET N3 and the first p-type FET P1, as shown in FIG. 10B.

At S616, a third patterning operation is performed to remove the second p-type WFM layer 89-2 from the regions for the first n-type FET N1 and the third p-type FET P3. In some embodiments, a bottom antireflective layer 220 made of an organic material is formed on the second p-type WFM layer 89-2, and a photo resist layer 225 is formed on the bottom antireflective layer 220, as shown in FIG. 10C. By using one or more lithography operations, the photo resist layer 225 is patterned, to expose the bottom antireflective layer 220 at the regions for the first n-type FET N1 and the third p-type FET P3. Then, the exposed bottom antireflective layer 220 is removed by one or more plasma etching operations, to expose the second p-type WFM layer 89-2 at the regions for the first n-type FET N1 and the third p-type FET P3, as shown in FIG. 10D. The plasma etching utilize a gas including $N_2$ and $H_2$, a gas including $O_2/Cl_2$ and/or an $O_2$ gas.

Figures 11A, 11B, 11C:
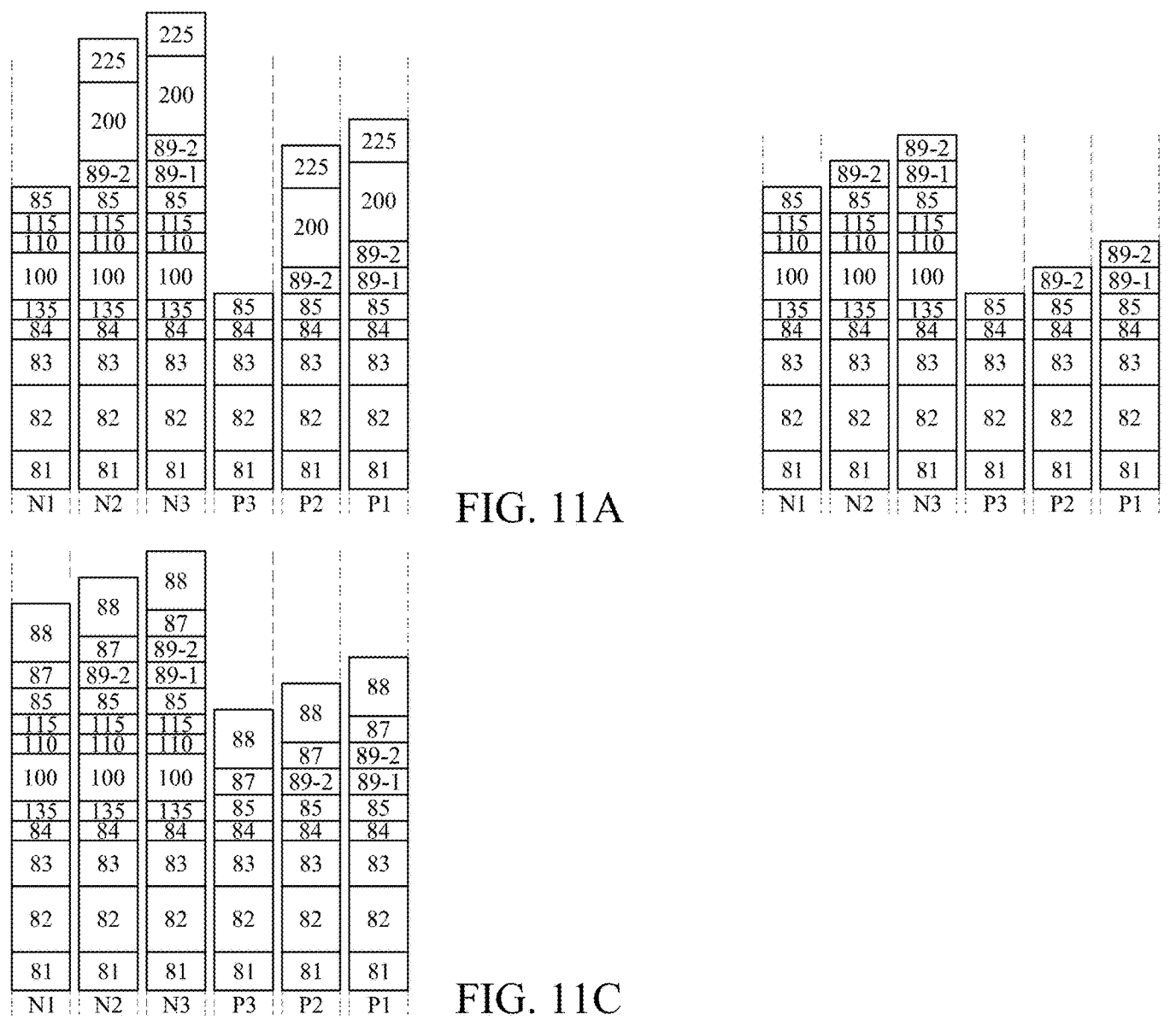

Subsequently, the second p-type WFM layer 89-2 in the regions for the first n-type FET N1 and the third p-type FET P3 is removed by an appropriate etching operation, as shown in FIG. 11A. In some embodiments, the etching operation includes a wet etching operation. The etching solution (etchant) includes an aqueous solution of $H_3PO_4$ and $H_2O_2$, an aqueous solution of the combination of HCl, $NH_4OH$ and $H_2O_2$. The wet etching substantially stops at the second barrier layer 85, which thus functions as an etch stop layer.

After the etching operation, the photo resist layer 225 and the bottom antireflective layer 220 are removed as shown in FIG. 11B. In some embodiments, a plasma ashing operation using an oxygen containing gas is performed to remove the organic photo resist layer 225 and bottom antireflective layer 220. In some embodiments, a $N_2/H_2$ based plasma or a $CF_4$ based plasma is used for the plasma ash operation.

At S617 of FIG. 6, a glue layer 87 is formed on the second barrier layer at the regions for the first n-type FET N1 and the third p-type FET P3, on the second p-type WFM layer 89-2 at the regions for the second and third n-type FETs N2, N3 and the first and second p-type FETs P1, P2, and at S618 of FIG. 6, a body metal layer 88 is formed on the glue layer 87, as shown in FIG. 11C.

In some embodiments, the second shield layer 115 is formed at any stage after S609 and before S617. In such a case, the second shield layer 115 serves to provide protection to the first n-type WFM layer 100 against gases of cutting metal gate process, like $CF_4$, $O_2$, $C_2F_6$, $BF_3$, and etc.

Figure 12:
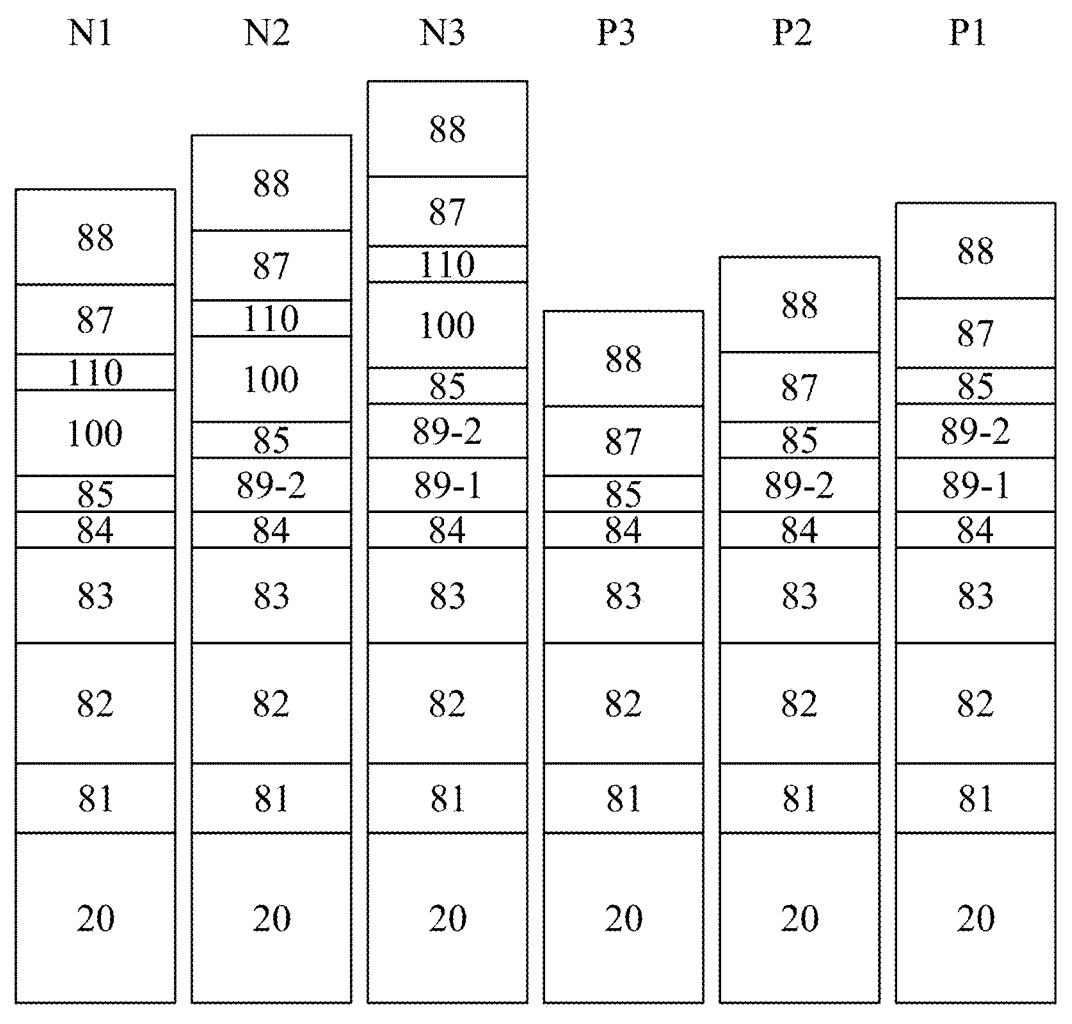

FIG. 12 shows a cross section view of gate structures for FETs with different threshold voltages according to another embodiment of the present disclosure. In some embodiments, similar to the embodiment of FIG. 4, a semiconductor device includes a first n-type FET N1, a second n-type FET N2, a third n-type FET N3, a first p-type FET P1, a second p-type FET P2 and a third p-type FET P3. A threshold voltage of the first n-type FET N1 is smaller in an absolute value than a threshold voltage of the second n-type FET N2 and the threshold voltage of the second n-type FET N2 is smaller in an absolute value than a threshold voltage of the third n-type FET N3. Similarly, a threshold voltage of the first n-type FET P1 is smaller in an absolute value than a threshold voltage of the second p-type FET P2 and the threshold voltage of the second p-type FET P2 is smaller in an absolute value than a threshold voltage of the third p-type FET P3. Although FIG. 12 (and FIG. 13) shows the protected n-type WFM layer explained with respect to FIG. 5A, any structure shown in FIGS. 5A-5J can be used as the protected n-type WFM layer.

In some embodiments, the gate structure of the first n-type FET N1 includes, closer to a channel region 20, an interfacial layer 81, a gate dielectric layer 82, a first conductive layer (a cap layer) 83, a second conductive layer (a first barrier layer) 84, a third conductive layer (a second barrier layer) 85, a first n-type WFM layer 100, a first shield layer 110, a glue layer 87 and a body metal layer 88, stacked in this order. In some embodiments, the gate structure of the second n-type FET N2 includes, closer to a channel region 20, an interfacial layer 81, a gate dielectric layer 82, a first conductive layer (a cap layer) 83, a second conductive layer (a first barrier layer) 84, a second p-type WFM layer 89-2, a third conductive layer (a second barrier layer) 85, a first n-type WFM layer 100, a first shield layer 110, a glue layer 87 and a body metal layer 88, stacked in this order. In some embodiments, the gate structure of the second n-type FET N3 includes, closer to a channel region 20, an interfacial layer 81, a gate dielectric layer 82, a first conductive layer (a cap layer) 83, a second conductive layer (a first barrier layer) 84, a first p-type WFM layer 89-1, a second p-type WFM layer 89-2, a third conductive layer (a second barrier layer) 85, a first n-type WFM layer 100, a first shield layer 110, a glue layer 87 and a body metal layer 88, stacked in this order. The gate structure for the first n-type FET N1 includes no p-type WFM layer. In some embodiments, a first conductive layer (a cap layer) 83 and a second conductive layer (a first barrier layer) 84 are not present in n-type FETs N1, N2 and N3.

In some embodiments, the gate structure of the first p-type FET P1 includes, closer to a channel region 20, an interfacial layer 81, a gate dielectric layer 82, a first conductive layer (a cap layer) 83, a second conductive layer (a first barrier layer) 84, a first p-type WFM layer 89-1, a second p-type WFM layer 89-2, a third conductive layer (a second barrier layer) 85, a glue layer 87 and a body metal layer 88, stacked in this order. In some embodiments, the gate structure of the second p-type FET P2 includes, closer to a channel region 20, an interfacial layer 81, a gate dielectric layer 82, a first conductive layer (a cap layer) 83, a second conductive layer (a first barrier layer) 84, a second p-type WFM layer 89-2, a third conductive layer (a second barrier layer) 85, a glue layer 87 and a body metal layer 88, stacked in this order. In some embodiments, the gate structure of the third p-type FET P3 includes, closer to a channel region 20, an interfacial layer 81, a gate dielectric layer 82, a first conductive layer (a cap layer) 83, a second conductive layer (a first barrier layer) 84, a third conductive layer (a second barrier layer) 85, a glue layer 87 and a body metal layer 88, stacked in this order. The gate structure for the third p-type FET P3 includes no p-type WFM layer. In some embodiments, the second barrier layer 85 can function as a WFM layer. In some embodiments, a first conductive layer (a cap layer) 83 and a second conductive layer (a first barrier layer) 84 are not present in p-type FETs P1, P2 and P3.

The materials, configuration and dimensions of the layer shown in FIG. 12 are the same as those of the layers shown in FIG. 4 in some embodiments.

Figure 13:
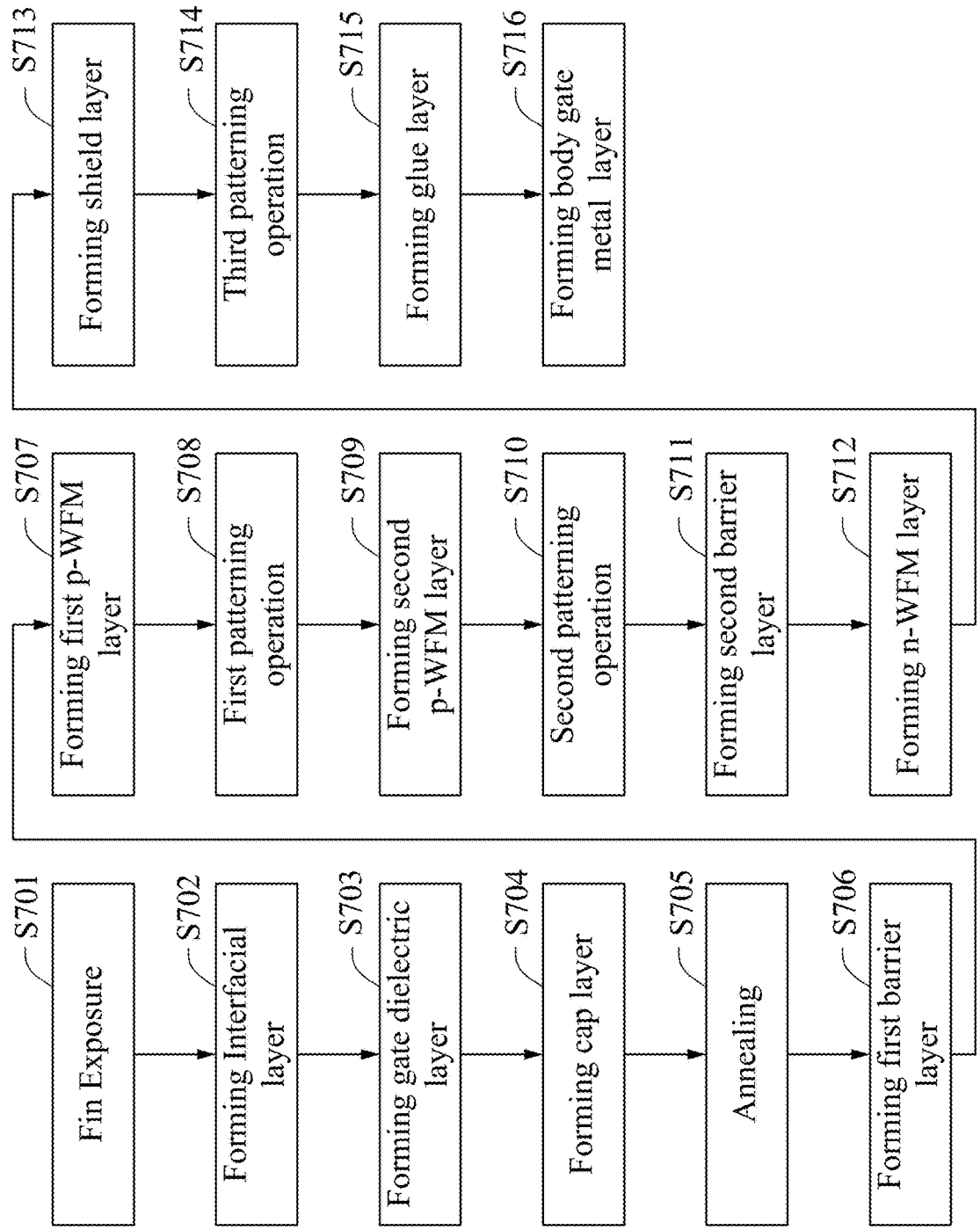
FIG. 13 shows a process flow of manufacturing a semiconductor device according to embodiments of the present disclosure.

FIG. 13 shows a process flow of various stages of manufacturing the semiconductor device shown in FIG. 12, according to embodiments of the present disclosure. It is understood that in the sequential manufacturing process, one or more additional operations can be provided before, during, and after the stages shown in FIG. 13 and some of the operations described below can be replaced or eliminated for additional embodiments of the method. The order of the operations/processes may be interchangeable. Materials, configurations, dimensions, processes and/or operations as described with respect to embodiments of FIGS. 1-11C can be employed in the following embodiments, and detailed description thereof may be omitted.

The operations of S701, S702, S703, S704, S705 and S706 of FIG. 13 are the same as the operations of S601, S602, S603, S604, S605 and S606 of FIG. 6, respectively.

Figures 14A, 14B, 14C, 14D:
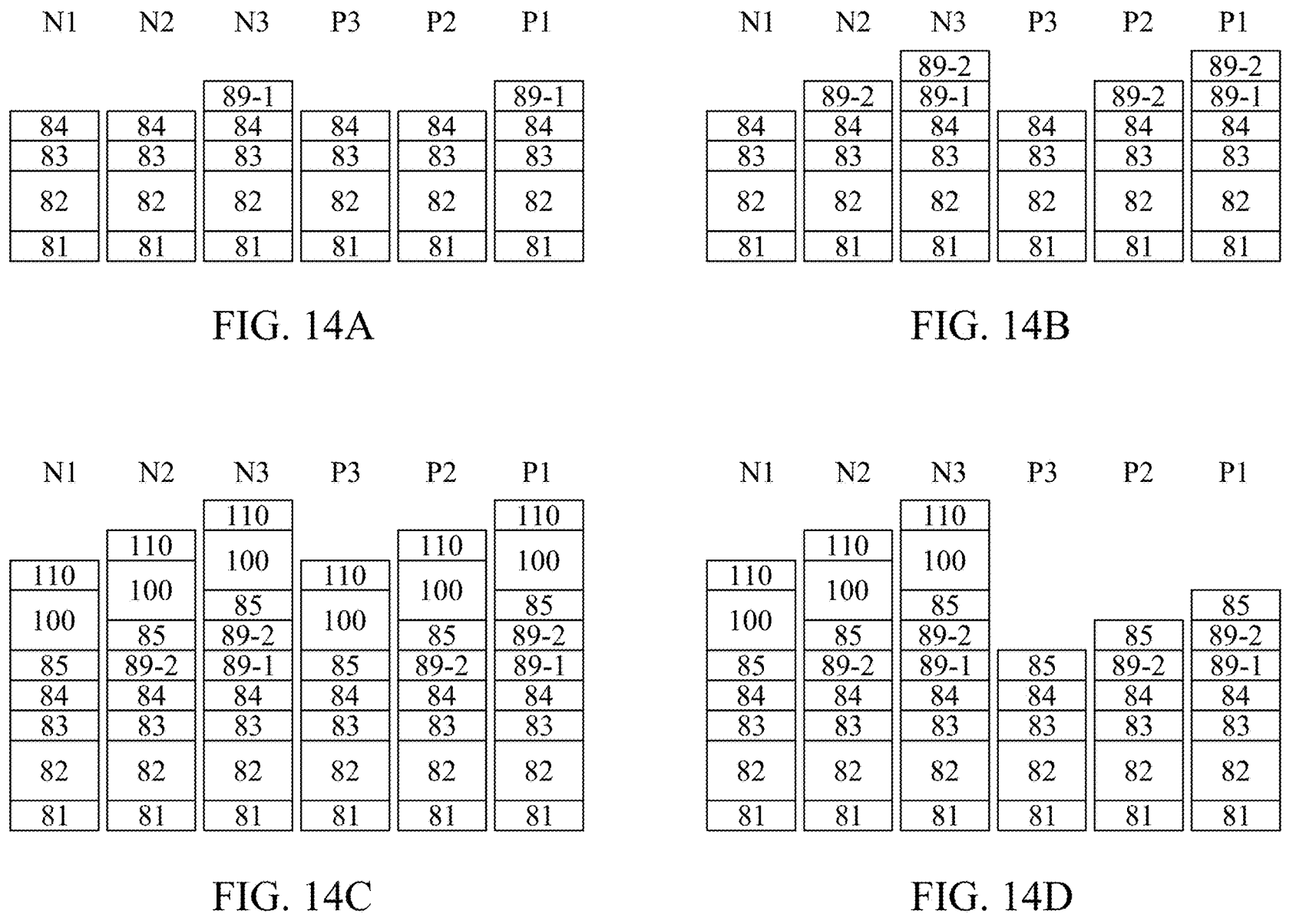

At S707 of FIG. 13, a blanket layer of a first p-type WFM layer 89-1 is formed on the first barrier layer 84. Then, at S708 of FIG. 13, a first patterning operation is performed to remove the first p-type WFM layer 89-1 from the regions for the first and second n-type FETs N1, N2 and the regions for the second and third p-type FETs P2, P3, as shown in FIG. 14A. The first patterning operation is similar to the second patterning operation as explained with respect to FIGS. 9B-10A.

At S709 of FIG. 13, a blanket layer of a second p-type WFM layer 89-2 is formed on the first barrier layer 84 at the regions for the first and second n-type FETs N1, N2 and the regions for the second and third p-type FETs P2, P3, and on the first p-type WFM layer 89-1 at the regions for the third n-type FET N3 and the first p-type FET P1. Then, at S710 of FIG. 13, a second patterning operation is performed to remove the first p-type WFM layer 89-1 from the regions for the first n-type FET N1 and the third p-type FETs P3, as shown in FIG. 14B. The second patterning operation is similar to the third patterning operation as explained with respect to FIGS. 10C-11B.

At S711, a blanket layer of a second barrier layer 85 is formed on the first barrier layer 84 at the regions for the first n-type FET N1 and the third p-type FETs P3, on the second p-type WFM layer 89-2 at the regions for the second and third n-type FETs N2, N3 and the first and second p-type FETs P1, P2.

Subsequently, at S712 of FIG. 13, a first n-type WFM layer 100 is formed on the second barrier layer 85, and at S713 of FIG. 13, a first shield layer 110 is formed on the first n-type WFM layer 100, as shown in FIG. 14C.

At S714 of FIG. 13, a third patterning operation is performed to remove the first shield layer 110 and the first n-type WFM layer 100 from the regions for the first, second and third p-type FETs P1, P2, P3, as shown in FIG. 14D. The third patterning operation is similar to the first patterning operation as explained with respect to FIGS. 7D-8C.

Then, at S715 of FIG. 13, a glue layer 87 is formed on the second barrier layer at the regions for the first n-type FET N1 and the third p-type FET P3, on the second p-type WFM layer 89-2 at the regions for the second and third n-type FETs N2, N3 and the first and second p-type FETs P1, P2, similar to the operation of S617 of FIG. 6, and at S716 of FIG. 13, a body metal layer 88 is formed on the glue layer 87, similar to S618 of FIG. 6 to obtain the structure shown in FIG. 12.

Figure 15:
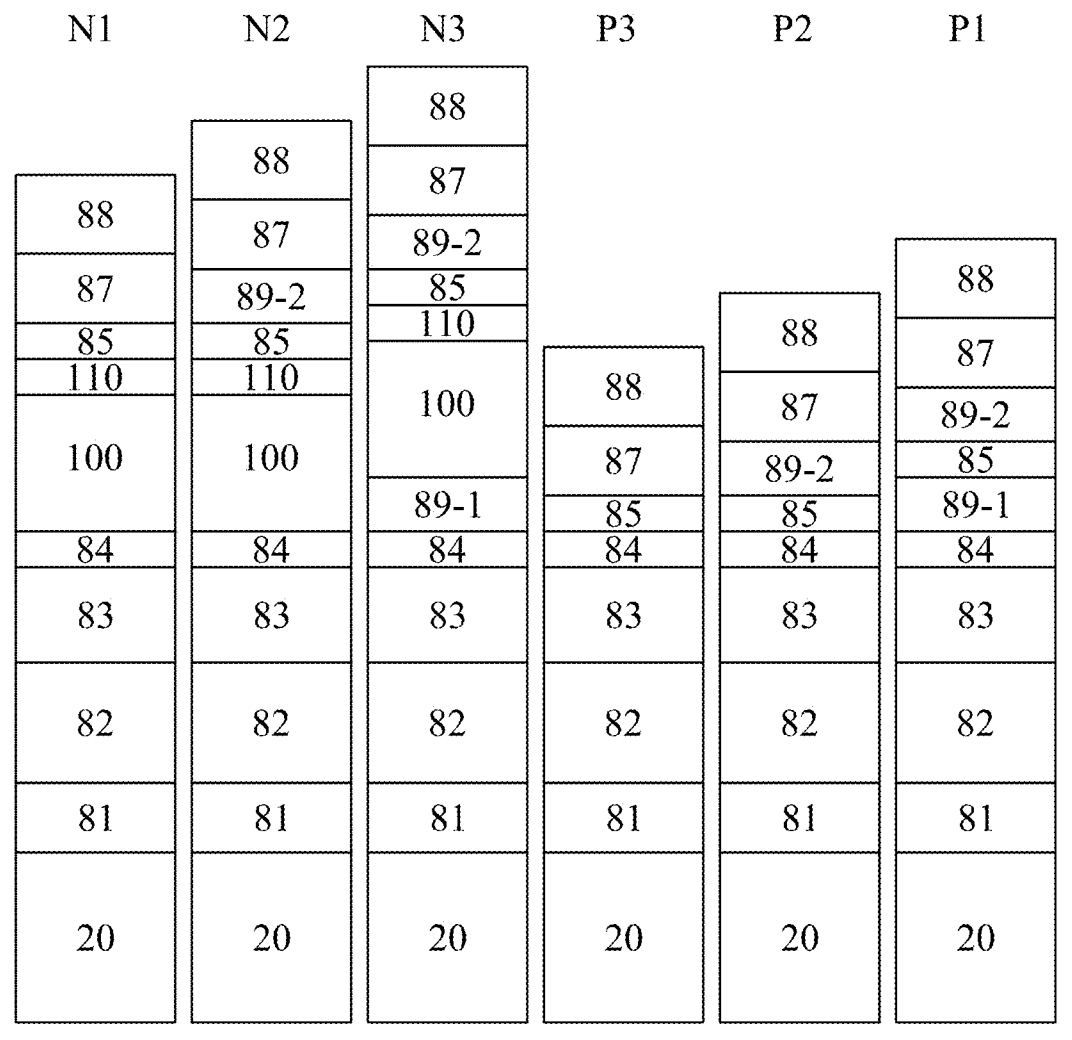

FIG. 15 shows a cross section view of gate structures for FETs with different threshold voltages according to another embodiment of the present disclosure. In some embodiments, similar to the embodiment of FIGS. 4 and 12, a semiconductor device includes a first n-type FET N1, a second n-type FET N2, a third n-type FET N3, a first p-type FET P1, a second p-type FET P2 and a third p-type FET P3. A threshold voltage of the first n-type FET N1 is smaller in an absolute value than a threshold voltage of the second n-type FET N2 and the threshold voltage of the second n-type FET N2 is smaller in an absolute value than a threshold voltage of the third n-type FET N3. Similarly, a threshold voltage of the first n-type FET P1 is smaller in an absolute value than a threshold voltage of the second p-type FET P2 and the threshold voltage of the second p-type FET P2 is smaller in an absolute value than a threshold voltage of the third p-type FET P3. Although FIG. 15 (and FIG. 16) shows the protected n-type WFM layer explained with respect to FIG. 5A, any structure shown in FIGS. 5A-5J can be used as the protected n-type WFM layer.

In some embodiments, the gate structure of the first n-type FET N1 includes, closer to a channel region 20, an interfacial layer 81, a gate dielectric layer 82, a first conductive layer (a cap layer) 83, a second conductive layer (a first barrier layer) 84, a first n-type WFM layer 100, a first shield layer 110, a third conductive layer (a second barrier layer) 85, a glue layer 87 and a body metal layer 88, stacked in this order. In some embodiments, the gate structure of the second n-type FET N2 includes, closer to a channel region 20, an interfacial layer 81, a gate dielectric layer 82, a first conductive layer (a cap layer) 83, a second conductive layer (a first barrier layer) 84, a first n-type WFM layer 100, a first shield layer 110, a third conductive layer (a second barrier layer) 85, a second p-type WFM layer 89-2, a glue layer 87 and a body metal layer 88, stacked in this order. In some embodiments, the gate structure of the second n-type FET N3 includes, closer to a channel region 20, an interfacial layer 81, a gate dielectric layer 82, a first conductive layer (a cap layer) 83, a second conductive layer (a first barrier layer) 84, a first p-type WFM layer 89-1, a first n-type WFM layer 100, a first shield layer 110, a third conductive layer (a second barrier layer) 85, a second p-type WFM layer 89-2, a glue layer 87 and a body metal layer 88, stacked in this order. The gate structure for the first n-type FET N1 includes no p-type WFM layer. In some embodiments, a first conductive layer (a cap layer) 83 and a second conductive layer (a first barrier layer) 84 are not present in n-type FETs N1, N2 and N3.

In some embodiments, the gate structure of the first p-type FET P1 includes, closer to a channel region 20, an interfacial layer 81, a gate dielectric layer 82, a first conductive layer (a cap layer) 83, a second conductive layer (a first barrier layer) 84, a first p-type WFM layer 89-1, a third conductive layer (a second barrier layer) 85, a second p-type WFM layer 89-2, a glue layer 87 and a body metal layer 88, stacked in this order. In some embodiments, the gate structure of the second p-type FET P2 includes, closer to a channel region 20, an interfacial layer 81, a gate dielectric layer 82, a first conductive layer (a cap layer) 83, a second conductive layer (a first barrier layer) 84, a third conductive layer (a second barrier layer) 85, a second p-type WFM layer 89-2, a glue layer 87 and a body metal layer 88, stacked in this order. In some embodiments, the gate structure of the third p-type FET P3 includes, closer to a channel region 20, an interfacial layer 81, a gate dielectric layer 82, a first conductive layer (a cap layer) 83, a second conductive layer (a first barrier layer) 84, a third conductive layer (a second barrier layer) 85, a glue layer 87 and a body metal layer 88, stacked in this order. The gate structure for the third p-type FET P3 includes no p-type WFM layer. In some embodiments, the second barrier layer 85 can function as a WFM layer. In some embodiments, a first conductive layer (a cap layer) 83 and a second conductive layer (a first barrier layer) 84 are not present in p-type FETs P1, P2 and P3. The materials, configuration and dimensions of the layer shown in FIG. 15 are the same as those of the layers shown in FIGS. 4 and 12 in some embodiments.

Figure 16:
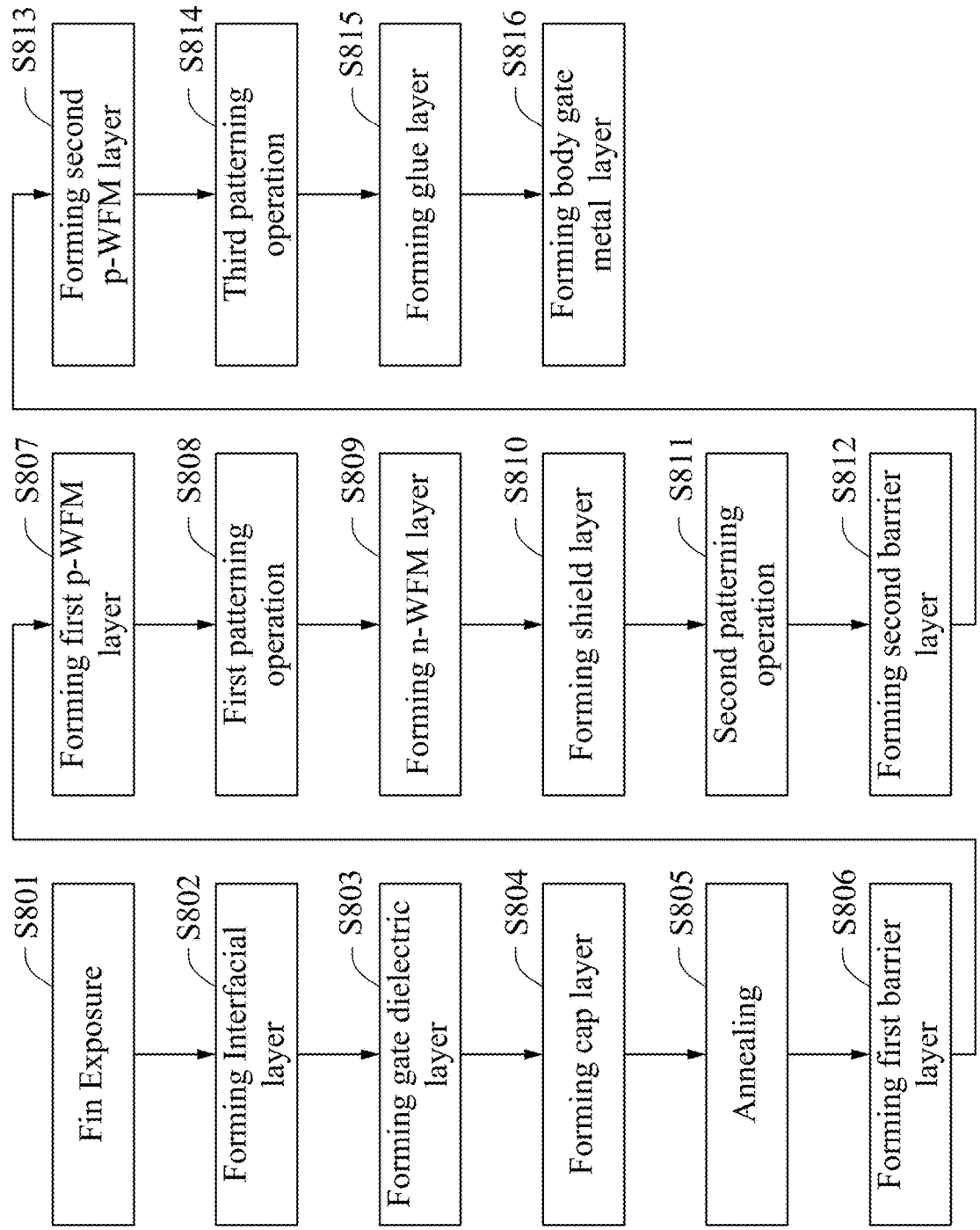
FIG. 16 shows a process flow of manufacturing a semiconductor device according to embodiments of the present disclosure.

FIG. 16 shows a process flow of various stages of manufacturing the semiconductor device shown in FIG. 15, according to embodiments of the present disclosure. It is understood that in the sequential manufacturing process, one or more additional operations can be provided before, during, and after the stages shown in FIG. 16 and some of the operations described below can be replaced or eliminated for additional embodiments of the method. The order of the operations/processes may be interchangeable. Materials, configurations, dimensions, processes and/or operations as described with respect to embodiments of FIGS. 1-14D can be employed in the following embodiments, and detailed description thereof may be omitted.

The operations of S801, S802, S803, S804, S805 and S806 of FIG. 16 are the same as the operations of S601, S602, S603, S604, S605 and S606 of FIG. 6, respectively.

Figures 17A, 17B, 17C, 17D:
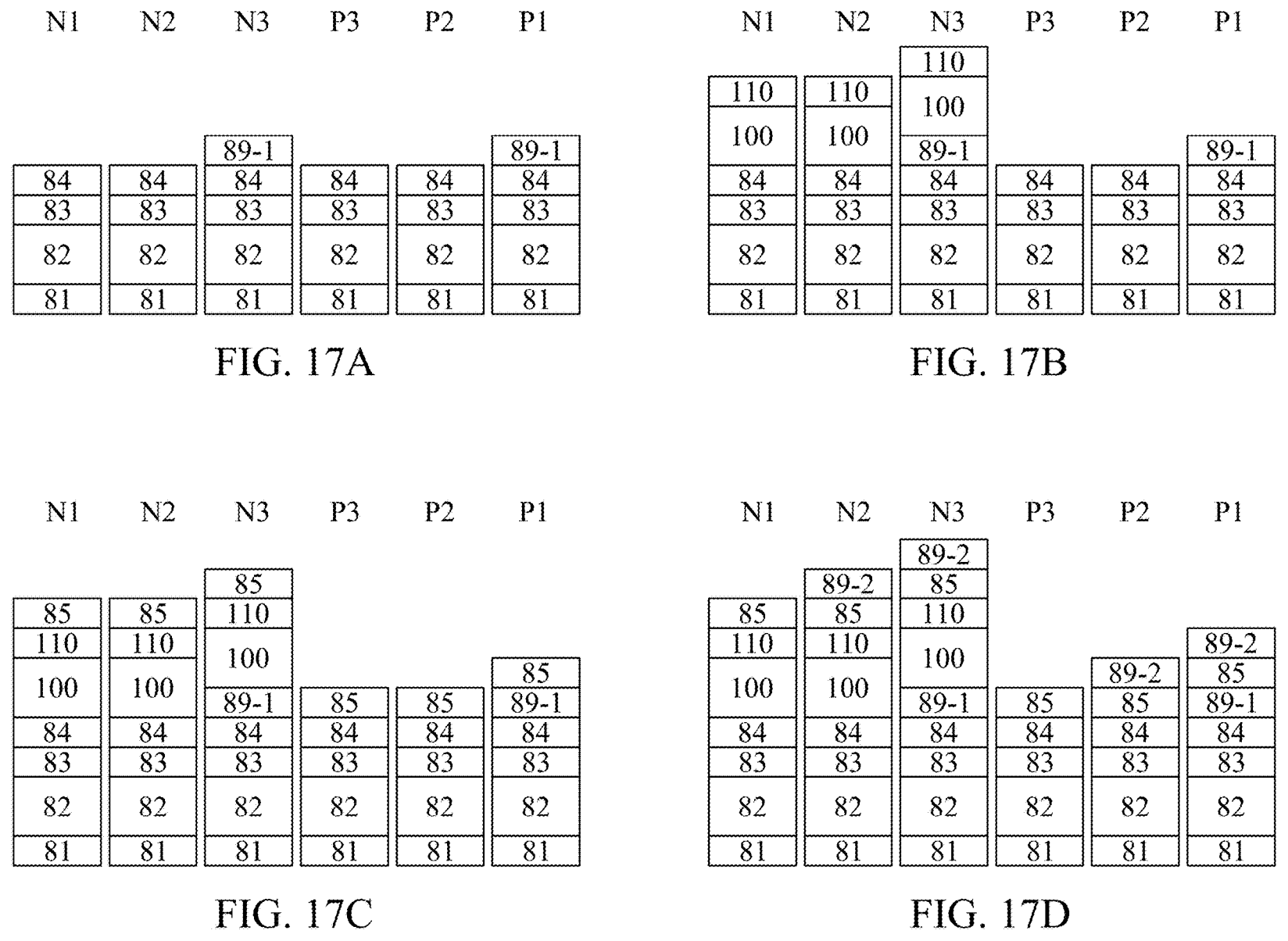

At S807 of FIG. 16, a blanket layer of a first p-type WFM layer 89-1 is formed on the first barrier layer 84. Then, at S808 of FIG. 16, a first patterning operation is performed to remove the first p-type WFM layer 89-1 from the regions for the first and second n-type FETs N1, N2 and the regions for the second and third p-type FETs P2, P3, as shown in FIG. 17A. The first patterning operation is similar to the second patterning operation as explained with respect to FIGS. 9B-10A.

At S809 of FIG. 16, a first n-type WFM layer 100 is formed on the second barrier layer 85, and at S810 of FIG. 16, a first shield layer 110 is formed on the first n-type WFM layer 100. At S811 of FIG. 16, a second patterning operation is performed to remove the first shield layer 110 and the first n-type WFM layer 100 from the regions for the first, second and third p-type FETs P1, P2, P3, as shown in FIG. 17B. The second patterning operation is similar to the first patterning operation as explained with respect to FIGS. 7D-8C.

At S812, a blanket layer of a second barrier layer 85 is formed on the first shield layer 110 at the regions for the first, second and third n-type FETs N1, N2, N3, on the first barrier layer 84 at the regions for the second and third p-type FETs P2, P3, and on the first p-type WFM layer 89-1 at the region for the first p-type FET P1, as shown in FIG. 17C.

Subsequently, a blanket layer of a second p-type WFM layer 89-2 is formed on the second barrier layer 85 at S813 of FIG. 16. Then, at S814 of FIG. 13, a third patterning operation is performed to remove the second p-type WFM layer 89-2 from the regions for the first n-type FET N1 and the third p-type FETs P3, as shown in FIG. 17D. The third patterning operation is similar to the third patterning operation as explained with respect to FIGS. 10C-11B.

At S815 of FIG. 16, a glue layer 87 is formed on the second barrier layer at the regions for the first n-type FET N1 and the third p-type FET P3, on the second p-type WFM layer 89-2 at the regions for the second and third n-type FETs N2, N3 and the first and second p-type FETs P1, P2, similar to the operation of S617 of FIG. 6, and at S816 of FIG. 16, a body metal layer 88 is formed on the glue layer 87, similar to S618 of FIG. 6 to obtain the structure shown in FIG. 15.

FIG. 18 shows a cross section view of gate structures for FETs with different threshold voltages according to another embodiment of the present disclosure. In some embodiments, similar to the embodiment of FIGS. 4, 12 and 15, a semiconductor device includes a first n-type FET N1, a second n-type FET N2, a third n-type FET N3, a first p-type FET P1, a second p-type FET P2 and a third p-type FET P3.

A threshold voltage of the first n-type FET N1 is smaller in an absolute value than a threshold voltage of the second n-type FET N2 and the threshold voltage of the second n-type FET N2 is smaller in an absolute value than a threshold voltage of the third n-type FET N3. Similarly, a threshold voltage of the first n-type FET P1 is smaller in an absolute value than a threshold voltage of the second p-type FET P2 and the threshold voltage of the second p-type FET P2 is smaller in an absolute value than a threshold voltage of the third p-type FET P3. Although FIG. 18 (and FIG. 19) shows the protected n-type WFM layer explained with respect to FIG. 5A, any structure shown in FIGS. 5A-5J can be used as the protected n-type WFM layer.

In some embodiments, the gate structure of the first n-type FET N1 includes, closer to a channel region 20, an interfacial layer 81, a gate dielectric layer 82, a first conductive layer (a cap layer) 83, a second conductive layer (a first barrier layer) 84, a first n-type WFM layer 100, a first shield layer 110, a second n-type WFM layer 101, a second shield layer 111, a third conductive layer (a second barrier layer) 85, a glue layer 87 and a body metal layer 88, stacked in this order. In some embodiments, the gate structure of the second n-type FET N2 includes, closer to a channel region 20, an interfacial layer 81, a gate dielectric layer 82, a first conductive layer (a cap layer) 83, a second conductive layer (a first barrier layer) 84, a first n-type WFM layer 100, a first shield layer 110, a second n-type WFM layer 101, a second shield layer 111, a third conductive layer (a second barrier layer) 85, a first p-type WFM layer 89-1, a glue layer 87 and a body metal layer 88, stacked in this order. In some embodiments, the gate structure of the second n-type FET N3 includes, closer to a channel region 20, an interfacial layer 81, a gate dielectric layer 82, a first conductive layer (a cap layer) 83, a second conductive layer (a first barrier layer) 84, a second n-type WFM layer 101, a second shield layer 111, a third conductive layer (a second barrier layer) 85, a glue layer 87 and a body metal layer 88, stacked in this order. The gate structure for the first and third n-type FETs N1, N3 include no p-type WFM layer. In some embodiments, a first conductive layer (a cap layer) 83 and a second conductive layer (a first barrier layer) 84 are not present in n-type FETs N1, N2 and N3.

In some embodiments, the gate structure of the first p-type FET P1 includes, closer to a channel region 20, an interfacial layer 81, a gate dielectric layer 82, a first conductive layer (a cap layer) 83, a second conductive layer (a first barrier layer) 84, a third conductive layer (a second barrier layer) 85, a first p-type WFM layer 89-1, a glue layer 87 and a body metal layer 88, stacked in this order. In some embodiments, the gate structure of the second p-type FET P2 includes, closer to a channel region 20, an interfacial layer 81, a gate dielectric layer 82, a first conductive layer (a cap layer) 83, a second conductive layer (a first barrier layer) 84, a third conductive layer (a second barrier layer) 85, a glue layer 87 and a body metal layer 88, stacked in this order. In some embodiments, the gate structure of the third p-type FET P3 includes, closer to a channel region 20, an interfacial layer 81, a gate dielectric layer 82, a first conductive layer (a cap layer) 83, a second conductive layer (a first barrier layer) 84, a second n-type WFM layer 101, a second shield layer 111, a third conductive layer (a second barrier layer) 85, a first p-type WFM layer 89-1, a glue layer 87 and a body metal layer 88, stacked in this order. The gate structure for the second p-type FET P3 includes no WFM layer. In some embodiments, the second barrier layer 85 can function as a WFM layer. In some embodiments, a first conductive layer (a cap layer) 83 and a second conductive layer (a first barrier layer) 84 are not present in p-type FETs P1, P2 and P3.

The materials, configuration and dimensions of the layer shown in FIG. 18 are the same as those of the layers shown in FIGS. 4, 12 and 15 in some embodiments.

Figure 19:
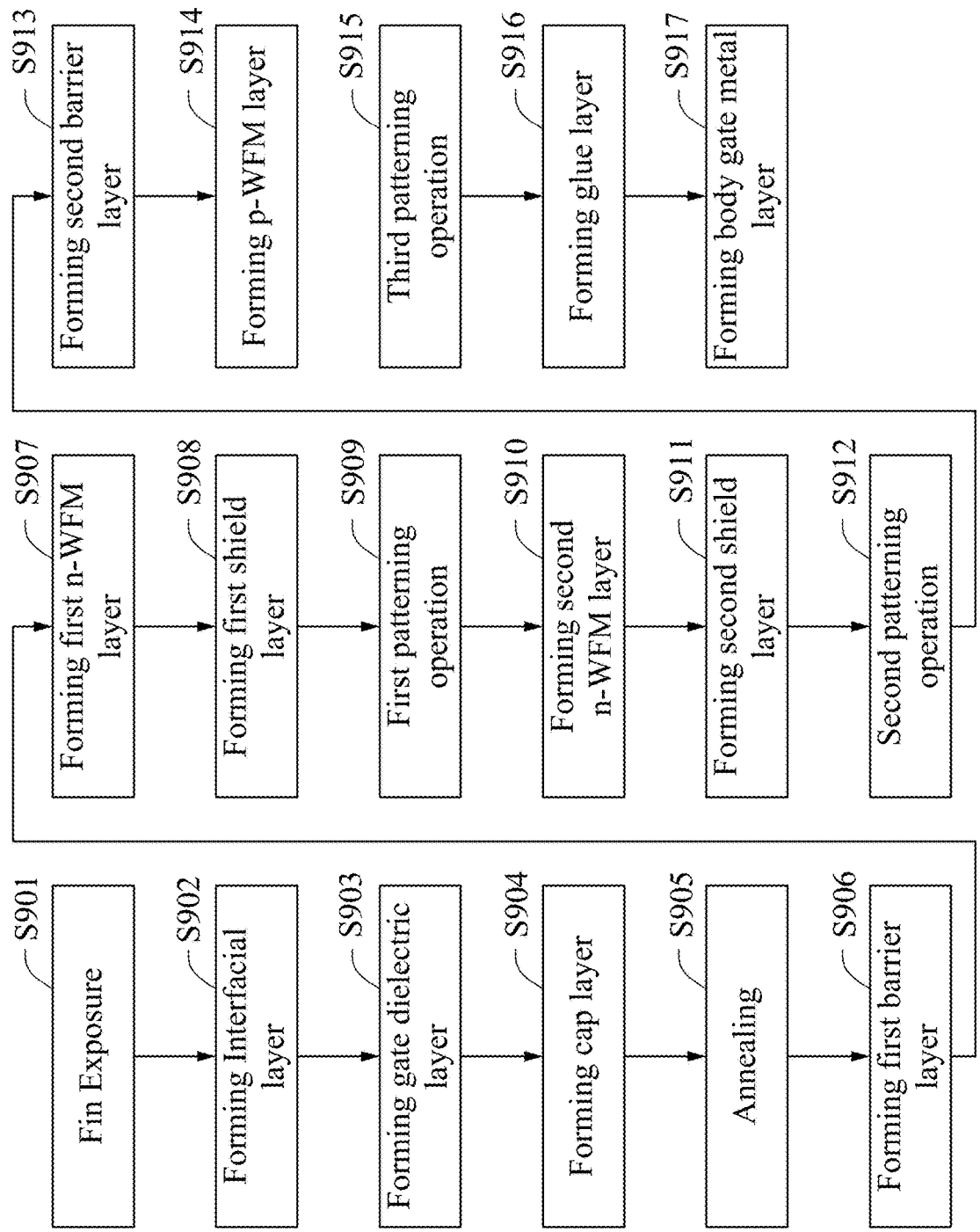
FIG. 19 shows a process flow of manufacturing a semiconductor device according to embodiments of the present disclosure.

FIG. 19 shows a process flow of various stages of manufacturing the semiconductor device shown in FIG. 18, according to embodiments of the present disclosure. It is understood that in the sequential manufacturing process, one or more additional operations can be provided before, during, and after the stages shown in FIG. 19 and some of the operations described below can be replaced or eliminated for additional embodiments of the method. The order of the operations/processes may be interchangeable. Materials, configurations, dimensions, processes and/or operations as described with respect to embodiments of FIGS. 1-17D can be employed in the following embodiments, and detailed description thereof may be omitted.

The operations of S901, S902, S903, S904, S905 and S906 of FIG. 19 are the same as the operations of S601, S602, S603, S604, S605 and S606 of FIG. 6, respectively.

Figures 20A, 20B, 20C, 20D:
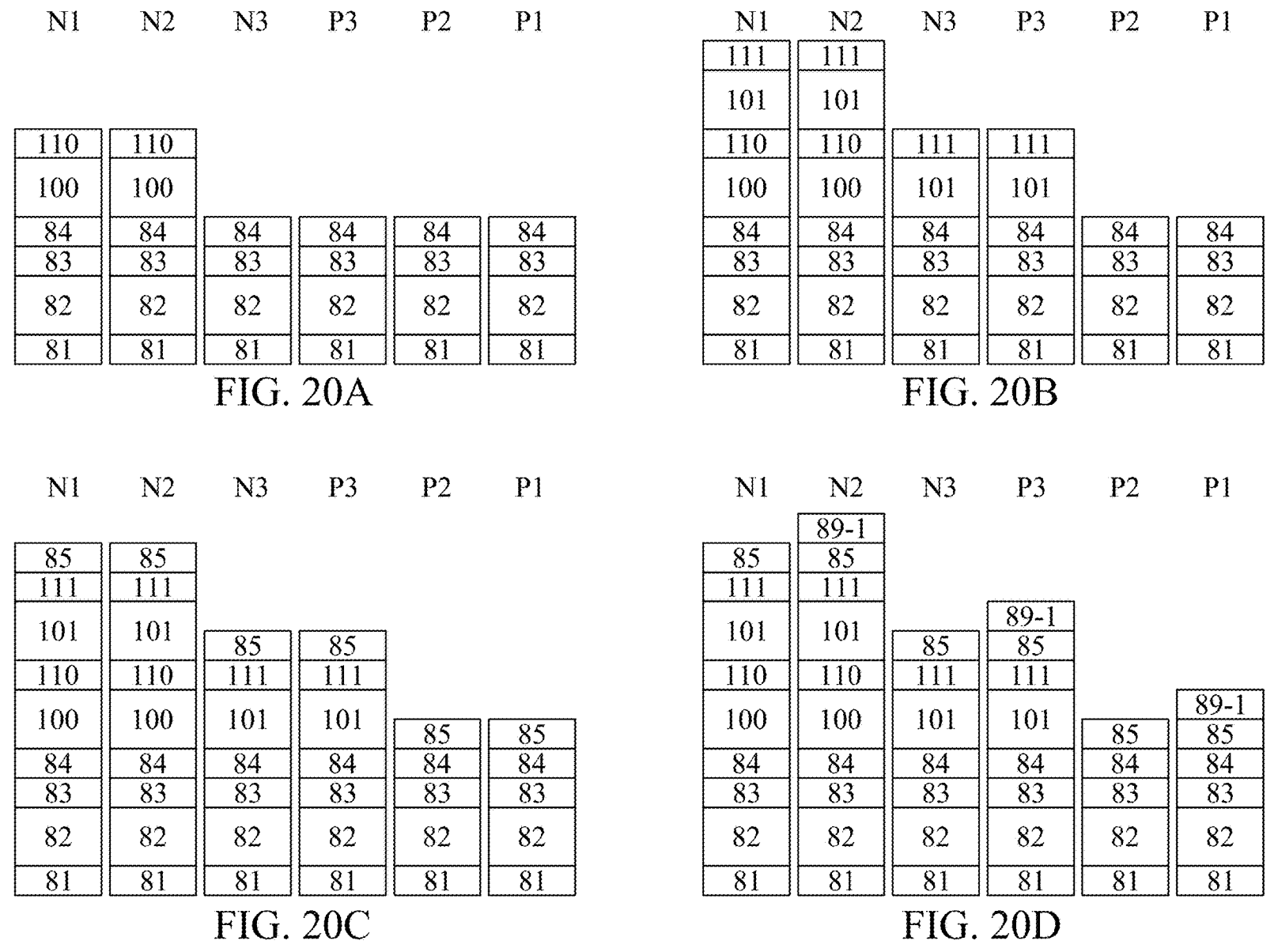

At S907 of FIG. 19, a blanket layer of a first n-type WFM layer 100 is formed on the first barrier layer 84. Then, at S908 of FIG. 19, a first shield layer 110 is formed on the first n-type WFM layer 100. At S909 of FIG. 19, a first patterning operation is performed to remove the first n-type WFM layer 100 from the regions for the third n-type FET N3 and the regions for the p-type FETs P1, P2, P3, as shown in FIG. 20A. The first patterning operation is similar to the first patterning operation as explained with respect to FIGS. 7D-8C.

At S910 of FIG. 19, a second n-type WFM layer 101 is formed on the first shield layer at the regions for the first and second n-type FETs N1, N2 and on the first barrier layer 84 at the regions for the third n-type FET N3 and the p-type FETs P1, P2, P3. At S911 of FIG. 19, a second shield layer 111 is formed on the second n-type WFM layer 101. At S912 of FIG. 19, a second patterning operation is performed to remove the second shield layer 111 and the second n-type WFM layer 101 from the regions for the second and third p-type FETs P2, P3, as shown in FIG. 20B. The second patterning operation is similar to the first patterning operation as explained with respect to FIGS. 7D-8C.

At S913, a blanket layer of a second barrier layer 85 is formed on the second shield layer 111 at the regions for the n-type FETs N1, N2, N3 and the third p-type FET P3 and on the first barrier layer 84 at the regions for the first and second p-type FETs P1, P2, as shown in FIG. 20C.

Subsequently, a blanket layer of a first p-type WFM layer 89-1 is formed on the second barrier layer 85 at S914 of FIG. 19. Then, at S915 of FIG. 13, a third patterning operation is performed to remove the first p-type WFM layer 89-1 from the regions for the first and third n-type FETs N1, N3 and the second p-type FET P2, as shown in FIG. 20D. The third patterning operation is similar to the third patterning operation as explained with respect to FIGS. 10C-11B. At S916 of FIG. 19, a glue layer 87 is formed on the second barrier layer at the regions for the first and third n-type FETs N1, N3 and the second p-type FET P2 and on the first p-type WFM layer 89-1 at the regions for the first and third p-type FETs P2, P3 similar to the operation of S617 of FIG. 6, and at S917 of FIG. 19, a body metal layer 88 is formed on the glue layer 87, similar to S618 of FIG. 6 to obtain the structure shown in FIG. 18. In the foregoing embodiments, the total number of patterning operations (formation of a bottom antireflective coating and/or a photo resist layer to removal (plasma ashing) of the bottom antireflective coating and/or a photo resist) is three to obtain three different threshold voltages for n-type FETs and three different threshold voltages for p-type FETs. When the number of the different threshold voltages of the n-type FETs is N, and the number of the different threshold voltages of the p-type FETs is M, the total number of patterning operations is equal to (N+M)/2 in some embodiments of the present disclosure, wherein N is a natural number at least two and M is a natural number at least two. A total number of n-type WFM layers and p-type WFM layers is equal to (N+M)/2 in some embodiments. A number of n-type WFM layers is Y, wherein Y is less than N (Y<N) and a number of the p-type WFM layers is X, wherein X<M−Y. In some embodiments, N is three, M is three, Y is one and X is two. In other embodiments, N is three, M is three, Y is two and X is one.

In some embodiments, a patterning operation of at least one of the n-type WFM layers is performed simultaneously with a patterning operation of at least one of the p-type WFM layers (i.e., simultaneously patterning both n-type WFM layer and p-type WFM layer).

Figures 21A, 21B:
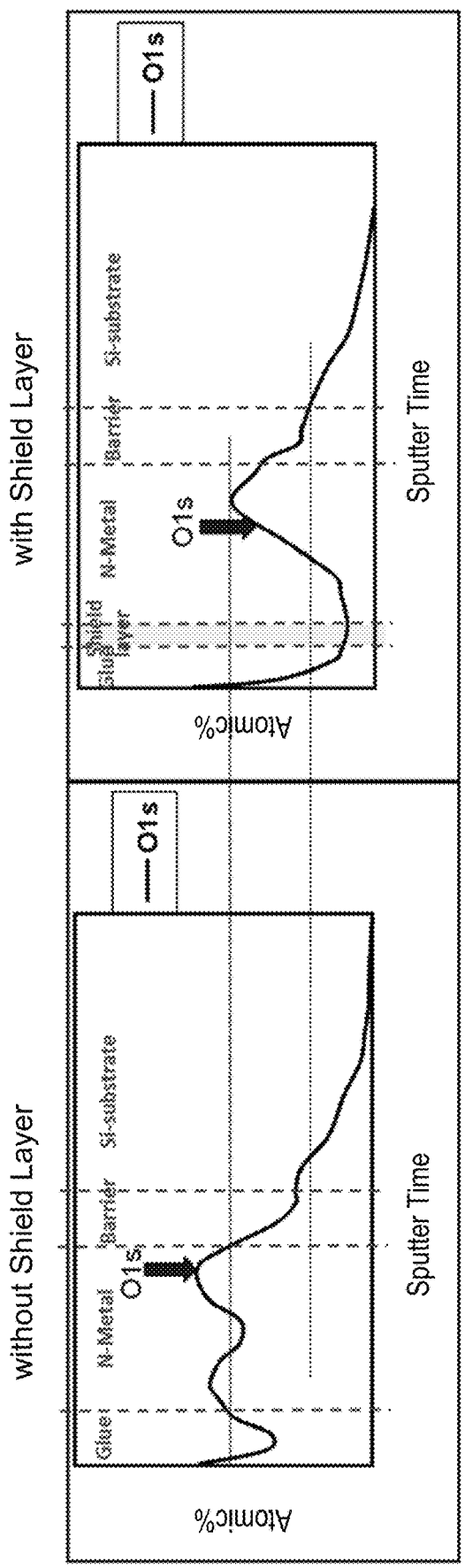
FIGS. 21A and 21B show element analysis results along a depth direction of gate structures.

FIGS. 21A and 21B show element analysis results along a depth direction of gate structures by using X-ray photoelectron spectroscopy. In FIG. 21A, a sample having a barrier layer (TaN) on a substrate (Si), a n-type WFM layer (TiAl) on the barrier layer and a glue layer on the n-type WFM layer is used i.e. without any shield layer, and in FIG. 21B, a sample having a barrier layer (TaN) on a substrate (Si), a n-type WFM layer (TiAl) together with gradient Ti rich bottom layer as a third shield layer 145 on the barrier layer, a shield layer (TiN) 110 on the n-type WFM layer and a glue layer on the shield layer is used.

As shown in FIGS. 21A and 21B, an oxidation of the n-type WFM layer (TiAl layer) was suppressed by using the shield layer. In some embodiments, the oxygen concentration at a surface of the TiAl layer is about 4 atomic % in FIG. 21B, while the oxygen concentration at a surface of the TiAl layer is about 28 atomic % in FIG. 21A. In some embodiments, the highest oxygen concentration of the TiAl layer is about 24 atomic % in FIG. 21B, while the highest oxygen concentration the TiAl layer is about 30 atomic % in FIG. 21A. The shield layers also offer partial protection to the underlying barrier layer, the cap layer (not shown) and/or, the Si substrate. In some embodiments, the total oxygen amount in the TiAl layer is about 26 atomic % to about 68 atomic % without the shield layer, while the total oxygen amount in the TiAl layer is about 1.5 atomic % to about 22 atomic %. Thicker shield films offer better protection, and in-situ films offer better protection.

FIGS. 22A, 22B, 22C, 22D, 22E and 22F show XPS (x-ray photo electron spectroscopy) spectrums of aluminum 2p orbital, carbon is orbital and fluorine is orbital peaks from an n-type WFM layer according to embodiments of the present disclosure. FIGS. 22A-22C show results for a sample having a TiN shield layer on a TiAl layer and FIGS. 22D-22F show results for a sample having a TaN shield layer on a TiAl layer. In FIGS. 22A-22F, solid lines show intensities before a patterning operation and broken lines show intensities after the patterning operation.

As shown in FIGS. 22A and 22D, the use of the shield layer could reduce oxidation of and/or oxygen contamination to the TiAl layer. In particular, for the sample with the shield layer, the amount of oxygen was significantly reduced after the patterning operation compared with the sample having no shield layer. Similarly, as shown in FIGS. 22B and 22C, the use of the shield layer could reduce carbon contamination to the TiAl layer. In particular, for the sample with the shield layer, the carbon contamination was significantly suppressed after the patterning operation compared with the sample having no shield layer. As shown in FIGS. 22C and 22F, the use of the shield layer could also reduce fluorine contamination to the TiAl layer, when a fluorine containing gas was used in the plasma etching, ashing during the patterning operation. In particular, for the sample with the shield layer, the fluorine contamination was significantly suppressed after the patterning operation, compared with the sample having no shield layer.

Figure 23B:
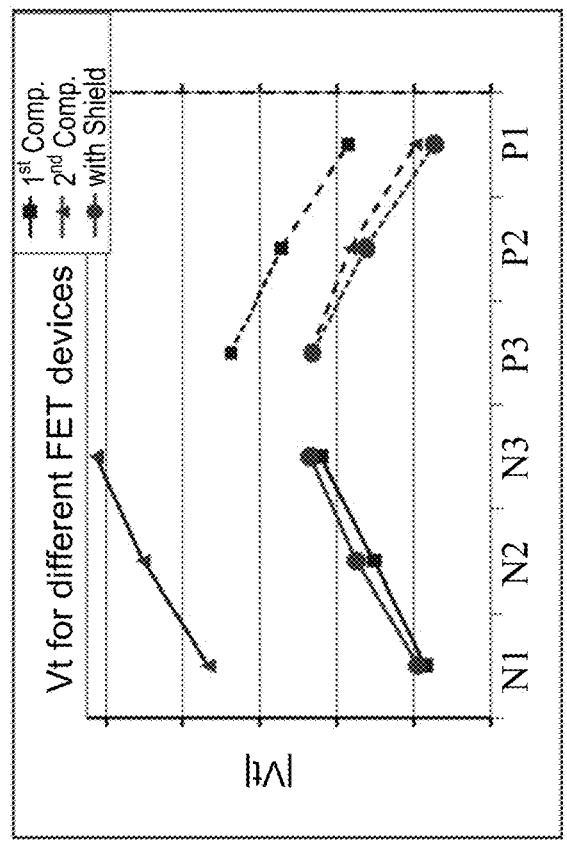
FIGS. 23A and 23B shows effects of the shield layers according to embodiments of the present disclosure.
Figure 23A:
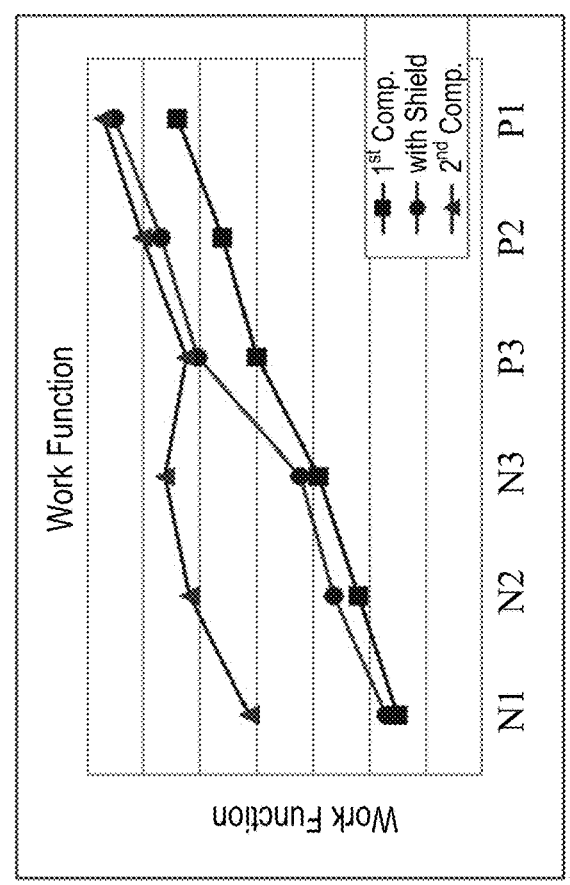

FIGS. 23A and 23B shows the advantages of the shield layers according to embodiments of the present disclosure. FIG. 23A shows work functions of first, second, third n-type FETs and first, second and third p-type FETs, and FIG. 23B shows threshold voltages of the first, second, third n-type FETs and the first, second and third p-type FETs, as set forth above.

As set forth above, a threshold voltage of the first n-type FET N1 is smaller in an absolute value than a threshold voltage of the second n-type FET N2 and the threshold voltage of the second n-type FET N2 is smaller in an absolute value than a threshold voltage of the third n-type FET N3. Similarly, a threshold voltage of the first n-type FET P1 is smaller in an absolute value than a threshold voltage of the second p-type FET P2 and the threshold voltage of the second p-type FET P2 is smaller in an absolute value than a threshold voltage of the third p-type FET P3.

In FIGS. 23A and 23B, squares represent first comparative structures, in which p-type and n-type WFM layers are blanket formed over all FET regions, and every time a WFM layer is formed, a part of the WFM layer over one or more FET regions that do not require the WFM layer is removed. For example, in n-type FET N1, one n-type WFM layer is disposed on the first barrier layer 84; in n-type FET N2, one p-type WFM layer and one n-type WFM layer are disposed on the first barrier layer 84; in n-type FET N3, two p-type WFM layers and one n-type WFM layer are disposed on the first barrier layer 84; in p-type FET P3, three p-type WFM layers and one n-type WFM layer are disposed on the first barrier layer 84; in p-type FET P2, four p-type WFM layers and one n-type WFM layer are disposed on the first barrier layer 84; and in p-type FET P1, five p-type WFM layers and one n-type WFM layer are disposed on the first barrier layer 84. In the second comparative structures, three WFM layers are deposited and three patterning operations are performed. Further, threshold voltages (in absolute value) of p-type FETs becomes higher than that of n-type FETs due to a gap fill issue in a narrow gate space.

In FIGS. 23A and 23B, triangles represent second comparative structures without a shield layer, in which n-type-WFM layer is once formed over and then removed from p-type FETS P1, P2 and P3 during the manufacturing process. The second comparative examples are similar to the forgoing embodiments except for the use of a shield layer. As set forth above, n-type WF layer is removed from the p-type FETs, which can decrease the number of WFM layers and patterning operations. The removal of the n-type WFM layer from p-type FETs causes an increase in effective work function and a decrease in threshold voltages of p-type FETs. However, since there is no shield layer, the n-type WFM layer (e.g., TiAl) on n-type FETs is severely damaged during patterning processes. For example, during the patterning of N-WFM layer TiAl to selectively remove it from p-type FETs, the TiAl layer on n-type FETs is oxidized, damaged and/or contaminated with O, C, N and/or F, which increases its work function and/or flat band voltage, thereby increasing threshold voltage of n-type FETs.

In FIGS. 23A and 23B, circles represents the structures of the present embodiments (e.g., FIG. 5A) with a shield layer on the n-type WFM layer, in which n-type-WFM layer is once formed over and then removed from p-type FETS P1, P2 and P3 during the manufacturing process. In contrast to the comparative structures, when the shield layer is used to protect the n-type WFM layer, the damage to the n-type WFM (TiAl) layer from the patterning processes is suppressed (as indicated by less O, C, F, and N peaks as shown in FIG. 22A-22F), and thus, low work function of the n-type WFM layer and low flat band voltage can be maintained, which results in a low NMOS threshold voltage. Further, well-balanced NMOS and PMOS threshold voltages can be achieved.

FIG. 24 shows a cross section view of a semiconductor device according to an embodiment of the present disclosure. In some embodiments, a first conductive layer (cap layer) 83 is removed after the annealing operation and a first barrier layer 84 is not formed in the gate structures. Thus, the gate structures for the first to third n-type and p-type FETs have the structure as shown in FIG. 24, when the manufacturing operations explained with respect to FIG. 4 are employed by removing cap layer 83 using wet etching and by skipping formation of first barrier layer 84. In such a case, the n-type WFM layer 100 is directly formed on the gate dielectric layer 82 and the gate dielectric layer 82 acts as a wet etch stop layer during patterning operations.

Figure 25:
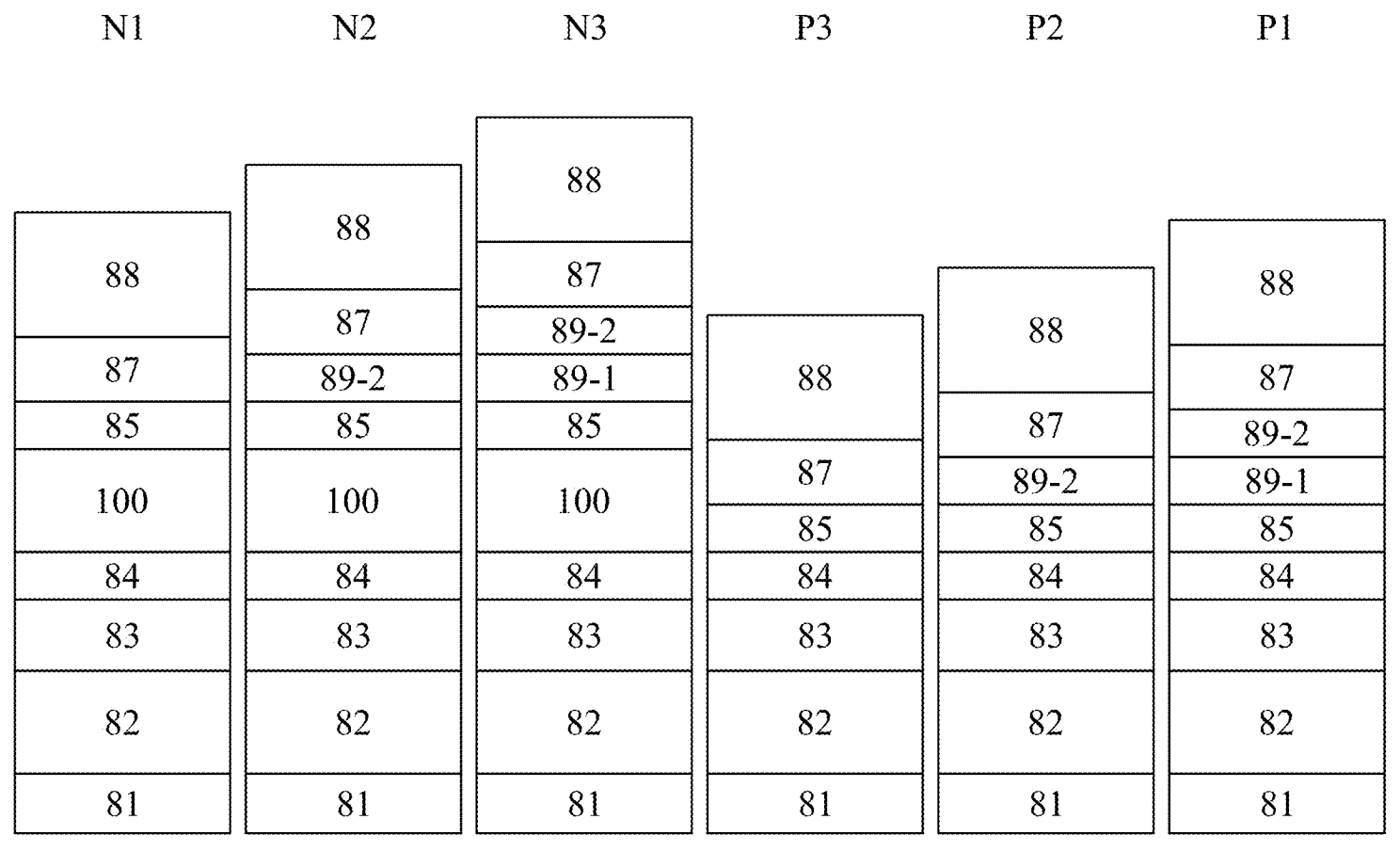

FIG. 25 shows a cross section view of a semiconductor device according to an embodiment of the present disclosure. In some embodiments, after the patterning operations of the first shield layer 110 (and 111) and the first n-type WFM layer 100 (and 101), the first shield layer 110 (and/or 115, 120, 125, 130) is removed. Thus, the gate structures for the first to third n-type and p-type FETs have the structure as shown in FIG. 24, when the manufacturing operations explained with respect to FIG. 4 are employed. When the shield layer is removed, the shield layer is made of not only the materials as set forth above (generally conductive material or layer) but also a dielectric material, such as silicon oxide, silicon nitride, aluminum oxide, aluminum nitride, hafnium oxide or any other suitable dielectric material that can be removed selective to the n-type WFM layer.

Figure 26A:
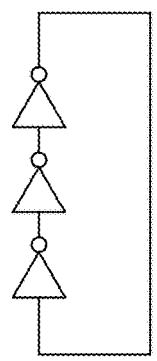
FIG. 26A shows a circuit diagram of a ring oscillator.
Figure 26B:
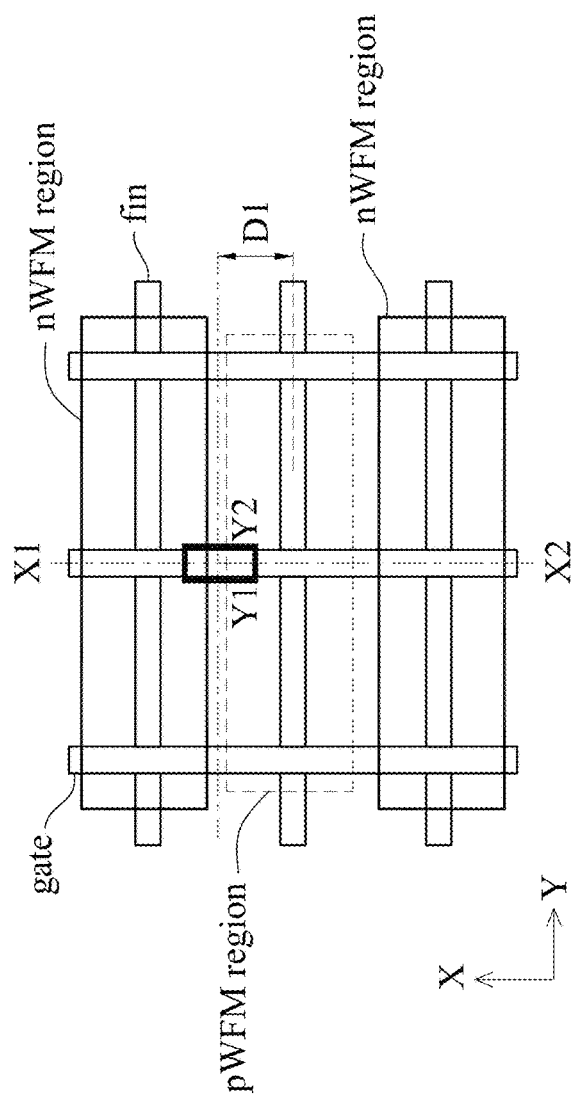
FIG. 26B shows a layout of the ring oscillator.
Figure 26C:
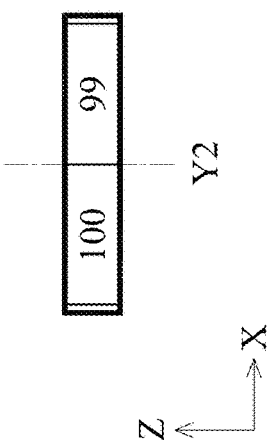
FIG. 26C shows a cross sectional view along line X1-X2 of FIG. 26B according to embodiments of the present disclosure.
Figure 26D:
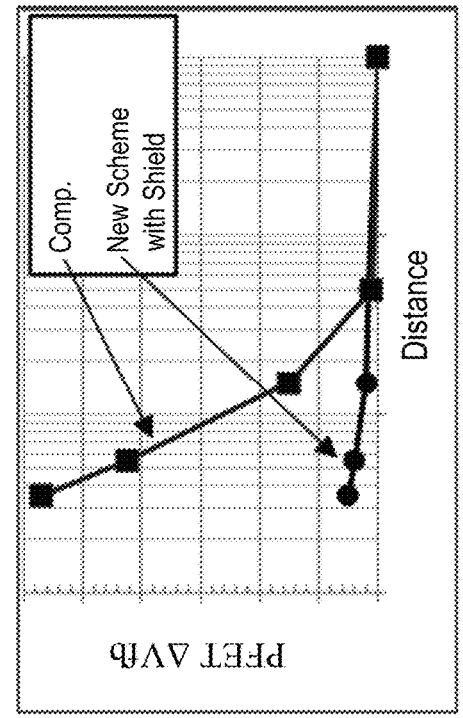
FIG. 26D shows Vfb shift of a p-type FET device with respect to a distance from a nearby n-type FET device, as shown in FIG. 26B.

FIG. 26A shows a circuit diagram of a ring oscillator, FIG. 26B shows a layout of the ring oscillator, and FIG. 26C shows a cross sectional view along line X1-X2 of FIG. 26B according to embodiments of the present disclosure. In some embodiments, inverters of the ring oscillator are formed by the third n-type FET having a highest threshold voltage (in an absolute value) in the n-type FET and the third p-type FET having a highest threshold voltage (in an absolute value) in the p-type FET. In the inverter, the n-type FET and the p-type FET are arranged close to each other as shown in FIG. 23B. As shown in FIGS. 4, 12, 15 and 18, the n-type WFM containing Al for the third n-type FET N3 is located at a different vertical level than a p-type WFM layer for the third p-type FET P3. In the foregoing embodiments, the n-type WFM layer of third n-type FET N3 is never in direct contact with the p-type WFM layer of third p-type FET P3. In FIG. 4, the n-type WFM layer of the third n-type FET N3 is disposed at the same level as the second barrier layer 85 and a glue layer 87. In FIG. 12, the n-type WFM layer of the third n-type FET N3 is disposed at the same level as the body metal layer 88 of the third p-type FET P3. In FIG. 15, the n-type WFM layer of the third n-type FET N3 is disposed at the same level as the glue layer 87 and the body metal layer 88 of the third p-type FET P3. In FIG. 18, the n-type WFM layer of the third n-type FET N3 is disposed at the same level as the n-type WFM layer of the third p-type FET P3. When the n-type WFM layer contains Al, aluminum may diffuse to the adjacent FET, and when the adjacent FET includes a p-type WFM layer at the same level as the n-type WFM layer, the diffused aluminum into the p-type WFM layer causes a change of work function (e.g., a decrease in work function of p-type WFM layer) thereby degrading the threshold voltage of n-type FET and more particularly degrading the threshold voltage of p-type FET device. In the case of an inverter of a ring oscillator, at the metal boundary along line Y1-Y2 (i.e., at the interface of n-FET and p-FET), a layer 99 of the p-type FET is in direct contact with a layer 100 of n-type FET. Since the layer 99 of p-type FET between two n-type FETs is different from a p-type WFM layer, thus no Al diffusion issues occurs and/or the Al diffusion from 100 of n-type FET into layer 99 of p-type FET does not degrade the work function of p-type WFM layers, thereby avoiding any damage to p-FET threshold voltage, even if the distance D1 is small. FIG. 26D shows Vfb shift of a p-type FET device with respect to a distance D1 from a nearby n-type FET device, as shown in FIG. 26B.

Figure 27B:
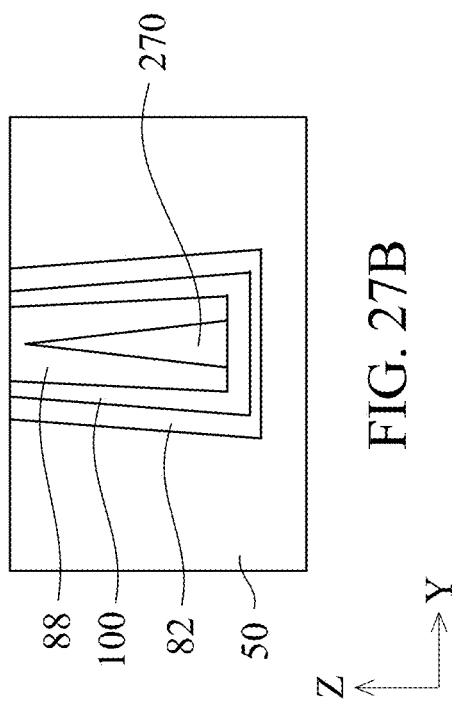
FIG. 27B shows a seam void defect without a shield layer.
Figure 27C:
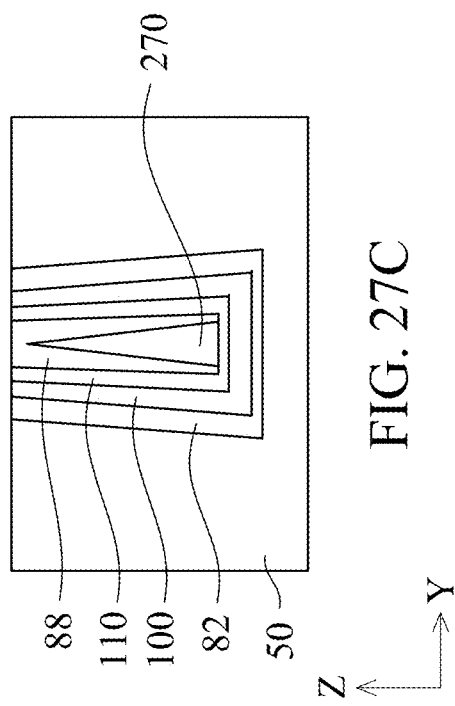
FIG. 27C shows a seam void defect with a shield layer.
Figure 27A:
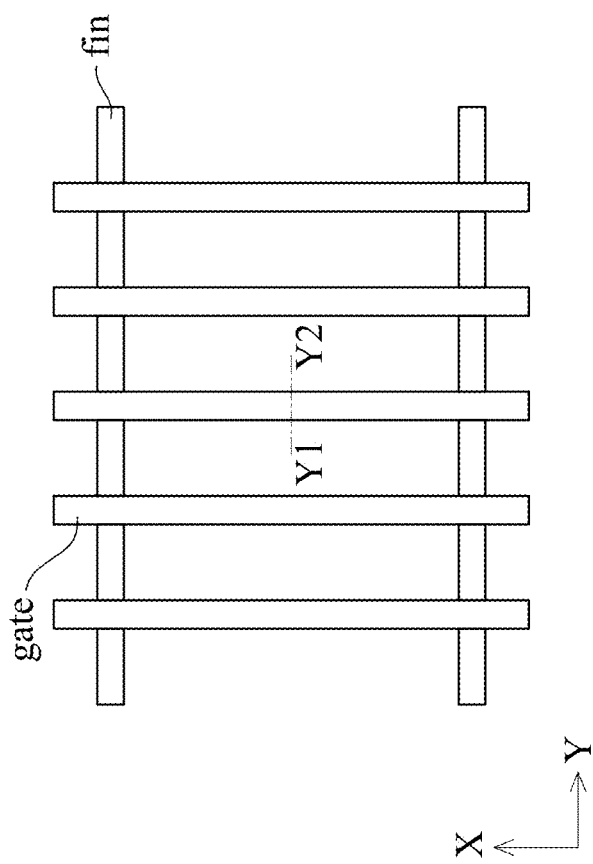
FIG. 27A shows a gate cut process.
Figure 27D:
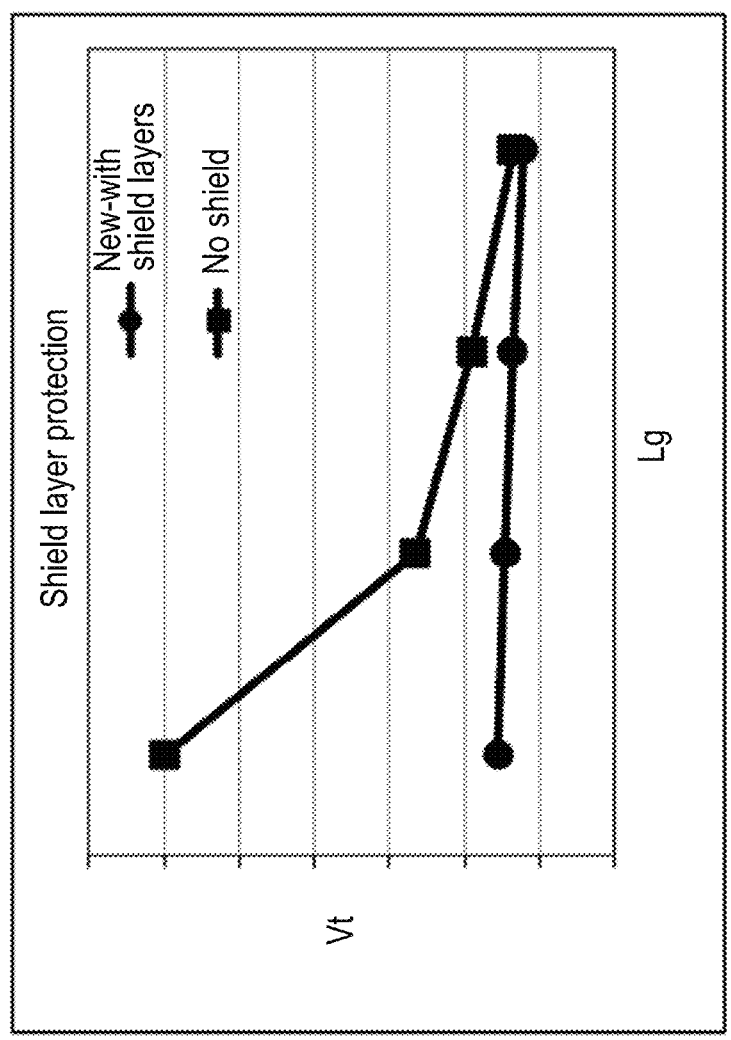
FIG. 27D shows damage protection effect of the shield layer.

FIG. 27A shows a gate cut process, FIG. 27B shows a seam void defect without a shield layer, FIG. 27C shows a seam void defect with a shield layer, and FIG. 27D shows damage protection effect of the shield layer. In some embodiments, after metal gate structures are formed, one or more metal gate structures are cut into pieces based on circuit design. When the gate space in the Y direction is small (for small gate length devices), the glue layer 87 and/or the body metal layer 88 may not fully fill the gate space, forming void or seam 270, as shown in FIGS. 27B and 27C. During the metal gate cut process at the region CMG, the void 270 is exposed to the gases for metal gate cut process. The gases includes one or more of $O_2$, $CF_4$, $C_2F_6$, $Cl_2$ and $BCl_3$. When no shield layer is used as shown in FIG. 27B, the first n-type WFM layer 100 is exposed in the void 270 and may be damaged by the gases. In contrast, then a shield layer 110 is used as shown in FIG. 27C, the first n-type WFM layer 100 is protected from the gases. As shown in FIG. 27D, even though the channel length Lg become smaller, which means a smaller gate space, the threshold voltage is maintained when a shield layer is used.

It will be understood that not all advantages have been necessarily discussed herein, no particular advantage is required for all embodiments or examples, and other embodiments or examples may offer different advantages.

In accordance with one aspect of the present disclosure, a semiconductor device includes a gate structure disposed over a channel region, and a source/drain region. The gate structure includes a gate dielectric layer over the channel region, a first work function adjustment layer over the gate dielectric layer, a first shield layer over the first work function adjustment layer, a first barrier layer, and a metal gate electrode layer. The first work function adjustment layer includes aluminum. The first shield layer is made of at least one selected from the group consisting of metal, metal nitride, metal carbide, silicide, a layer containing one or more of F, Ga, In, Zr, Mn and Sn, and an aluminum containing layer having a lower aluminum concentration than the first work function adjustment layer. In one or more of the foregoing and following embodiments, the first work function adjustment layer is made of one selected the group consisting of TiAl, TiAlC, TaAl, TaAlC and TiAlN. In one or more of the foregoing and following embodiments, the first work function adjustment layer is a N-type WFM adjustment layer, which is composed of materials having low work function in a range from 2.5 eV to 4.4 eV and/or having low electronegativity. In one or more of the foregoing and following embodiments, the first shield layer is made of at least one selected from the group consisting of TiN, TaN, TaTiN, WN, TiSiN, WCN and MoN. In one or more of the foregoing and following embodiments, the first shield layer is made of at least one selected from the group consisting of Si, Cr, Mo and Co. In one or more of the foregoing and following embodiments, the first shield layer is made of carbide of at least one selected from the group consisting of Si, Ti, Ta, Cr, Mo and Co. In one or more of the foregoing and following embodiments, the first shield layer is made of silicide of at least one selected from the group consisting of Ti, Ta, Ni, W and Mo. In one or more of the foregoing and following embodiments, an aluminum content of the first work function adjustment layer is 67 atomic % to 86 atomic %, and an aluminum content of the first shield layer is 30 atomic % to 55 atomic %. In one or more of the foregoing and following embodiments, the first shield layer is a surface treated layer of first work function adjustment layer and includes one or more of F, Ga, In, Zr, Mn and Sn formed by one of chemical conversion reaction, by ion implantation. In one or more of the foregoing and following embodiments, the metal gate electrode layer includes a glue layer and a body metal layer. In one or more of the foregoing and following embodiments, the semiconductor device further includes a second shield layer disposed under the first work function adjustment layer or over the first shield layer. In one or more of the foregoing and following embodiments, the semiconductor device further includes a second work function adjustment layer made of a different material than the first work function adjustment layer and having a relatively higher work function than the first work function adjustment layer. In one or more of the foregoing and following embodiments, the second work function adjustment layer is a p-type work function adjustment layer, which is composed of materials having high work functions in a range from 4.3 eV to 5.8 eV and/or having high electronegativity. In one or more of the foregoing and following embodiments, the semiconductor device further includes a third work function adjustment layer made of a different material than the first work function adjustment layer and having a relatively higher work function than the first work function adjustment layer. In one or more of the foregoing and following embodiments, the third work function adjustment layer is a p-type work function adjustment layer, which is composed of materials having high work functions in a range from 4.3 eV to 5.8 eV and/or having high electronegativity. In one or more of the foregoing and following embodiments, the p-type WF adjustment layer is made of one of TiN, WN, WCN, MoN and TaN. The first work function adjustment layer is located between the second work function adjustment layer and the third work function adjustment layer. In one or more of the foregoing and following embodiments, the semiconductor device further includes a cap layer disposed over the gate dielectric layer, and a second barrier layer disposed on the cap layer. In one or more of the foregoing and following embodiments, the semiconductor device further includes a second work function adjustment layer including aluminum, and disposed over the first shield layer, and a second shield layer disposed on the second work function adjustment layer.

In accordance with another aspect of the present disclosure, a semiconductor device includes a first field effect transistor (FET) including a first gate structure disposed over a first channel region and a second FET including a second gate structure disposed over a second channel region. A threshold voltage of the first FET is smaller, in an absolute value, than a threshold voltage of the second FET. Each of the first and second gate structures includes a gate dielectric layer, a first work function adjustment layer over the gate dielectric layer, a first shield layer over the first work function adjustment layer, a first barrier layer, and a metal gate electrode layer. The first work function adjustment layer includes aluminum. The first shield layer is made of at least one selected from the group consisting of metal, metal nitride, metal carbide, silicide, a layer containing one or more of F, Ga, In, Zr, Mn and Sn, and an aluminum containing layer having a lower aluminum concentration than the first work function adjustment layer. The second gate structure further includes a second work function adjustment layer made of a different material than the first work function adjustment layer, and the first gate structure includes no second work function adjustment layer. In one or more of the foregoing and following embodiments, in the second gate structure, the second work function adjustment layer is separated from the first work function adjustment layer by the first barrier layer. In one or more of the foregoing and following embodiments, the first barrier layer is disposed over the first shield layer, and the second work function adjustment layer of the second gate structure is disposed over the first barrier layer. In one or more of the foregoing and following embodiments, the second gate structure further includes a third work function adjustment layer made of a different material than the first work function adjustment layer and disposed under the first work function adjustment layer. In one or more of the foregoing and following embodiments, the first barrier layer is disposed under the first work function adjustment layer, and the second work function adjustment layer of the second gate structure is disposed under the first barrier layer. In one or more of the foregoing and following embodiments, each of the first and second gate structures further includes a third work function adjustment layer including aluminum disposed over the first shield layer, and a second shield layer disposed over the third work function adjustment layer. In one or more of the foregoing and following embodiments, the first gate structure further includes a third work function adjustment layer including aluminum, and a second shield layer disposed over the third work function adjustment layer. The second gate structure includes no third work function adjustment layer and no second shield layer. In one or more of the foregoing and following embodiments, the first work function adjustment layer is made of one selected the group consisting of TiAl, TiAlC, TaAl, TaAlC and TiAlN. In one or more of the foregoing and following embodiments, the first work function adjustment layer is an n-type work function adjustment layer, which is composed of materials having low work function in a range from 2.5 eV to 4.4 eV and/or having low electronegativity. In one or more of the foregoing and following embodiments, the first shield layer is made of at least one selected from the group consisting of TiN, TaN, TaTiN, WN, TiSiN, WCN and MoN. In one or more of the foregoing and following embodiments, the first shield layer is made of at least one selected from the group consisting of Si, Cr, Mo and Co. In one or more of the foregoing and following embodiments, the first shield layer is made of carbide of at least one selected from the group consisting of Si, Ti, Ta, Cr, Mo and Co. In one or more of the foregoing and following embodiments, the first shield layer is made of silicide of at least one selected from the group consisting of Ti, Ta, Ni, W and Mo. In one or more of the foregoing and following embodiments, an aluminum content of the first work function adjustment layer is 67 atomic % to 86 atomic %, and an aluminum content of the first shield layer is 30 atomic % to 55 atomic %. In one or more of the foregoing and following embodiments, the first shield layer is a surface layer of first work function adjustment layer and includes one or more of F, Ga, In, Zr, Mn and Sn. In one or more of the foregoing and following embodiments, the metal gate electrode layer includes a glue layer and a body metal layer.

In accordance with another aspect of the present disclosure, a semiconductor device includes a first field effect transistor including a first gate structure disposed over a first channel region, a second FET including a second gate structure disposed over a second channel region, and a third FET including a third gate structure disposed over a third channel region. A threshold voltage of the first FET is smaller, in an absolute value, than a threshold voltage of the second FET, and the threshold voltage of the second FET is smaller, in an absolute value, than a threshold voltage of the third FET. each of the first, second and third gate structures includes a first gate dielectric layer, a first work function adjustment layer over the first gate dielectric layer, a first shield layer over the first work function adjustment layer, a first barrier layer, and a metal gate electrode layer. The first work function adjustment layer includes aluminum. The first shield layer is made of at least one selected from the group consisting of metal, metal nitride, metal carbide, silicide, a layer containing one or more of F, Ga, In, Zr, Mn and Sn, and an aluminum containing layer having a lower aluminum concentration than the first work function adjustment layer. The third gate structures further include a second work function adjustment layer made of a different material than the first work function adjustment layer, and the first and second gate structures includes no second work function adjustment layer. In one or more of the foregoing and following embodiments, the second and third gate structure further includes a third work function adjustment layer made of a different material than the first work function adjustment layer, and the first gate structures includes no third work function adjustment layer. In one or more of the foregoing and following embodiments, the second work function adjustment layer is disposed under the first work function adjustment layer. In one or more of the foregoing and following embodiments, a thickness of the second and third work function adjustment layer in the third gate structure is greater than a thickness of the third work function adjustment layer in the second gate structure. In one or more of the foregoing and following embodiments, in the second and third gate structures, the third work function adjustment layer is separated from the first work function adjustment layer by the first barrier layer. In one or more of the foregoing and following embodiments, the first barrier layer is disposed over the first shield layer, and the third work function adjustment layer of the second gate structure is disposed over the first barrier layer. In one or more of the foregoing and following embodiments, the first barrier layer is disposed under the first work function adjustment layer, and the third work function adjustment layer of the second and third gate structures is disposed under the first barrier layer. In one or more of the foregoing and following embodiments, the first work function adjustment layer is made of one selected the group consisting of TiAl, TiAlC, TaAl, TaAlC and TiAlN. In one or more of the foregoing and following embodiments, the first shield layer is made of at least one selected from the group consisting of TiN, TaN, TaTiN, WN, TiSiN, WCN and MoN. In one or more of the foregoing and following embodiments, the first shield layer is made of at least one selected from the group consisting of Si, Cr, Mo and Co. In one or more of the foregoing and following embodiments, the first shield layer is made of carbide of at least one selected from the group consisting of Si, Ti, Ta, Cr, Mo and Co. In one or more of the foregoing and following embodiments, the first shield layer is made of silicide of at least one selected from the group consisting of Ti, Ta, Ni, W and Mo. In one or more of the foregoing and following embodiments, an aluminum content of the first work function adjustment layer is 67 atomic % to 86 atomic %, and an aluminum content of the first shield layer is 30 atomic % to 55 atomic %. In one or more of the foregoing and following embodiments, the first shield layer is a surface layer of first work function adjustment layer and includes one or more of F, Ga, In, Zr, Mn and Sn. In one or more of the foregoing and following embodiments, the metal gate electrode layer includes a glue layer and a body metal layer. In one or more of the foregoing and following embodiments, the semiconductor device further includes a fourth FET including a fourth gate structure disposed over a fourth channel region and having a different conductivity than the first, second and third FETs. The fourth gate structure includes a second gate dielectric layer over the fourth channel region, a fourth work function adjustment layer over the gate dielectric layer, a second barrier layer made of a same material as the first barrier layer, and a second metal gate electrode layer. The fourth work function adjustment layer is made of a same material as the second work function adjustment layer. In one or more of the foregoing and following embodiments, the third gate structure further include a third work function adjustment layer made of a different material than the first work function adjustment layer, and the fourth gate structure further includes a fifth work function adjustment layer made of a same material as the third work function adjustment layer. In one or more of the foregoing and following embodiments, the second barrier layer is disposed between the fourth work function adjustment layer and the fifth work function adjustment layer. In one or more of the foregoing and following embodiments, a thickness of the fourth work function adjustment layer in the fourth gate structure is equal to a thickness of the second work function adjustment layer in the third gate structure. In one or more of the foregoing and following embodiments, the second barrier layer is disposed below the fourth work function adjustment layer. In one or more of the foregoing and following embodiments, the second barrier layer is disposed over the fourth work function adjustment layer. In one or more of the foregoing and following embodiments, the semiconductor device further includes a fourth FET including a fourth gate structure disposed over a fourth channel region and having a different conductivity than the first, second and third FETs, and a fifth FET including a fifth gate structure disposed over a fifth channel region and having a different conductivity than the first, second and third FETs. A threshold voltage of the fourth FET is smaller, in an absolute value, than a threshold voltage of the fifth FET. Each of the fourth and fifth gate structure includes a second gate dielectric layer, a fourth work function adjustment layer over the gate dielectric layer, a second barrier layer made of a same material as the first barrier layer, and a second metal gate electrode layer. The fourth work function adjustment layer is made of a same material as the second work function adjustment layer. In one or more of the foregoing and following embodiments, the fourth gate structure further includes a fifth work function adjustment layer made of a different material than the first work function adjustment layer, and the fifth gate structure includes no fourth work function adjustment layer.

In one or more of the foregoing and following embodiments, the second barrier layer is disposed between the fourth work function adjustment layer and the fifth work function adjustment layer. In one or more of the foregoing and following embodiments, a thickness of the fourth and fifth work function adjustment layer in the fourth gate structure is greater than a thickness of the fifth work function adjustment layer in the fifth gate structure. In one or more of the foregoing and following embodiments, the semiconductor device further includes a fourth FET including a fourth gate structure disposed over a fourth channel region and having a different conductivity than the first, second and third FETs, a fifth FET including a fifth gate structure disposed over a fifth channel region and having a different conductivity than the first, second and third FETs, and a sixth FET including a sixth gate structure disposed over a sixth channel region and having a different conductivity than the first, second and third FETs. A threshold voltage of the fourth FET is smaller, in an absolute value, than a threshold voltage of the fifth FET, and the threshold voltage of the fifth FET is smaller, in an absolute value, than a threshold voltage of the sixth FET. Each of the fourth, fifth and sixth gate structure includes a second gate dielectric layer, a second barrier layer made of a same material as the first barrier layer, and a metal gate electrode layer. Each of the fourth and fifth gate structure includes a fifth work function adjustment layer made of a same material as the third work function adjustment layer, and the sixth gate structure includes no fourth and no fifth work function adjustment layer. In one or more of the foregoing and following embodiments, the fourth gate structure further includes a fourth work function adjustment layer made of a different material than the first work function adjustment layer, and the fifth gate structure includes no fourth work function adjustment layer. In one or more of the foregoing and following embodiments, the second barrier layer is disposed between the fourth work function adjustment layer and the fifth work function adjustment layer. In one or more of the foregoing and following embodiments, a thickness of the fourth and fifth work function adjustment layer in the fourth gate structure is greater than a thickness of the fifth work function adjustment layer in the fifth gate structure. In one or more of the foregoing and following embodiments, the first work function adjustment layer is an n-type work function adjustment layer, which is composed of materials having low work function in a range from 2.5 eV to 4.4 eV and/or having low electronegativity. In one or more of the foregoing and following embodiments, the second, third, fourth and fifth work function adjustment layer are p-type work function adjustment layers, each of which is composed of materials having high work functions in a range of 4.3 eV to 5.8 eV and/or having high electronegativity. In one or more of the foregoing and following embodiments, the p-type work function adjustment layer is made of one of TiN, WN, WCN, MoN and TaN. In one or more of the foregoing and following embodiments, the second, third, fourth and fifth work function adjustment layers are made of TiN. In one or more of the foregoing and following embodiments, a thickness of the first and second shield layer is in a range from 0.3 nm to 8 nm. In one or more of the foregoing and following embodiments, an oxygen concentration in the first work function adjustment layer is less than 25 atomic %.

In accordance with one aspect of the present disclosure, in a method of manufacturing a semiconductor device, a gate dielectric layer is formed over a channel region made of a semiconductor material, a first work function adjustment layer is formed over the gate dielectric layer, a first shield layer is formed over the first work function adjustment layer, and a metal gate electrode layer is formed over the first shield layer. The first work function adjustment layer includes aluminum, and the first shield layer is made of at least one selected from the group consisting of metal, metal nitride, metal carbide, silicide, a layer containing one or more of F, Ga, In, Zr, Mn and Sn, and an aluminum containing layer having a lower aluminum concentration than the first work function adjustment layer. In one or more of the foregoing and following embodiments, the first work function adjustment layer is made of one selected the group consisting of TiAl, TiAlC, TaAl, TaAlC and TiAlN. In one or more of the foregoing and following embodiments, the first shield layer is made of at least one selected from the group consisting of TiN, TaN, TaTiN, WN, TiSiN, WCN and MoN, formed by a deposition method. In one or more of the foregoing and following embodiments, the first shield layer is made of at least one selected from the group consisting of Si, Cr, Mo and Co, formed by a deposition method. In one or more of the foregoing and following embodiments, the first shield layer is made of carbide of at least one selected from the group consisting of Si, Ti, Ta, Cr, Mo and Co. In one or more of the foregoing and following embodiments, the first shield layer is made of silicide of at least one selected from the group consisting of Ti, Ta, Ni, W and Mo. In one or more of the foregoing and following embodiments, the first shield layer is a surface region of the first work function adjustment layer and contains F, and the first shield layer is formed by treating a surface of the first work function adjustment layer with fluorine containing material. In one or more of the foregoing and following embodiments, the first shield layer is a surface region of the first work function adjustment layer and contains one or more of Ga, In, Zr, Mn and Sn, and the first shield layer is formed by implanting ions of one or more of F, Ga, In, Zr, Mn and Sn to the surface region of the first work function adjustment layer. In one or more of the foregoing and following embodiments, the first shield layer is formed by decreasing an Al source material during formation of the first work function adjustment layer. In one or more of the foregoing and following embodiments, an aluminum content of the first work function adjustment layer is 67 atomic % to 86 atomic %, and an aluminum content of the first shield layer is 30 atomic % to 55 atomic %. In one or more of the foregoing and following embodiments, a second shield layer made of a different material than the first shield layer is formed on the first shield layer. In one or more of the foregoing and following embodiments, a third shield layer is formed before forming the first work function adjustment layer, and the first work function adjustment layer is formed on the third shield layer. In one or more of the foregoing and following embodiments, the metal gate electrode layer includes a glue layer and a body metal layer. In one or more of the foregoing and following embodiments, a first barrier layer is formed over the gate dielectric layer before the first work function adjustment layer is formed. In one or more of the foregoing and following embodiments, a second barrier layer is formed over the first shield layer. In one or more of the foregoing and following embodiments, a second barrier layer is formed before forming the first work function adjustment layer, and the first work function adjustment layer is formed on the second barrier layer. In one or more of the foregoing and following embodiments, a second work function adjustment layer containing aluminum is formed over the first shield layer, and a second shield layer is formed over the second work function adjustment layer. The second shield layer is made of at least one selected from the group consisting of metal, metal nitride, metal carbide, silicide, a layer containing one or more of F, Ga, In, Zr, Mn and Sn, and an aluminum containing layer having a lower aluminum concentration than the second work function adjustment layer. In one or more of the foregoing and following embodiments, one or more second work function adjustment layers made of a different material than the first work function adjustment layer are formed. In one or more of the foregoing and following embodiments, a first barrier layer is formed over the gate dielectric layer, and a second barrier layer is formed after the first barrier layer. The one or more second work function adjustment layers are formed over the second barrier layer. In one or more of the foregoing and following embodiments, a first barrier layer is formed over the gate dielectric layer, and a second barrier layer is formed after the first barrier layer. The one or more second work function adjustment layers are formed after the first barrier layer is formed and before the second barrier layer is formed. In one or more of the foregoing and following embodiments, a first barrier layer is formed over the gate dielectric layer, and a second barrier layer is formed after the first barrier layer. Two work function adjustment layers are formed, one of the two second work function adjustment layers is formed after the first barrier layer is formed and before the first work function adjustment layer is formed, and another of the second work function adjustment layers is formed after the second barrier layer is formed.

In accordance with another aspect of the present disclosure, in a method of manufacturing a semiconductor device including a first n-type field effect transistor (NFET), a second NFET, a third NFET, a first p-type FET (PFET), a second PFET and a third PFET, a gate dielectric layer is formed over a channel region made of a semiconductor material of each of a first NFET region, a second NFET region, a third NFET region, a first PFET region, a second PEFT region and a third PFET region. A first barrier layer is formed over the gate dielectric layer, an n-type work function adjustment layer containing aluminum is formed, a first shield layer is formed over the n-type work function adjustment layer, and by a first patterning operation, the first shield layer and the n-type work function adjustment layer are removed from the first, second and third PFET regions. A second barrier layer is formed, a first p-type work function adjustment layer is formed, and by a second patterning operation, the first p-type work function adjustment layer is removed from the first and second NFET regions and the first and second PFET regions. A second p-type work function adjustment layer is formed, by a third patterning operation, the second p-type work function adjustment layer is removed from the first NFET region and the first PFET region, and a glue layer and a metal gate electrode layer is formed in the first, second and third NFET regions, and the first, second and third PFET regions. In one or more of the foregoing and following embodiments, the n-type work function adjustment layer is formed on the first barrier layer, the second barrier layer is formed on the first shield layer in the first, second and third NFET regions, and on the first barrier layer in the first, second and third PFET regions, the first p-type work function adjustment layer is formed on the second barrier layer, and the second p-type work function adjustment layer is formed on the second barrier layer in the first and second NFET regions and the first and second PFET regions and on the first p-type work function adjustment layer in the third NFET region and the third PFET region, after the second patterning operation. In one or more of the foregoing and following embodiments, the second patterning operation is performed prior to the third patterning operation, and the third patterning operation is performed prior to the first patterning operation, the first p-type work function adjustment layer is formed on the first barrier layer, the second p-type work function adjustment layer is formed on the first barrier layer in the first and second NFET regions and the first and second PFET regions and on the first p-type work function adjustment layer in the third NFET region and the third PFET region, after the second patterning operation, the second barrier layer is formed after the third patterning operation, and the n-type work function adjustment layer is formed on the second barrier layer. In one or more of the foregoing and following embodiments, the second patterning operation is performed prior to the first patterning operation, and the first patterning operation is performed prior to the third patterning operation, the first p-type work function adjustment layer is formed on the first barrier layer, the n-type work function adjustment layer is formed on the first barrier layer in the first and second NFET regions and the first and second PFET regions and on the first p-type work function adjustment layer in the third NFET region and the third PFET region, after the second patterning operation, the second barrier layer is formed after the first patterning operation, and the second p-type work function adjustment layer is formed on the second barrier layer. In one or more of the foregoing and following embodiments, the n-type work function adjustment layer is made of one selected the group consisting of TiAl, TiAlC, TaAl, TaAlC and TiAlN. In one or more of the foregoing and following embodiments, the first shield layer is made of at least one selected from the group consisting of TiN, TaN, TaTiN, WN, TiSiN, WCN and MoN, formed by a deposition method. In one or more of the foregoing and following embodiments, the first shield layer is made of at least one selected from the group consisting of Si, Cr, Mo and Co, formed by a deposition method. In one or more of the foregoing and following embodiments, the first shield layer is made of carbide of at least one selected from the group consisting of Si, Ti, Ta, Cr, Mo and Co. In one or more of the foregoing and following embodiments, the first shield layer is made of silicide of at least one selected from the group consisting of Ti, Ta, Ni, W and Mo. In one or more of the foregoing and following embodiments, the first shield layer is a surface region of the n-type work function adjustment layer and contains F, and the first shield layer is formed by treating a surface of the n-type work function adjustment layer with fluorine containing material. In one or more of the foregoing and following embodiments, the first shield layer is a surface region of the n-type work function adjustment layer and contains one or more of Ga, In, Zr, Mn and Sn, and the first shield layer is formed by implanting ions of one or more of F, Ga, In, Zr, Mn and Sn to the surface region of the n-type work function adjustment layer. In one or more of the foregoing and following embodiments, the first shield layer is formed by decreasing an Al source material during formation of the n-type work function adjustment layer. In one or more of the foregoing and following embodiments, an aluminum content of the n-type work function adjustment layer is 67 atomic % to 86 atomic %, and an aluminum content of the first shield layer is 30 atomic % to 55 atomic %. In one or more of the foregoing and following embodiments, after the first patterning operation, the first shield layer is removed. In one or more of the foregoing and following embodiments, the first and second barrier layers are made of TaN. In one or more of the foregoing and following embodiments, the first and second p-type work function adjustment layers are made of TiN. In one or more of the foregoing and following embodiments, a threshold voltage of the first n-type FET (NFET) is smaller, in an absolute value, than a threshold voltage of the second n-type FET, and the threshold voltage of the second n-type FET is smaller, in an absolute value, than a threshold voltage of the third n-type FET. In one or more of the foregoing and following embodiments, a threshold voltage of the third p-type FET (PFET) is smaller, in an absolute value, than a threshold voltage of the second p-type FET, and the threshold voltage of the second p-type FET is smaller, in an absolute value, than a threshold voltage of the first p-type FET.

In accordance with another aspect of the present disclosure, a semiconductor device includes a first field effect transistor (FET) including a first gate structure disposed over a first channel region, and a second FET including a second gate structure disposed over a second channel region. The first FET is an n-type FET, and second FET is a p-type FET. The first gate structure includes a gate dielectric layer, a first work function adjustment layer over the gate dielectric layer, a first shield layer over the first work function adjustment layer, a first barrier layer, and a metal gate electrode layer. The first work function adjustment layer includes aluminum. The first shield layer is made of at least one selected from the group consisting of metal, metal nitride, metal carbide, silicide, a layer containing one or more of F, Ga, In, Zr, Mn and Sn, and an aluminum containing layer having a lower aluminum concentration than the first work function adjustment layer. In one or more of the foregoing and following embodiments, the second gate structure includes a second work function adjustment layer, and the first work function adjustment layer in the n-type first FET is not in direct contact with the second work function adjustment layer in the p-type second FET device, across a metal boundary of the n-type first FET and the p-type second FET devices. In one or more of the foregoing and following embodiments, the first gate structure further includes a second shield layer on the first shield layer, and the second shield layer is made of a different material than the first shield layer, and is made of at least one selected from the group consisting of metal, metal nitride, metal carbide, silicide, a layer containing one or more of F, Ga, In, Zr, Mn and Sn, and an aluminum containing layer having a lower aluminum concentration than the first work function adjustment layer. In one or more of the foregoing and following embodiments, the first gate structure further includes a third shield layer under the first shield layer, and the third shield layer is made of a different material than the first shield layer, and is made of at least one selected from the group consisting of metal, metal nitride, metal carbide, silicide, a layer containing one or more of F, Ga, In, Zr, Mn and Sn, and an aluminum containing layer having a lower aluminum concentration than the first work function adjustment layer. In one or more of the foregoing and following embodiments, the second work function adjustment layer includes one selected from the group consisting of TaN, TiN, WN, TiC, WCN, MoN and Co.

In accordance with another aspect of the present disclosure, in a method of manufacturing a semiconductor device including a first n-type field effect transistor (NFET), a second NFET, a third NFET, a first p-type FET (PFET), a second PFET and a third PFET, a gate dielectric layer is formed over a channel region made of a semiconductor material of each of a first NFET region, a second NFET region, a third NFET region, a first PFET region, a second PEFT region and a third PFET region. A first barrier layer is formed over the gate dielectric layer, a first n-type work function adjustment layer containing aluminum is formed over the gate dielectric layer, a first shield layer is formed over the first n-type work function adjustment layer, and by a first patterning operation, the first shield layer and the first n-type work function adjustment layer are removed from the third NFET region, and the first, second and third PFET regions. A second n-type work function adjustment layer containing aluminum is formed over the gate dielectric layer, a second shield layer is formed over the second n-type work function adjustment layer, and by a second patterning operation, the second shield layer and the second n-type work function adjustment layer are removed from the second and third PFET regions. A second barrier layer is formed over the second shield layer in the first, second and third NFET regions and the first PFET region, and over the first barrier layer in the second and third PFET regions, a p-type work function adjustment layer is formed over the second barrier layer, and by a third patterning operation, the p-type work function adjustment layer is removed from the first and third NFET regions and the second PFET regions. A metal gate electrode layer is formed in the first, second and third NFET regions, and the first, second and third PFET regions. In one or more of the foregoing and following embodiments, each of the first and second n-type work function adjustment layers is made of one selected the group consisting of TiAl, TiAlC, TaAl, TaAlC and TiAlN. In one or more of the foregoing and following embodiments, each of the first and second shield layers is made of at least one selected from the group consisting of TiN, TaN, TaTiN, WN, TiSiN, WCN and MoN, formed by a deposition method. In one or more of the foregoing and following embodiments, each of the first and second shield layers is made of at least one selected from the group consisting of Si, Cr, Mo and Co, formed by a deposition method. In one or more of the foregoing and following embodiments, each of the first and second shield layers is made of carbide of at least one selected from the group consisting of Si, Ti, Ta, Cr, Mo and Co. In one or more of the foregoing and following embodiments, each of the first and second shield layers is made of silicide of at least one selected from the group consisting of Ti, Ta, Ni, W and Mo. In one or more of the foregoing and following embodiments, each of the first and second shield layers is a surface region of the first and second n-type work function adjustment layers, respectively, and contains F, and each of the first and second shield layers is formed by treating a surface of the first and second n-type work function adjustment layers with fluorine containing material, respectively. In one or more of the foregoing and following embodiments, each of the first and second shield layers is a surface region of the first and second n-type work function adjustment layers, respectively, and contains one or more of Ga, In, Zr, Mn and Sn, and each of the first and second shield layers is formed by implanting ions of one or more of F, Ga, In, Zr, Mn and Sn to the surface region of the first and second n-type work function adjustment layers, respectively. In one or more of the foregoing and following embodiments, each of the first and second shield layers is formed by decreasing an Al source material during formation of the n-type work function adjustment layer. In one or more of the foregoing and following embodiments, an aluminum content of the first and second n-type work function adjustment layers is 67 atomic % to 86 atomic %, and an aluminum content of the first and second shield layers is 30 atomic % to 55 atomic %. In one or more of the foregoing and following embodiments, the n-type WF adjustment layer/s is composed of materials having low work function in the range of 2.5 to 4.4 and/or having low electronegativity. In one or more of the foregoing and following embodiments, the p-type WFM adjustment layer/s is composed of materials having high work functions in the range of 4.3 to 5.8 and/or having high electronegativity. In one or more of the foregoing and following embodiments, a threshold voltage of the first n-type FET (NFET) is smaller, in an absolute value, than a threshold voltage of the second n-type FET, and the threshold voltage of the second n-type FET is smaller, in an absolute value, than a threshold voltage of the third n-type FET. In one or more of the foregoing and following embodiments, a threshold voltage of the third p-type FET (PFET) is smaller, in an absolute value, than a threshold voltage of the second p-type FET, and the threshold voltage of the second p-type FET is smaller, in an absolute value, than a threshold voltage of the first p-type FET. In accordance with another aspect of the present disclosure, in a method of manufacturing a semiconductor device including n-type FETs having different threshold voltages and p-type FETs having different threshold voltages, a gate dielectric layer is formed, one or more n-type work function adjustment layers, and one or more p-type work function adjustment layers, for each of the n-type FETs and p-type FETs are formed over the gate dielectric layer, a metal gate electrode layer is formed over the one or more work function adjustment layers. A total number of the different threshold voltages of the n-type FETs is N, and a number of the different threshold voltages of the p-type FETs is M. A patterning operation of at least one of the n-work function adjustment layer is performed and also simultaneously a patterning operation of at least one of the p-work function adjustment layer is performed. A number of patterning operations, each of which includes a set of a lithography operation and an etching operation, is equal to $(N+M)/2$. A number of n-work function adjustment layers is Y, wherein $Y<N$ and a number of the p-work function adjustment layers is X, wherein $X<M-Y$, and a total number of n-work function adjustment layers and p-work function adjustment layers is equal to $(N+M)/2$. In one or more of the foregoing and following embodiments, N is three and M is three. In one or more of the foregoing and following embodiments, N is three, M is three and Y is one, X is two. In one or more of the foregoing and following embodiments, N is three, M is three and Y is two, X is one.

A patterning operation of at least one of the n-work function adjustment layer is performed and also simultaneously a patterning operation of at least one of the p-work function adjustment layer is performed. (i. e. simultaneously patterning of both n-work function adjustment layers together with patterning of p-work function adjustment layers is performed). A number of n-work function adjustment layers is Y, wherein $Y<N$ and a number of the p-work function adjustment layers is X, wherein $X<M-Y$, and a total number of n-work function adjustment layers and p-work function adjustment layers is equal to $(N+M)/2$. The work function value of n-work function adjustment layer is very low and/or unaffected after the patterning processes. The shield layer protects the n-work function adjustment layer, so that the work function value of n-work function adjustment layer in the final device even after subjecting to patterning processes, is still very low in the range of about 2.2 to about 4.3 eV, which is same and/or slightly lower than the work function values of as deposited n-work function adjustment layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a gate dielectric layer over a channel region made of a semiconductor material;
   forming a first shield layer over the gate dielectric layer;
   forming a first work function adjustment layer over the first shield layer;
   forming a second shield layer over the first work function adjustment layer;
   forming a metal gate electrode layer over the first shield layer, wherein:
   the first work function adjustment layer includes aluminum,
   an aluminum content of the first work function adjustment layer is 67 atomic % to 86 atomic %, and
   at least one of the first shield layer or the second shield layer includes one selected from the group consisting of a metal layer, a metal nitride layer comprising TaTiN, WN, WCN or MoN, a metal carbide layer, a silicide layer, and a layer containing Al and one or more of F, N, Ga, In, Zr, Mn and Sn.

2. The method of claim 1, wherein at least one of the first shield layer or the second shield layer includes one selected from the group consisting of a Si layer, a Cr layer, a Mo layer and a Co layer, formed by a deposition method.

3. The method of claim 1, wherein at least one of the first shield layer or the second shield layer includes one selected from the group consisting of a Si carbide layer, a Cr carbide layer, a Mo carbide layer and a Co carbide layer.

4. The method of claim 1, wherein at least one of the first shield layer or the second shield layer includes one selected from the group consisting of a Ta silicide layer, a Ni silicide layer, a W silicide layer and a Mo silicide layer.

5. The method of claim 1, wherein:
   the first shield layer and the second shield layer include one selected from the group consisting of a metal layer, a metal nitride layer comprising TaTiN, WN, WCN or MoN, a metal carbide layer, and a silicide layer, and
   the first shield layer is made of a same material as the second shield layer.

6. The method of claim 1, wherein the first shield layer is formed by a deposition method.

7. The method of claim 1, wherein the second shield layer is formed by a deposition method.

8. A method of manufacturing a semiconductor device, comprising:
   forming a gate dielectric layer over a channel region made of a semiconductor material;
   forming a first shield layer over the gate dielectric layer by a deposition method;
   forming a first work function adjustment layer over the first shield layer;
   forming a second shield layer over the first work function adjustment layer; and
   forming a metal gate electrode layer over the first shield layer,
   wherein the first work function adjustment layer includes aluminum, and
   an aluminum content of the first work function adjustment layer is 67 atomic % to 86 atomic %.

9. The method of claim 8, wherein the first shield layer includes one selected from the group consisting of a metal layer, a metal nitride layer comprising TaTiN, WN, WCN or MoN, a metal carbide layer, and a silicide layer.

10. The method of claim 9, wherein a thickness of the first shield layer is in a range from 0.3 nm to 8 nm.

11. The method of claim 8, wherein the first shield layer is formed by a deposition method selected from the group consisting of chemical vapor deposition, physical vapor deposition, atomic layer deposition, and plating.

12. The method of claim 8, wherein the second shield layer is formed by a deposition method.

13. The method of claim 8, wherein at least one of the first shield layer or the second shield layer includes one selected from the group consisting of a Ta silicide layer, a Ni silicide layer, a W silicide layer and a Mo silicide layer.

14. A method of manufacturing a semiconductor device, comprising:
   forming a gate dielectric layer over a channel region made of a semiconductor material;
   forming a first shield layer over the gate dielectric layer;
   forming a first work function adjustment layer over the first shield layer;
   forming a second shield layer over the first work function adjustment layer;
   forming a metal gate electrode layer over the first shield layer, wherein:
   the first work function adjustment layer includes aluminum,
   the first shield layer is made of a different material than the second shield layer, and
   a thickness of each of the first shield layer and the second shield layer is in a range from 0.3 nm to 8 nm.

15. The method of claim 14, wherein each of the first shield layer and the second shield layer includes one selected from the group consisting of a metal layer, a metal nitride layer comprising TaTiN, WN, WCN or MoN, a metal carbide layer, and a silicide layer.

16. The method of claim 14, wherein the first shield layer is formed by a deposition method.

17. The method of claim 14, wherein the second shield layer is formed by a deposition method.

18. The method of claim 14, wherein at least one of the first shield layer or the second shield layer includes one selected from the group consisting of a Ta silicide layer, a Ni silicide layer, a W silicide layer and a Mo silicide layer.

19. The method of claim 16, wherein the first shield layer is formed by a deposition method selected from the group consisting of chemical vapor deposition, physical vapor deposition, atomic layer deposition, and plating.

20. The method of claim 17, wherein the second shield layer is formed by a deposition method selected from the group consisting of chemical vapor deposition, physical vapor deposition, atomic layer deposition, and plating.

* * * * *